(12) United States Patent
Fang et al.

(10) Patent No.: US 10,170,999 B2
(45) Date of Patent: Jan. 1, 2019

(54) SYSTEMS AND METHODS FOR REGULATING OUTPUT CURRENTS OF POWER CONVERSION SYSTEMS

(71) Applicant: ON-BRIGHT ELECTRONICS (SHANGHAI) CO., LTD., Shanghai (CN)

(72) Inventors: Lieyi Fang, Shanghai (CN); Jun Zhou, Shanghai (CN); Qian Fang, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 15/400,469

(22) Filed: Jan. 6, 2017

(65) Prior Publication Data

US 2017/0187294 A1 Jun. 29, 2017

Related U.S. Application Data

(63) Continuation of application No. 14/817,081, filed on Aug. 3, 2015, now Pat. No. 9,584,005, which is a
(Continued)

(30) Foreign Application Priority Data

Apr. 18, 2014 (CN) .......................... 2014 1 0157557
Jul. 15, 2015 (CN) .......................... 2015 1 0413940

(51) Int. Cl.
*H02M 3/335* (2006.01)
*H02M 1/08* (2006.01)
(Continued)

(52) U.S. Cl.
CPC ......... *H02M 3/33507* (2013.01); *H02M 1/08* (2013.01); *H02M 3/33523* (2013.01);
(Continued)

(58) Field of Classification Search
CPC ............ H02M 3/335; H02M 3/33507; H02M 3/33515; H02M 3/33523; H02M 3/33538;
(Continued)

(56) References Cited

U.S. PATENT DOCUMENTS 3,018,966 A 5/1955 Zelina
3,913,002 A 10/1975 Steigerwald et al.
(Continued)

FOREIGN PATENT DOCUMENTS

CN 2552047 Y 5/2003
CN 1430314 A 7/2003
(Continued)

OTHER PUBLICATIONS

Chinese Patent Office, Office Action dated Apr. 5, 2017, in Application No. 201510413940.8.
(Continued)

*Primary Examiner* — Yemane Mehari
(74) *Attorney, Agent, or Firm* — Faegre Baker Daniels LLP

(57) ABSTRACT

Systems and methods are provided for regulating a power conversion system. An example system controller includes: a signal generator configured to receive a converted signal and a first compensation signal and generate a second compensation signal based at least in part on the converted signal and the first compensation signal, the converted signal being associated with an input signal for a power conversion system; a modulation component configured to receive the second compensation signal and a ramping signal and generate a modulation signal based at least in part on the second compensation signal and the ramping signal; and a drive component configured to receive the modulation signal and output a drive signal based at least in part on the modulation signal to a switch to affect the first current, the drive signal
(Continued)

being associated with an on-time period, the switch being closed during the on-time period.

30 Claims, 26 Drawing Sheets

Related U.S. Application Data continuation-in-part of application No. 14/272,323, filed on May 7, 2014, now Pat. No. 9,564,811.

(51) Int. Cl.

| | |
|---|---|
| *H03K 7/08* | (2006.01) |
| *H03K 17/16* | (2006.01) |
| *H03K 17/56* | (2006.01) |
| *H03K 17/723* | (2006.01) |
| *H05B 33/08* | (2006.01) |
| *H02M 1/00* | (2006.01) |

(52) U.S. Cl.
CPC ............... *H03K 7/08* (2013.01); *H03K 17/16* (2013.01); *H03K 17/56* (2013.01); *H03K 17/723* (2013.01); *H05B 33/0806* (2013.01); *H05B 33/0815* (2013.01); *H02M 2001/0006* (2013.01); *H02M 2001/0009* (2013.01)

(58) Field of Classification Search
CPC ......... H02M 3/33546; H02M 3/33553; H02M 2001/0006; H03K 17/16; H03K 17/56; H03K 17/723; H03K 7/08; H05B 33/0806
USPC ........................................... 363/21.01–21.18
See application file for complete search history.

(56) References Cited

U.S. PATENT DOCUMENTS

| | | | |
|---|---|---|---|
| 3,967,173 A | 6/1976 | Stich | |
| 4,356,542 A | 10/1982 | Bruckner et al. | |
| 4,753,079 A | 6/1988 | Sumitomo | |
| 4,952,853 A | 8/1990 | Archer | |
| 4,975,820 A | 12/1990 | Szepesi | |
| 5,416,689 A | 5/1995 | Silverstein et al. | |
| 5,442,538 A | 8/1995 | Ikeda et al. | |
| 5,528,483 A | 6/1996 | Mohandes | |
| 5,550,702 A | 8/1996 | Schmidt et al. | |
| 5,574,392 A | 11/1996 | Jordan | |
| 5,578,908 A | 11/1996 | Persson | |
| 5,677,606 A | 10/1997 | Otake | |
| 5,796,595 A | 8/1998 | Cross | |
| 5,796,598 A | 8/1998 | Nowak et al. | |
| 5,867,379 A | 2/1999 | Maksimovic et al. | |
| 5,917,714 A | 6/1999 | Ogawa | |
| 6,061,257 A | 5/2000 | Spampinato et al. | |
| 6,084,783 A | 7/2000 | Rascon Martinez et al. | |
| 6,292,376 B1 | 9/2001 | Kato | |
| 6,469,917 B1 | 10/2002 | Ben-Yaakov | |
| 6,515,876 B2 | 2/2003 | Koike et al. | |
| 6,583,610 B2 | 6/2003 | Groom et al. | |
| 6,611,439 B1 | 8/2003 | Yang et al. | |
| 6,714,425 B2 | 3/2004 | Yamada et al. | |
| 6,737,845 B2 | 5/2004 | Hwang | |
| 6,839,247 B1 | 1/2005 | Yang et al. | |
| 6,842,350 B2 | 1/2005 | Yamada et al. | |
| 6,903,536 B2 | 6/2005 | Yang | |
| 6,914,789 B2 | 7/2005 | Kinoshita et al. | |
| 6,947,298 B2 | 9/2005 | Uchida | |
| 6,954,367 B2 | 10/2005 | Yang et al. | |
| 7,027,313 B2 | 4/2006 | Amei | |
| 7,061,225 B2 | 6/2006 | Yang et al. | |
| 7,099,164 B2 | 8/2006 | Zhu et al. | |
| 7,149,098 B1 | 12/2006 | Chen | |
| 7,342,383 B1 | 3/2008 | Song et al. | |
| 7,362,592 B2 | 4/2008 | Yang et al. | |
| 7,362,593 B2 | 4/2008 | Yang et al. | |
| 7,391,630 B2 | 6/2008 | Acatrinei | |
| 7,394,634 B2 | 7/2008 | Fang et al. | |
| 7,679,938 B2 | 3/2010 | Ye et al. | |
| 7,684,220 B2 | 3/2010 | Fang et al. | |
| 7,719,249 B2 | 5/2010 | Matyas et al. | |
| 7,738,227 B2 | 6/2010 | Fang et al. | |
| 7,746,615 B2 | 6/2010 | Zhu et al. | |
| 7,759,891 B2 | 7/2010 | Serizawa et al. | |
| 7,778,049 B2 | 8/2010 | Morota | |
| 7,791,903 B2 | 9/2010 | Zhang et al. | |
| 8,004,112 B2 | 8/2011 | Koga et al. | |
| 8,018,743 B2 | 9/2011 | Wang et al. | |
| 8,018,745 B2 | 9/2011 | Fang et al. | |
| 8,098,502 B2 | 1/2012 | Mao et al. | |
| 8,102,676 B2 | 1/2012 | Huyhn et al. | |
| 8,416,596 B2 | 4/2013 | Huang | |
| 8,482,946 B2 | 7/2013 | Fang et al. | |
| 8,488,342 B2 | 7/2013 | Zhang et al. | |
| 8,508,142 B2 | 8/2013 | Lin et al. | |
| 8,519,691 B2 | 8/2013 | McCloy-Stevens | |
| 8,559,152 B2 | 10/2013 | Cao et al. | |
| 8,680,884 B2 | 3/2014 | Chobot | |
| 8,824,167 B2 | 9/2014 | Hughes et al. | |
| 8,824,173 B2 | 9/2014 | Fang et al. | |
| 8,917,527 B2 | 12/2014 | Fang et al. | |
| 9,088,218 B2 | 7/2015 | Zhang et al. | |
| 9,136,703 B2 | 9/2015 | Cummings | |
| 9,362,737 B2 | 6/2016 | Yang et al. | |
| 9,401,648 B2 * | 7/2016 | Li .................... | H02M 3/33507 |
| 9,548,652 B2 | 1/2017 | Cao et al. | |
| 9,553,501 B2 | 1/2017 | Yao et al. | |
| 9,564,811 B2 | 2/2017 | Zhai et al. | |
| 9,570,986 B2 | 2/2017 | Zhai et al. | |
| 9,577,536 B2 | 2/2017 | Yang et al. | |
| 9,584,005 B2 * | 2/2017 | Fang ...................... | H02M 1/08 |
| 9,614,445 B2 | 4/2017 | Zhu et al. | |
| 9,647,448 B2 | 5/2017 | Fang et al. | |
| 9,960,674 B2 | 5/2018 | Fang et al. | |
| 9,991,802 B2 | 6/2018 | Zhai et al. | |
| 2002/0131279 A1 | 9/2002 | Tang | |
| 2003/0099119 A1 | 5/2003 | Yamada et al. | |
| 2003/0156433 A1 | 8/2003 | Gong et al. | |
| 2003/0174520 A1 | 9/2003 | Bimbaud | |
| 2004/0201369 A1 | 10/2004 | Perrier et al. | |
| 2004/0218405 A1 | 11/2004 | Yamada et al. | |
| 2005/0036342 A1 | 2/2005 | Uchida | |
| 2005/0099164 A1 | 5/2005 | Yang | |
| 2006/0055433 A1 | 3/2006 | Yang et al. | |
| 2006/0291258 A1 | 12/2006 | Zhu et al. | |
| 2008/0198638 A1 | 8/2008 | Reinberger et al. | |
| 2008/0257397 A1 | 10/2008 | Glaser et al. | |
| 2008/0298099 A1 | 12/2008 | Huang et al. | |
| 2008/0309380 A1 | 12/2008 | Yang et al. | |
| 2008/0316781 A1 | 12/2008 | Liu | |
| 2009/0021233 A1 | 1/2009 | Hsu | |
| 2009/0128113 A1 | 5/2009 | Ryoo | |
| 2009/0219070 A1 | 9/2009 | Zhang et al. | |
| 2010/0123447 A1 | 5/2010 | Vecera et al. | |
| 2010/0253250 A1 | 10/2010 | Marvelly et al. | |
| 2010/0328831 A1 | 12/2010 | Zhang et al. | |
| 2011/0101953 A1 | 5/2011 | Cheng et al. | |
| 2011/0110126 A1 | 5/2011 | Morrish | |
| 2011/0169418 A1 | 7/2011 | Yang et al. | |
| 2012/0008352 A1 | 1/2012 | Huang et al. | |
| 2012/0075891 A1 | 3/2012 | Zhang et al. | |
| 2012/0119650 A1 | 5/2012 | Lee | |
| 2012/0147630 A1 | 6/2012 | Cao et al. | |
| 2012/0194227 A1 | 8/2012 | Lin et al. | |
| 2012/0224397 A1 | 9/2012 | Yeh | |
| 2012/0281438 A1 | 11/2012 | Fang et al. | |
| 2013/0003421 A1 | 1/2013 | Fang | |
| 2013/0100715 A1 | 4/2013 | Lin et al. | |
| 2013/0135775 A1 | 5/2013 | Yao et al. | |
| 2013/0181635 A1 | 7/2013 | Ling | |
| 2013/0223107 A1 | 8/2013 | Zhang et al. | |
| 2013/0258723 A1 | 10/2013 | Fang et al. | |
| 2013/0294121 A1 | 11/2013 | Fang et al. | |
| 2013/0336029 A1 | 12/2013 | Cao et al. | |

(56) References Cited

U.S. PATENT DOCUMENTS

| | | | |
|---|---|---|---|
| 2014/0016366 A1 | 1/2014 | Su | |
| 2014/0029315 A1 | 1/2014 | Zhang et al. | |
| 2014/0085941 A1 | 3/2014 | Li et al. | |
| 2014/0355316 A1 | 12/2014 | Wu et al. | |
| 2015/0023069 A1 | 1/2015 | Zhu et al. | |
| 2015/0055382 A1 | 2/2015 | Yang et al. | |
| 2015/0115919 A1 | 4/2015 | Yang et al. | |
| 2015/0180328 A1 | 6/2015 | Yao et al. | |
| 2015/0301542 A1 | 10/2015 | Yang et al. | |
| 2015/0303787 A1 | 10/2015 | Zhai et al. | |
| 2015/0303898 A1 | 10/2015 | Zhai et al. | |
| 2015/0340952 A1* | 11/2015 | Manohar | H02M 3/158 323/271 |
| 2015/0340957 A1 | 11/2015 | Fang et al. | |
| 2015/0357912 A1* | 12/2015 | Perreault | H02M 1/4208 363/126 |
| 2016/0226239 A1 | 8/2016 | Yang et al. | |
| 2016/0336852 A1 | 11/2016 | Fang et al. | |
| 2016/0336864 A1 | 11/2016 | Fang et al. | |
| 2016/0336868 A1 | 11/2016 | Fang et al. | |
| 2017/0141688 A1 | 5/2017 | Zhai et al. | |
| 2017/0163026 A1 | 6/2017 | Yang et al. | |
| 2017/0179808 A1 | 6/2017 | Zhai et al. | |
| 2017/0194869 A1 | 7/2017 | Yao et al. | |
| 2017/0214327 A1 | 7/2017 | Zhu et al. | |
| 2017/0214328 A1* | 7/2017 | Zhu | H02M 3/33507 |
| 2018/0123448 A1 | 5/2018 | Yao et al. | |
| 2018/0123456 A1 | 5/2018 | Fang et al. | |
| 2018/0123464 A1 | 5/2018 | Fang et al. | |

FOREIGN PATENT DOCUMENTS

| | | |
|---|---|---|
| CN | 2567850 Y | 8/2003 |
| CN | 1448005 A | 10/2003 |
| CN | 1459903 A | 12/2003 |
| CN | 1497827 A | 5/2004 |
| CN | 1815838 A | 8/2006 |
| CN | 1917322 A | 2/2007 |
| CN | 101079576 A | 11/2007 |
| CN | 101295872 A | 10/2008 |
| CN | 101340149 A | 1/2009 |
| CN | 101425750 A | 5/2009 |
| CN | 101499713 A | 8/2009 |
| CN | 101552570 | 10/2009 |
| CN | 100559678 C | 11/2009 |
| CN | 101662223 A | 3/2010 |
| CN | 101295872 B | 4/2010 |
| CN | 201477463 U | 5/2010 |
| CN | 101924536 A | 12/2010 |
| CN | 101964647 A | 2/2011 |
| CN | 101997412 A | 3/2011 |
| CN | 102202449 | 9/2011 |
| CN | 202009514 U | 10/2011 |
| CN | 102364990 A | 2/2012 |
| CN | 102412727 A | 4/2012 |
| CN | 102487246 A | 6/2012 |
| CN | 102545567 A | 7/2012 |
| CN | 102611306 A | 7/2012 |
| CN | 102624237 A | 8/2012 |
| CN | 102625514 A | 8/2012 |
| CN | 102638169 A | 8/2012 |
| CN | 102651613 A | 8/2012 |
| CN | 102761255 A | 10/2012 |
| CN | 102790531 A | 11/2012 |
| CN | 102801300 A | 11/2012 |
| CN | 102820781 A | 12/2012 |
| CN | 103036438 A | 4/2013 |
| CN | 103078489 | 5/2013 |
| CN | 103166198 | 6/2013 |
| CN | 103167665 A | 6/2013 |
| CN | 103178717 A | 6/2013 |
| CN | 103368400 A | 10/2013 |
| CN | 103401424 A | 11/2013 |
| CN | 103781256 | 5/2014 |
| CN | 103781257 | 5/2014 |
| CN | 103887980 A | 6/2014 |
| CN | 103916027 A | 7/2014 |
| CN | 103956905 A | 7/2014 |
| CN | 203747681 | 7/2014 |
| CN | 103986336 A | 8/2014 |
| CN | 104022648 | 9/2014 |
| CN | 104617792 A | 5/2015 |
| CN | 104853493 A | 8/2015 |
| CN | 104967328 A | 10/2015 |
| EP | 0871328 B1 | 8/2003 |
| EP | 1317052 B1 | 10/2006 |
| JP | 2003-333839 A | 11/2003 |
| JP | 2006-237519 A | 9/2006 |
| JP | 2006-237619 A | 9/2006 |
| JP | 4064296 | 3/2008 |
| JP | 2009-36750 A | 2/2009 |
| TW | 200929824 | 7/2009 |
| TW | M400069 | 3/2011 |
| TW | 201117670 | 5/2011 |
| TW | 201218860 | 5/2012 |
| TW | 201225495 | 6/2012 |
| TW | 201241591 | 10/2012 |
| TW | 201325304 | 6/2013 |
| TW | I403875 | 8/2013 |
| TW | I434500 | 4/2014 |
| TW | 201429132 | 7/2014 |
| TW | I458232 | 10/2014 |
| TW | 201541845 | 11/2015 |
| WO | WO 2012/147453 | 11/2012 |

OTHER PUBLICATIONS

Chinese Patent Office, Office Action dated Jun. 21, 2017, in Application No. 201510788449.3.

United States Patent and Trademark, Notice of Allowance dated Jun. 1, 2017, in U.S. Appl. No. 14/753,079.

United States Patent and Trademark, Notice of Allowance dated Jun. 23, 2017, in U.S. Appl. No. 14/974,694.

United States Patent and Trademark, Office Action dated Jun. 27, 2017, in U.S. Appl. No. 15/055,261.

United States Patent and Trademark, Office Action dated Jun. 28, 2017, in U.S. Appl. No. 14/638,191.

United States Patent and Trademark, Office Action dated Jul. 25, 2017, in U.S. Appl. No. 15/362,268.

Chinese Patent Office, Office Action dated Aug. 1, 2014, in Application No. 201310015152.4.

Chinese Patent Office, Office Action dated Jan. 17, 2014, in Application No. 201310306106.X.

Chinese Patent Office, Office Action dated Jan. 3, 2014, in Application No. 201010587658.9.

Chinese Patent Office, Office Action dated Nov. 26, 2015, in Application No. 201410134395.4.

Chinese Patent Office, Office Action dated Dec. 4, 2015, in Application No. 201410198140.4.

Chinese Patent Office, Office Action dated Jan. 25, 2016, in Application No. 201410157557.6.

Chinese Patent Office, Office Action dated Aug. 17, 2016, in Application No. 201510053255.9.

Chinese Patent Office, Office Action dated Nov. 2, 2016, in Application No. 201510249026.4.

Taiwan Intellectual Property Office, Office Action dated Mar. 13, 2014, in Application No. 100101960.

Taiwan Intellectual Property Office, Office Action dated May 5, 2015, in Application No. 102131370.

Taiwan Intellectual Property Office, Office Action dated May 18, 2016, in Application No. 103121063.

Taiwan Intellectual Property Office, Office Action dated May 24, 2016, in Application No. 104110694.

Taiwan Intellectual Property Office, Office Action dated May 23, 2016, in Application No. 104132444.

Taiwan Intellectual Property Office, Approval Report dated May 26, 2016, in Application No. 104125785.

Taiwan Intellectual Property Office, Office Action dated Jul. 29, 2016, in Application No. 105106390.

(56) References Cited

OTHER PUBLICATIONS

United States Patent and Trademark, Notice of Allowance dated Nov. 6, 2015, in U.S. Appl. No. 13/900,430.
United States Patent and Trademark, Notice of Allowance dated Mar. 21, 2016, in U.S. Appl. No. 13/900,430.
United States Patent and Trademark, Notice of Allowance dated Jul. 11, 2016, in U.S. Appl. No. 13/900,430.
United States Patent and Trademark, Notice of Allowance dated Sep. 28, 2016, in U.S. Appl. No. 13/900,430.
United States Patent and Trademark, Notice of Allowance dated Feb. 23, 2017, in U.S. Appl. No. 14/753,079.
United States Patent and Trademark, Office Action dated May 14, 2015, in U.S. Appl. No. 13/900,430.
United States Patent and Trademark, Office Action dated Oct. 30, 2015, in U.S. Appl. No. 13/969,281.
United States Patent and Trademark, Office Action dated May 24, 2016, in U.S. Appl. No. 13/969,281.
United States Patent and Trademark, Notice of Allowance dated Nov. 22, 2016, in U.S. Appl. No. 13/969,281.
United States Patent and Trademark, Office Action dated Jul. 12, 2016, in U.S. Appl. No. 14/753,079.
Chinese Patent Office, Office Action dated Aug. 31, 2017, in Application No. 201510249026.4.
United States Patent and Trademark, Notice of Allowance dated Sep. 6, 2017, in U.S. Appl. No. 14/753,079.
United States Patent and Trademark, Notice of Allowance dated Sep. 6, 2017, in U.S. Appl. No. 14/974,695.
United States Patent and Trademark, Office Action dated Aug. 24, 2017, in U.S. Appl. No. 15/371,058.
United States Patent and Trademark, Office Action dated Oct. 5, 2017, in U.S. Appl. No. 15/374,896.
United States Patent and Trademark, Office Action dated Nov. 8, 2017, in U.S. Appl. No. 15/380,693.
United States Patent and Trademark, Office Action dated Sep. 19, 2017, in U.S. Appl. No. 15/428,996.
Chinese Patent Office, Office Action dated Dec. 5, 2017, in Application No. 201410157557.6.
United States Patent and Trademark, Notice of Allowance dated Nov. 30, 2017, in U.S. Appl. No. 14/638,191.
United States Patent and Trademark, Notice of Allowance dated Dec. 22, 2017, in U.S. Appl. No. 15/055,261.
United States Patent and Trademark, Notice of Allowance dated Dec. 8, 2017, in U.S. Appl. No. 15/362,268.
United States Patent and Trademark, Office Action dated Jan. 24, 2018, in U.S. Appl. No. 15/428,996.
United States Patent and Trademark, Notice of Allowance dated Mar. 15, 2018, in U.S. Appl. No. 14/638,191.
United States Patent and Trademark, Notice of Allowance dated Mar. 27, 2018, in U.S. Appl. No. 15/371,058.
United States Patent and Trademark, Office Action dated Jun. 15, 2018, in U.S. Appl. No. 15/374,896.
United States Patent and Trademark, Notice of Allowance dated Jun. 22, 2018, in U.S. Appl. No. 15/428,996.
United States Patent and Trademark, Office Action dated Jun. 29, 2018, in U.S. Appl. No. 15/804,712.
United States Patent and Trademark, Notice of Allowance dated Jul. 17, 2018, in U.S. Appl. No. 15/815,468.
United States Patent and Trademark, Office Action dated May 4, 2018, in U.S. Appl. No. 15/852,490.
Chinese Patent Office, Office Action dated Aug. 22, 2018, in Application No. 201710147830.0.
United States Patent and Trademark, Notice of Allowance dated Sep. 28, 2018, in U.S. Appl. No. 14/974,695.
United States Patent and Trademark, Notice of Allowance dated Oct. 11, 2018, in U.S. Appl. No. 15/374,896.
United States Patent and Trademark, Notice of Allowance dated Aug. 14, 2018, in U.S. Appl. No. 15/380,693.
United States Patent and Trademark, Notice of Allowance dated Aug. 16, 2018, in U.S. Appl. No. 15/428,996.
United States Patent and Trademark, Notice of Allowance dated Sep. 6, 2018, in U.S. Appl. No. 15/429,011.
United States Patent and Trademark, Notice of Allowance dated Sep. 17, 2018, in U.S. Appl. No. 15/815,468.
United States Patent and Trademark, Office Action dated Oct. 4, 2018, in Appl. No. 15/852,490.
United States Patent and Trademark, Office Action dated Aug. 31, 2018, in U.S. Appl. No. 15/927,790.
United States Patent and Trademark, Office Action dated Nov. 1, 2018, in U.S. Appl. No. 16/014,337.

\* cited by examiner

SYSTEMS AND METHODS FOR REGULATING OUTPUT CURRENTS OF POWER CONVERSION SYSTEMS

1. CROSS-REFERENCES TO RELATED APPLICATIONS

This application is a continuation of U.S. patent application Ser. No. 14/817,081, filed Aug. 3, 2015, which claims priority to Chinese Patent Application No. 201510413940.8, filed Jul. 15, 2015, both of these applications being incorporated by reference herein for all purposes. In addition, U.S. patent application Ser. No. 14/817,081 is a continuation-in-part of U.S. patent application Ser. No. 14/272,323, filed May 7, 2014, claiming priority to Chinese Patent Application No. 201410157557.6, filed Apr. 18, 2014, all of these applications being incorporated by reference herein for all purposes.

2. BACKGROUND OF THE INVENTION

The present invention is directed to integrated circuits. More particularly, the invention provides a system and method for current regulation. Merely by way of example, the invention has been applied to power conversion systems in quasi-resonance mode. But it would be recognized that the invention has a much broader range of applicability.

Light emitting diodes (LEDs) are widely used for lighting applications. Oftentimes, approximately constant currents are used to control working currents of LEDs to achieve constant brightness. FIG. 1 is a simplified diagram showing a conventional power conversation system for LED lighting. The power conversion system 100 includes a controller 102, resistors 104, 124, 126 and 132, capacitors 106, 120 and 134, a diode 108, a transformer 110 including a primary winding 112, a secondary winding 114 and an auxiliary winding 116, a power switch 128, a current sensing resistor 130, and a rectifying diode 118. The controller 102 includes terminals (e.g., pins) 138, 140, 142, 144, 146 and 148. For example, the power switch 128 is a bipolar junction transistor. In another example, the power switch 128 is a MOS transistor.

An alternate-current (AC) input voltage 152 is applied to the system 100. A bulk voltage 150 (e.g., a rectified voltage no smaller than 0 V) associated with the AC input voltage 152 is received by the resistor 104. The capacitor 106 is charged in response to the bulk voltage 150, and a voltage 154 is provided to the controller 102 at the terminal 138 (e.g., terminal VCC). If the voltage 154 is larger than a predetermined threshold voltage in magnitude, the controller 102 begins to operate normally, and outputs a drive signal 156 through the terminal 142 (e.g., terminal GATE). For example, the drive signal 156 is a pulse-width-modulation (PWM) signal with a switching frequency and a duty cycle. The switch 128 is closed (e.g., being turned on) or open (e.g., being turned off) in response to the drive signal 156 so that the output current 158 is regulated to be approximately constant.

The auxiliary winding 116 charges the capacitor 106 through the diode 108 when the switch 128 is opened (e.g., being turned off) in response to the drive signal 156 so that the controller 102 can operate normally. For example, a feedback signal 160 is provided to the controller 102 through the terminal 140 (e.g., terminal FB) in order to detect the end of a demagnetization process of the secondary winding 118 for charging or discharging the capacitor 134 using an internal error amplifier in the controller 102. In another example, the feedback signal 160 is provided to the controller 102 through the terminal 140 (e.g., terminal FB) in order to detect the beginning and the end of the demagnetization process of the secondary winding 118. The resistor 130 is used for detecting a primary current 162 flowing through the primary winding 112, and a current-sensing signal 164 is provided to the controller 102 through the terminal 144 (e.g., terminal CS) to be processed during each switching cycle. Peak magnitudes of the current-sensing signal 164 are sampled and provided to the internal error amplifier. The capacitor 120 is used to maintain an output voltage 168 so as to keep a stable output current through an output load (e.g., one or more LEDs 122). For example, the system 100 operates in a quasi-resonant mode.

FIG. 2 is a simplified conventional diagram showing the controller 102 as part of the system 100. The controller 102 includes a ramp-signal generator 202, an under-voltage lock-out (UVLO) component 204, a modulation component 206, a logic controller 208, a driving component 210, a demagnetization detector 212, an error amplifier 216, and a current-sensing component 214.

As shown in FIG. 2, the UVLO component 204 detects the signal 154 and outputs a signal 218. If the signal 154 is larger than a first predetermined threshold in magnitude, the controller 102 begins to operate normally. If the signal 154 is smaller than a second predetermined threshold in magnitude, the controller 102 is turned off. The second predetermined threshold is smaller than the first predetermined threshold in magnitude. The error amplifier 216 receives a signal 220 from the current-sensing component 214 and a reference signal 222 and outputs an amplified signal 224 to the modulation component 206. The modulation component 206 also receives a signal 228 from the ramp-signal generator 202 and outputs a modulation signal 226. For example, the signal 228 is a ramping signal and increases, linearly or non-linearly, to a peak magnitude during each switching period. The logic controller 208 processes the modulation signal 226 and outputs a control signal 230 to the driving component 210 which generates the signal 156 to turn on or off the switch 128. For example, the demagnetization detector 212 detects the feedback signal 160 and outputs a signal 232 for determining the end of the demagnetization process of the secondary winding 114. In another example, the demagnetization detector 212 detects the feedback signal 160 and outputs the signal 232 for determining the beginning and the end of the demagnetization process of the secondary winding 114. In addition, the demagnetization detector 212 outputs a trigger signal 298 to the logic controller 208 to start a next cycle. The controller 102 is configured to keep an on-time period associated with the modulation signal 226 approximately constant for a given output load.

The controller 102 is operated in a voltage-mode where, for example, the signal 224 from the error amplifier 216 and the signal 228 from the oscillator 202 are both voltage signals and are compared by the comparator 206 to generate the modulation signal 226 to drive the power switch 128. Therefore, an on-time period associated with the power switch 128 is determined by the signal 224 and the signal 228.

FIG. 3 is a simplified conventional diagram showing the current-sensing component 214 and the error amplifier 216 as parts of the controller 102. The current-sensing component 214 includes a switch 302 and a capacitor 304. The error amplifier 216 includes switches 306 and 308, an operational transconductance amplifier (OTA) 310.

As shown in FIG. 3, the current-sensing component 214 samples the current-sensing signal 164 and the error amplifier 216 amplifies the difference between the signal 220 and the reference signal 222. Specifically, the switch 302 is closed (e.g., being turned on) or open (e.g., being turned off) in response to a signal 314 in order to sample peak magnitudes of the current-sensing signal 164 in different switching periods. If the switch 302 is closed (e.g., being turned on) in response to the signal 314 and the switch 306 is open (e.g., being turned off) in response to the signal 232 from the demagnetization detector 212, the capacitor 304 is charged and the signal 220 increases in magnitude. If the switch 306 is closed (e.g., being turned on) in response to the signal 232, the switch 308 is open (e.g., being turned off) in response to a signal 312 and the difference between the signal 220 and the reference signal 222 is amplified by the amplifier 310. The signal 312 and the signal 232 are complementary to each other. For example, during the demagnetization process of the secondary winding 114, the signal 232 is at a logic high level. The switch 306 remains closed (e.g., being turned on) and the switch 308 remains open (e.g., being turned off). The OTA 310, together with the capacitor 134, performs integration associated with the signal 220.

Under stable normal operations, an average output current is determined, according to the following equation, without taking into account any error current:

$$\overline{I_o} = \frac{1}{2} \times N \times \frac{V_{ref\_ea}}{R_{cs}} \quad \text{(Equation 1)}$$

where N represents a turns ratio between the primary winding 112 and the secondary winding 114, $V_{ref\_ea}$ represents the reference signal 222 and $R_{cs}$ represents the resistance of the resistor 130. As shown in Equation 1, the parameters associated with peripheral components, such as N and $R_{cs}$, can be properly selected through system design to achieve output current regulation.

For LED lighting, efficiency, power factor and total harmonic are also important. For example, efficiency is often needed to be as high as possible (e.g., >90%), and a power factor is often needed to be greater than 0.9. Moreover, total harmonic distortion is often needed to be as low as possible (e.g., <10%) for some applications. But the system 100 often cannot satisfy all these needs.

Hence it is highly desirable to improve the techniques of regulating output currents of power conversion systems.

3. BRIEF SUMMARY OF THE INVENTION

The present invention is directed to integrated circuits. More particularly, the invention provides a system and method for current regulation. Merely by way of example, the invention has been applied to power conversion systems. But it would be recognized that the invention has a much broader range of applicability.

According to one embodiment, a system controller for regulating a power conversion system includes a first controller terminal and a second controller terminal. The first controller terminal is configured to receive a first signal associated with an input signal for a primary winding of a power conversation system. The second controller terminal is configured to output a drive signal to a switch to affect a first current flowing through the primary winding of the power conversion system, the drive signal being associated with an on-time period, the switch being closed during the on-time period. The system controller is configured to adjust a duration of the on-time period based on at least information associated with the first signal.

According to another embodiment, a system controller for regulating a power conversion system includes a first controller terminal, a ramp-signal generator, and a second controller terminal. The first controller terminal is configured to provide a compensation signal based on at least information associated with a first current flowing through a primary winding of a power conversion system. The ramp-signal generator is configured to receive a first signal associated with the compensation signal and generate a ramping signal based on at least information associated with the first signal, the ramping signal being associated with a ramping slope. The second controller terminal is configured to output a drive signal to a switch based on at least information associated with the ramping signal to affect the first current. The system controller is configured to adjust the ramping slope of the ramping signal based on at least information associated with the compensation signal.

According to yet another embodiment, a method for regulating a power conversion system includes: receiving a first signal from a first controller terminal, the first signal being associated with an input signal for a primary winding of a power conversation system; adjusting a duration of an on-time period related to a drive signal based on at least information associated with the first signal; and outputting the drive signal from a second controller terminal to a switch to affect a first current flowing through the primary winding of the power conversion system, the switch being closed during the on-time period.

According to yet another embodiment, a method for regulating a power conversion system includes: providing a compensation signal by a first controller terminal based on at least information associated with a first current flowing through a primary winding of a power conversion system; generating a first signal based on at least information associated with the compensation signal; and processing information associated with the first signal. The method further includes: adjusting a ramping slope associated with a ramping signal based on at least information associated with the first signal; receiving the ramping signal; generating a drive signal based on at least information associated with the ramping signal; and outputting the drive signal from a second controller terminal to a switch to affect the first current.

In one embodiment, a system controller for regulating a power conversion system includes: a signal generator configured to receive a converted signal and a first compensation signal and generate a second compensation signal based at least in part on the converted signal and the first compensation signal, the converted signal being associated with an input signal for a power conversion system, the first compensation signal being associated with a sensing signal related to a first current flowing through a primary winding of the power conversion system; a modulation component configured to receive the second compensation signal and a ramping signal and generate a modulation signal based at least in part on the second compensation signal and the ramping signal; and a drive component configured to receive the modulation signal and output a drive signal based at least in part on the modulation signal to a switch to affect the first current, the drive signal being associated with an on-time period, the switch being closed during the on-time period. The system controller is configured to adjust a duration of the on-time period based at least in part on the converted signal and the second compensation signal.

In another embodiment, a method for regulating a power conversion system includes: receiving a converted signal and a first compensation signal, the converted signal being associated with an input signal for a power conversion system, the first compensation signal being associated with a sensing signal related to a first current flowing through a primary winding of the power conversion system; generating a second compensation signal based at least in part on the converted signal and the first compensation signal; receiving the second compensation signal and a ramping signal; generating a modulation signal based at least in part on the second compensation signal and the ramping signal; receiving the modulation signal; and outputting a drive signal based at least in part on the modulation signal to affect the first current, the drive signal being associated with an on-time period. The outputting a drive signal based at least in part on the modulation signal to affect the first current includes adjusting a duration of the on-time period based at least in part on the converted signal and the second compensation signal.

Depending upon embodiment, one or more benefits may be achieved. These benefits and various additional objects, features and advantages of the present invention can be fully appreciated with reference to the detailed description and accompanying drawings that follow.

4. BRIEF DESCRIPTION OF THE DRAWINGS

5. DETAILED DESCRIPTION OF THE INVENTION

The present invention is directed to integrated circuits. More particularly, the invention provides a system and method for current regulation. Merely by way of example, the invention has been applied to power conversion systems. But it would be recognized that the invention has a much broader range of applicability.

Figure 1:
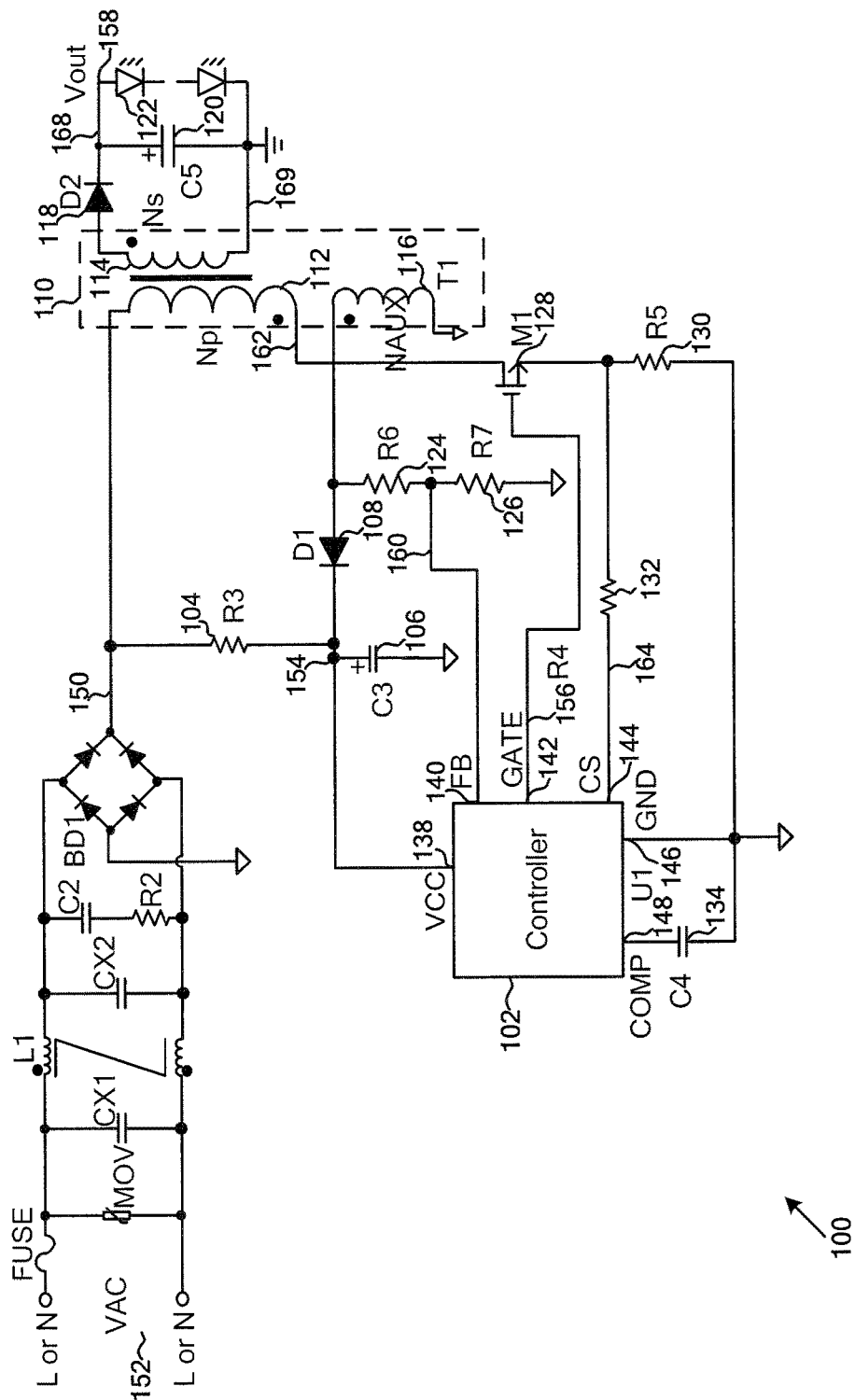
FIG. 1 is a simplified diagram showing a conventional power conversation system for LED lighting.
Figure 2:
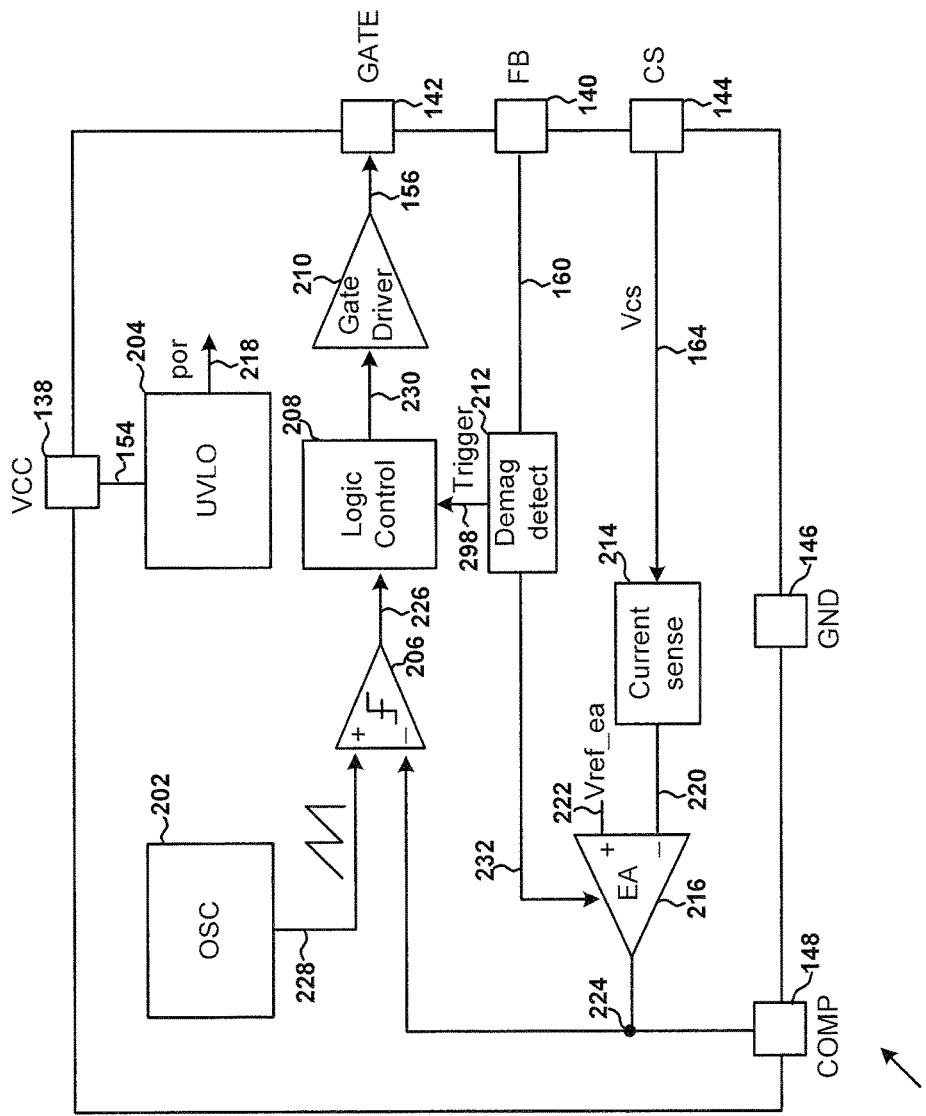
FIG. 2 is a simplified conventional diagram showing a controller as part of the system as shown in FIG. 1.
Figure 3:
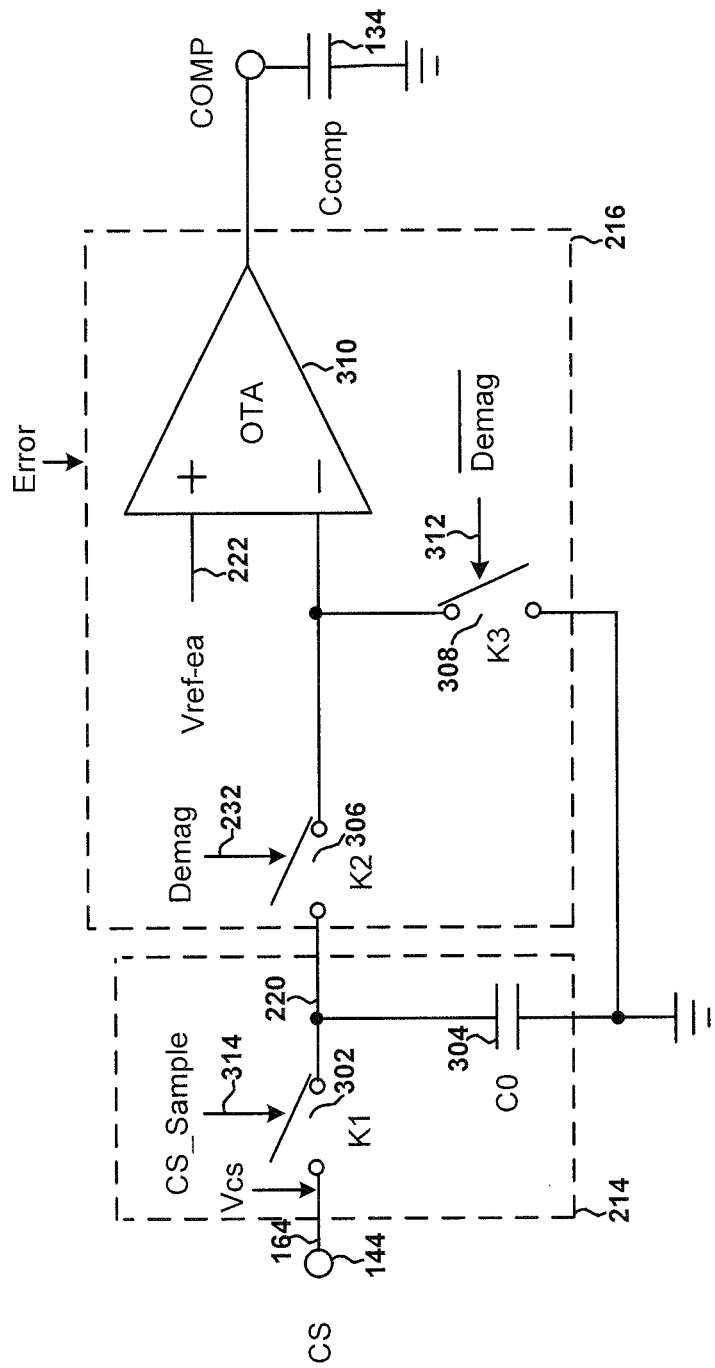
FIG. 3 is a simplified conventional diagram showing the current-sensing component and the error amplifier as parts of the controller as shown in FIG. 2.
Figure 4A:
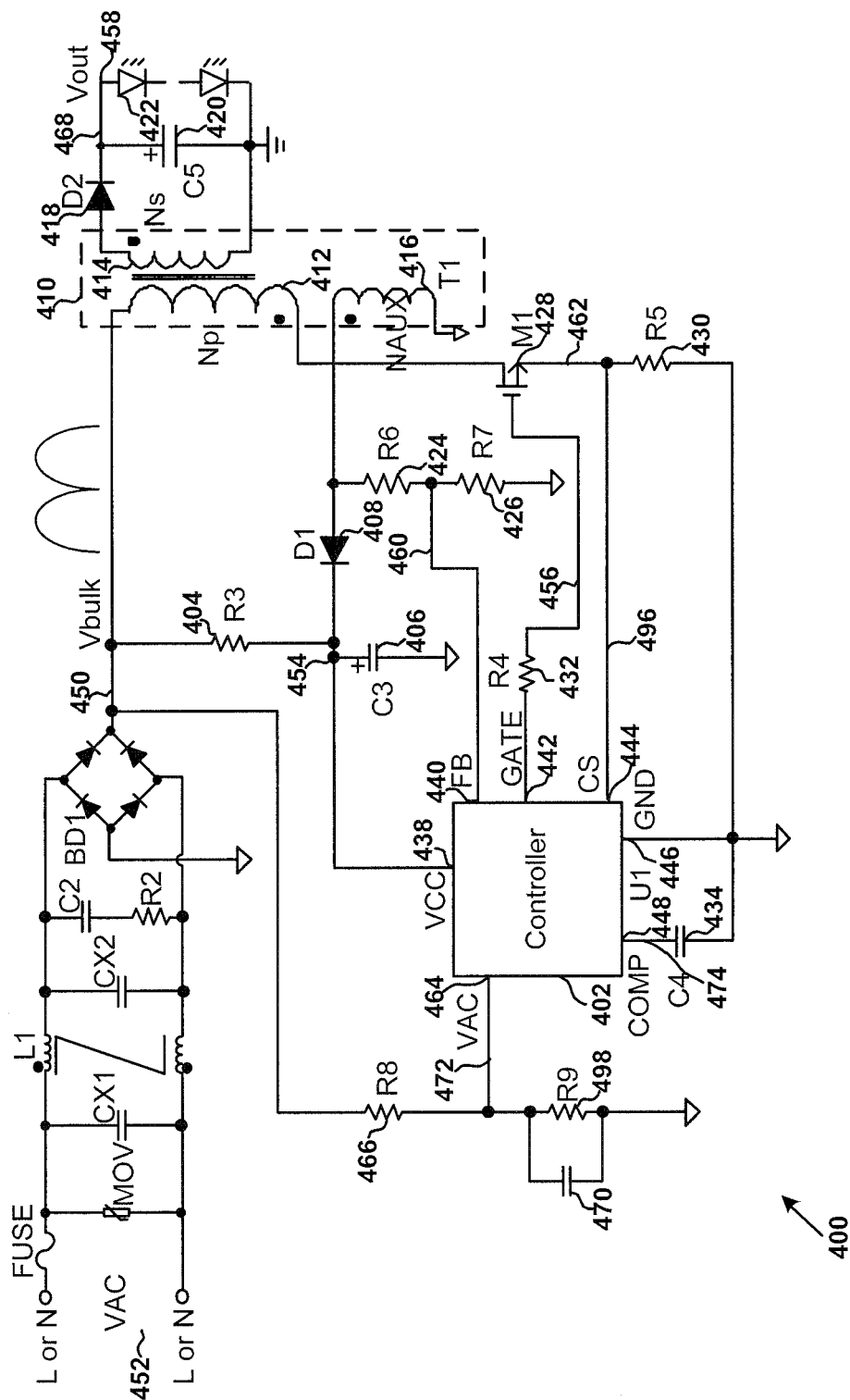
FIG. 4(a) is a simplified diagram showing a power conversion system according to an embodiment of the present invention.

FIG. 4(a) is a simplified diagram showing a power conversion system according to an embodiment of the present invention. This diagram is merely an example, which should not unduly limit the scope of the claims. One of ordinary skill in the art would recognize many variations, alternatives, and modifications. The system 400 includes a controller 402, resistors 404, 424, 426, 432, 466 and 498, capacitors 406, 420, 434 and 470, a diode 408, a transformer 410 including a primary winding 412, a secondary winding 414 and an auxiliary winding 416, a power switch 428, a current sensing resistor 430, and a rectifying diode 418. The controller 402 includes terminals (e.g., pins) 438, 440, 442, 444, 446, 448 and 464. For example, the power switch 428 includes a bipolar junction transistor. In another example, the power switch 428 includes a MOS transistor. In yet another example, the power switch 428 includes an insulated-gate bipolar transistor. The system 400 provides power to an output load 422, e.g., one or more LEDs. In some embodiments, the resistor 432 is removed. For example, the system 400 operates in a quasi-resonant mode.

According to one embodiment, an alternate-current (AC) input voltage 452 is applied to the system 400. For example, a bulk voltage 450 (e.g., a rectified voltage no smaller than 0 V) associated with the AC input voltage 452 is received by the resistor 404. In another example, the capacitor 406 is charged in response to the bulk voltage 450, and a voltage 454 is provided to the controller 402 at the terminal 438 (e.g., terminal VCC). In yet another example, if the voltage 454 is larger than a predetermined threshold voltage in magnitude, the controller 402 begins to operate normally, and outputs a signal through the terminal 442 (e.g., terminal GATE). In yet another example, the switch 428 is closed (e.g., being turned on) or open (e.g., being turned off) in response to a drive signal 456 so that the output current 458 is regulated to be approximately constant.

According to another embodiment, the auxiliary winding 416 charges the capacitor 406 through the diode 408 when the switch 428 is opened (e.g., being turned off) in response to the drive signal 456 so that the controller 402 can operate normally. For example, a feedback signal 460 is provided to the controller 402 through the terminal 440 (e.g., terminal FB) in order to detect the end of a demagnetization process of the secondary winding 414 for charging or discharging the capacitor 434 using an internal error amplifier in the controller 402. In another example, the feedback signal 460 is provided to the controller 402 through the terminal 440 (e.g., terminal FB) in order to detect the beginning and the end of the demagnetization process of the secondary winding 414. As an example, the capacitor 434 is charged or discharged in response to a compensation signal 474 at the terminal 448 (e.g., terminal COMP). In another example, the resistor 430 is used for detecting a primary current 462 flowing through the primary winding 412, and a current-sensing signal 496 is provided to the controller 402 through the terminal 444 (e.g., terminal CS) to be processed during each switching cycle. In yet another example, peak magnitudes of the current-sensing signal 496 are sampled and provided to the internal error amplifier. In yet another example, the capacitor 434 is coupled to an output terminal of the internal error amplifier. In yet another example, the capacitor 420 is used to maintain an output voltage 468.

According to yet another embodiment, the bulk voltage 450 is sensed by the controller 402 through the terminal 464 (e.g., terminal VAC). For example, the controller 402 includes a ramp-signal generator which generates a ramping signal, and the controller 402 is configured to change the ramping slope of the ramping signal based on at least information associated with a signal 472 related to the bulk voltage 450. In another example, an on-time period associated with the drive signal 456 varies based on at least information associated with the signal 450. As an example, the duration of the on-time period increases when the bulk voltage 450 is at a peak magnitude. In another example, the duration of the on-time period decreases when the bulk voltage 450 is at a valley magnitude. The signal 472 is determined according to the following equation:

$$VAC = \frac{R_9}{R_8 + R_9} \times V_{bulk} \quad \text{(Equation 2)}$$

$$V_{bulk} = |A\sin(\omega t + \varphi)| \quad \text{(Equation 3)}$$

where VAC represents the signal 472, $V_{bulk}$ represents the bulk voltage 450, $R_8$ represents a resistance of the resistor 466, and $R_9$ represents a resistance of the resistor 498. In addition, A represents a magnitude, ω represents a frequency, and φ represents a phase angle. In some embodiments, the controller is configured to adjust the ramping signal based on information associated with both the signal 472 and the compensation signal 474. In certain embodiments, the controller 402 is configured to adjust the ramping slope of the ramping signal based on information associated with the signal 472 or the compensation signal 474.

Figure 4B:
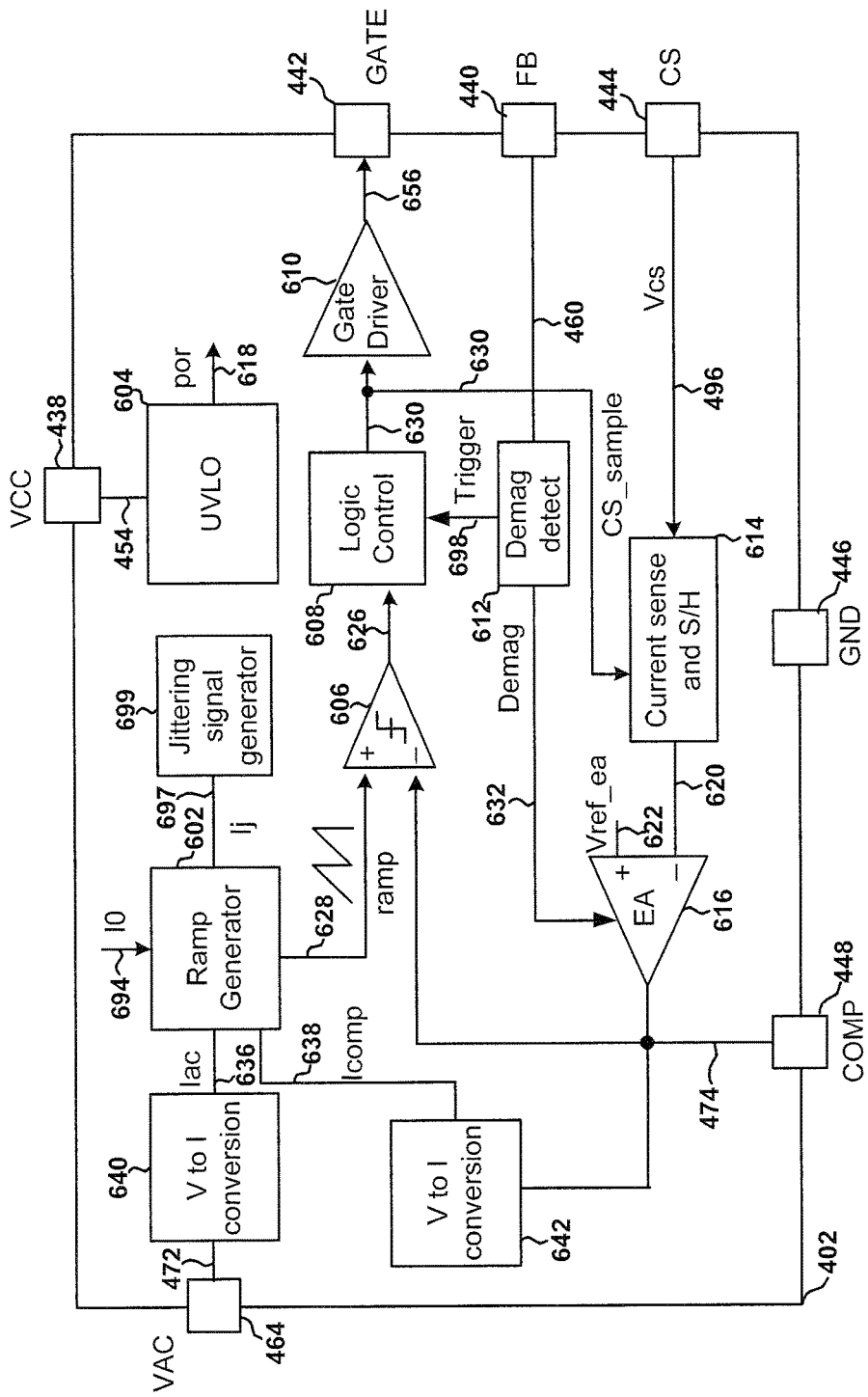
FIG. 4(b) is a simplified diagram showing a controller as part of a power conversion system as shown in FIG. 4(a) according to an embodiment of the present invention.

FIG. 4(b) is a simplified diagram showing the controller 402 as part of the power conversion system 400 according to an embodiment of the present invention. This diagram is merely an example, which should not unduly limit the scope of the claims. One of ordinary skill in the art would recognize many variations, alternatives, and modifications. The controller 402 includes a ramp-signal generator 602, an under-voltage lock-out (UVLO) component 604, a modulation component 606, a logic controller 608, a driving component 610, a demagnetization detector 612, an error amplifier 616, a current-sensing-and-sample/hold component 614, a jittering-signal generator 699, and voltage-to-current-conversion components 640 and 642.

According to one embodiment, the UVLO component 604 detects the signal 454 and outputs a signal 618. For example, if the signal 454 is larger than a first predetermined threshold in magnitude, the controller 402 begins to operate normally. If the signal 454 is smaller than a second predetermined threshold in magnitude, the controller 402 is turned off. In another example, the second predetermined threshold is smaller than the first predetermined threshold in magnitude. In yet another example, the error amplifier 616 receives a signal 620 from the current-sensing-and-sample/hold component 614 and a reference signal 622, and the signal 474 is provided to the modulation component 606 and the voltage-to-current-conversion component 642. As an example, the voltage-to-current-conversion component 640 receives the signal 472 and outputs a signal 636 to the ramp-signal generator 602. In another example, the ramp-signal generator 602 also receives a current signal 694 and a jittering signal 697 (e.g., a jittering current) generated by the jittering-signal generator 699 and generates a ramping signal 628.

According to another embodiment, the jittering current 697 flows from the jittering-signal generator 699 to the ramp-signal generator 602. For example, the jittering current 697 flows from the ramp-signal generator 602 to the jittering-signal generator 699. In another example, the modulation component 606 receives the ramping signal 628 and outputs a modulation signal 626. For example, the signal 628 increases, linearly or non-linearly, to a peak magnitude during each switching period. The logic controller 608 processes the modulation signal 626 and outputs a control signal 630 to the current-sensing-and-sample/hold component 614 and the driving component 610.

According to yet another embodiment, the current-sensing-and-sample/hold component 614 samples the current sensing signal 496 in response to the control signal 630 and then holds the sampled signal until the current-sensing-andsample/hold component 614 samples again the current sensing signal 496. For example, the driving component 610 generates a signal 656 related to the drive signal 456 to affect the switch 428. As an example, the demagnetization detector 612 detects the feedback signal 460 and outputs a demagnetization signal 632 for determining the end of the demagnetization process of the secondary winding 414. As another example, the demagnetization detector 612 detects the feedback signal 460 and outputs the demagnetization signal 632 for determining the beginning and the end of the demagnetization process of the secondary winding 414. In yet another example, the demagnetization detector 612 outputs a trigger signal 698 to the logic controller 608 to start a next cycle (e.g., corresponding to a next switching period). In yet another example, when the signal 656 is at a logic high level, the signal 456 is at a logic high level, and when the signal 656 is at a logic low level, the signal 456 is at a logic low level. In yet another example, the capacitor 434 is coupled to the terminal 448 and forms, together with the error amplifier 616, an integrator or a low-pass filter. In yet another example, the error amplifier 616 is a transconductance amplifier and outputs a current which is proportional to a difference between the reference signal 622 and the signal 620. In yet another example, the error amplifier 616 together with the capacitor 434 generates the signal 474 which is a voltage signal. In yet another example, the ramping slope of the ramping signal 628 is modulated in response to the jittering signal 697.

In some embodiments, the jittering signal 697 corresponds to a deterministic signal, such as a triangle waveform (e.g., with a frequency of several hundred Hz), or a sinusoidal waveform (e.g., with a frequency of several hundred Hz). For example, the jittering signal 697 is associated with multiple jittering cycles corresponding to a predetermined jittering frequency (e.g., approximately constant) related to a predetermined jittering period (e.g., approximately constant). As an example, the signal 656 is associated with multiple modulation cycles corresponding to a modulation frequency (e.g., not constant) related to a modulation period (e.g., not constant). In another example, the system controller 402 changes the ramping slope associated with the ramping signal 628 based on at least information associated with the jittering signal 628 so that, within a same jittering cycle of the multiple jittering cycles, the ramping slope is changed (e.g., increased, or decreased) by different magnitudes corresponding to different modulation cycles respectively. In yet another example, the ramping slope is changed during different modulation cycles adjacent to each other. In yet another example, the ramping slope is changed during different modulation cycles not adjacent to each other. In yet another example, the system controller 402 adjusts the modulation frequency based on at least information associated with the changed ramping slope.

In certain embodiments, the jittering signal 697 corresponds to a random (e.g., pseudo-random) signal with a random (e.g., pseudo-random) waveform. For example, the system controller 402 changes the ramping slope associated with the ramping signal 628 based on at least information associated with the random jittering signal 628 so that the ramping slope is changed by random magnitudes corresponding to different modulation cycles respectively. In yet another example, the ramping slope is changed during different modulation cycles that are adjacent to each other. In yet another example, the ramping slope is changed during different modulation cycles that are not adjacent to each other. In yet another example, the system controller 402 adjusts the modulation frequency based on at least information associated with the ramping slope changed by the random magnitudes.

In some embodiments, the signal 636 represents a current and is used for adjusting a ramping slope associated with the ramping signal 628. In certain embodiments, the signal 638 represents a current and is used for adjusting the ramping slope associated with the ramping signal 628. For example, information associated with both the signal 636 and the signal 638 is used for adjusting the ramping slope associated with the ramping signal 628, so as to adjust the duration of an on-time period associated with the drive signal 456. In another example, the current 636 flows from the voltage-to-current-conversion component 640 to the ramp-signal generator 602. In yet another example, the current 636 flows from the ramp-signal generator 602 to the voltage-to-current-conversion component 640. In yet another example, the current 638 flows from the voltage-to-current-conversion component 642 to the ramp-signal generator 602. In yet another example, the current 638 flows from the ramp-signal generator 602 to the voltage-to-current-conversion component 642.

FIG. 4(*c*) is a simplified timing diagram for the controller 402 as part of the power conversion system 400 according to an embodiment of the present invention. This diagram is merely an example, which should not unduly limit the scope of the claims. One of ordinary skill in the art would recognize many variations, alternatives, and modifications. The waveform 902 represents the signal 626 as a function of time, the waveform 904 represents the signal 656 as a function of time, the wave form 906 represents the demagnetization signal 632 as a function of time, the waveform 908 represents the trigger signal 698 as a function of time, and the waveform 910 represents the ramping signal 628 as a function of time.

An on-time period and an off-time period associated with the signal 656 are shown in FIG. 4(*c*). The on-time period begins at a time $t_3$ and ends at a time $t_5$, and the off-time period begins at the time $t_5$ and ends at a time $t_7$. For example, $t_0 \le t_1 \le t_2 \le t_3 \le t_4 \le t_5 \le t_6 \le t_7$.

According to one embodiment, at $t_0$, the demagnetization signal 632 changes from the logic low level to the logic high level. For example, the demagnetization detector 612 generates a pulse (e.g., between $t_0$ and $t_2$) in the trigger signal 698 to trigger a new cycle. As an example, the ramping signal 628 begins to increases from a magnitude 912 to a magnitude 914 (e.g., at $t_4$). In another example, at $t_1$, the signal 626 changes from the logic low level to the logic high level. After a short delay, the signal 656 changes (e.g., at $t_3$) from the logic low level to the logic high level, and in response the switch 428 is turned on. In yet another example, at $t_4$, the signal 626 changes from the logic high level to the logic low level, and the ramping signal 628 decreases from the magnitude 914 to the magnitude 912. After a short delay, the signal 656 changes (e.g., at $t_5$) from the logic high level to the logic low level, and in response, the switch 428 is turned off. As an example, at $t_6$, the demagnetization signal 632 changes from the logic low level to the logic high level which indicates a beginning of a demagnetization process. In another example, at $t_7$, the demagnetization signal 632 changes from the logic high level to the logic low level which indicates an end of the demagnetization process. In yet another example, the demagnetization detector 612 generates another pulse in the trigger signal 698 to start a next cycle. In yet another example, the magnitude 914 of the ramping signal 628 is associated with the magnitude of the signal 474.

According to another embodiment, the magnitude change of the ramping signal 628 during the on-time period is determined as follows:

$$\Delta V_{ramp} = V_{comp} - V_{ref\_1} = \text{slope} \times T_{on} \quad \text{(Equation 4)}$$

where $\Delta V_{ramp}$ represents the magnitude changes of the ramping signal 628, $V_{comp}$ represents the signal 474, $V_{ref\_1}$ represents a predetermined voltage magnitude, slope represents a ramping slope associated with the ramping signal 628, and $T_{on}$ represents the duration of the on-time period. For example, $V_{ref\_1}$ corresponds to a minimum magnitude of the ramping signal 628. Based on Equation 4, the duration of the on-time period is determined as follows:

$$T_{on} = \frac{V_{comp} - V_{ref}}{\text{slope}} \quad \text{(Equation 5)}$$

As shown in Equation 5, for a given compensation signal (e.g., the signal 474), the duration of the on-time period is determined by the ramping slope of the ramping signal 628. In some embodiments, the ramping slope of the ramping signal 628 is adjusted according to the signal 636 and the signal 638, so that the duration of the on-time period associated with the drive signal 456 is adjusted. For example, adjusting the ramping slope of the ramping signal 628 to change the duration of the on-time period is applicable to power conversion systems with a buck-boost topology operated in a quasi-resonant (QR) mode. In another example, a slope of the waveform 910 between $t_1$ and $t_4$ corresponds to the ramping slope of the ramping signal 628.

As discussed above and further emphasized here, FIGS. 4(b) and 4(c) are merely examples, which should not unduly limit the scope of the claims. One of ordinary skill in the art would recognize many variations, alternatives, and modifications. For example, the voltage-to-current-conversion component 642 is removed from the controller 402, as shown in FIG. 4(d).

Figure 4C:
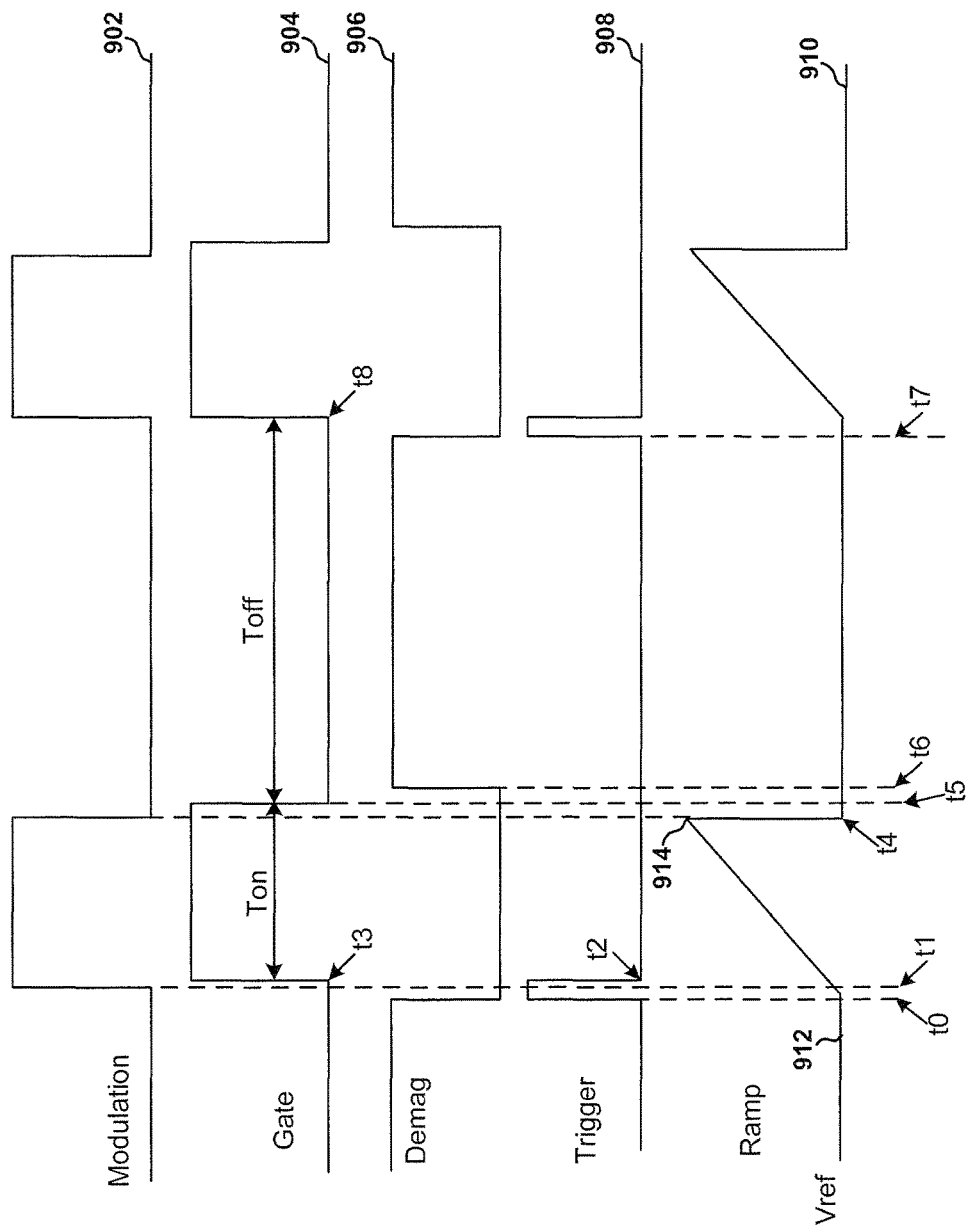
FIG. 4(c) is a simplified timing diagram for a controller as part of a power conversion system as shown in FIG. 4(a) according to an embodiment of the present invention.
Figure 4D:
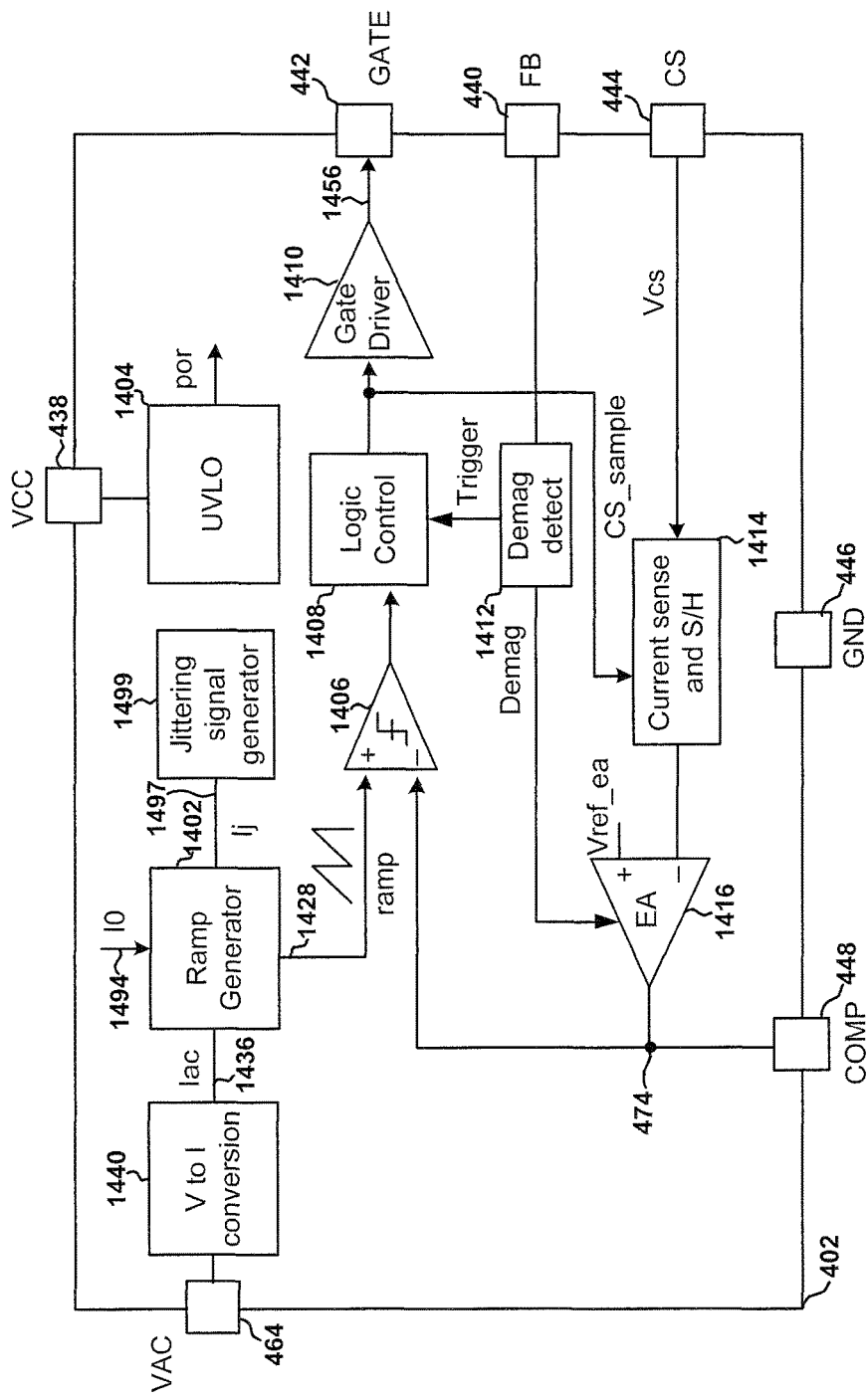
FIG. 4(d) is a simplified diagram showing a controller as part of a power conversion system as shown in FIG. 4(a) according to another embodiment of the present invention.

FIG. 4(d) is a simplified diagram showing the controller 402 as part of the power conversion system 400 according to another embodiment of the present invention. This diagram is merely an example, which should not unduly limit the scope of the claims. One of ordinary skill in the art would recognize many variations, alternatives, and modifications. The controller 402 includes a ramp-signal generator 1402, an under-voltage lock-out (UVLO) component 1404, a modulation component 1406, a logic controller 1408, a driving component 1410, a demagnetization detector 1412, an error amplifier 1416, a current-sensing-and-sample/hold component 1414, a jittering-signal generator 1499, and a voltage-to-current-conversion component 1440.

In some embodiments, the ramp-signal generator 1402 receives a current signal 1494, a jittering signal 1497 (e.g., a jittering current) generated by the jittering-signal generator 1499 and a signal 1436 from the voltage-to-current-conversion component 1440 and outputs a ramping signal 1428. For example, the jittering current 1497 flows from the jittering-signal generator 1499 to the ramp-signal generator 1402. In another example, the jittering current 1497 flows from the ramp-signal generator 1402 to the jittering-signal generator 1499. For example, a ramping slope associated with the ramping signal 1428 is adjusted based on at least information associated with the signal 1436 that is related to the bulk voltage 450. The operations of other components in FIG. 4(d) are similar to what are described in FIG. 4(b). For example, the timing diagram for the controller 402 as part of the system 400 is similar to what is shown in FIG. 4(c). As an example, the signal 1436 represents a current. In another example, the current 1436 flows from the voltage-to-current-conversion component 1440 to the ramp-signal generator 1402. In yet another example, the current 1436 flows from the ramp-signal generator 1402 to the voltage-to-current-conversion component 1440. In yet another example, the ramping slope of the ramping signal 1428 is modulated in response to the jittering signal 1497.

In certain embodiments, the jittering signal 1497 corresponds to a deterministic signal, such as a triangle waveform (e.g., with a frequency of several hundred Hz), or a sinusoidal waveform (e.g., with a frequency of several hundred Hz). For example, the jittering signal 1497 is associated with multiple jittering cycles corresponding to a predetermined jittering frequency (e.g., approximately constant) related to a predetermined jittering period (e.g., approximately constant). As an example, the signal 1456 is associated with multiple modulation cycles corresponding to a modulation frequency (e.g., not constant) related to a modulation period (e.g., not constant). In another example, the system controller 402 changes the ramping slope associated with the ramping signal 1428 based on at least information associated with the jittering signal 1428 so that, within a same jittering cycle of the multiple jittering cycles, the ramping slope is changed (e.g., increased, or decreased) by different magnitudes corresponding to different modulation cycles respectively. In yet another example, the ramping slope is changed during different modulation cycles adjacent to each other. In yet another example, the ramping slope is changed during different modulation cycles not adjacent to each other. In yet another example, the system controller 402 adjusts the modulation frequency based on at least information associated with the changed ramping slope.

In certain embodiments, the jittering signal 1497 corresponds to a random (e.g., pseudo-random) signal with a random (e.g., pseudo-random) waveform. For example, the system controller 402 changes the ramping slope associated with the ramping signal 1428 based on at least information associated with the random jittering signal 1428 so that the ramping slope is changed by random magnitudes corresponding to different modulation cycles respectively. In yet another example, the ramping slope is changed during different modulation cycles that are adjacent to each other. In yet another example, the ramping slope is changed during different modulation cycles that are not adjacent to each other. In yet another example, the system controller 402 adjusts the modulation frequency based on at least information associated with the ramping slope changed by the random magnitudes.

As discussed above and further emphasized here, FIG. 4(a), FIG. 4(b), FIG. 4(c), and/or FIG. 4(d) are merely examples, which should not unduly limit the scope of the claims. One of ordinary skill in the art would recognize many variations, alternatives, and modifications. For example, the ramping slope associated with an internal ramping signal in a controller is adjusted using a current signal associated with a bulk voltage, as shown in FIG. 5(a), FIG. 5(b), and FIG. 5(c).

Figure 5A:
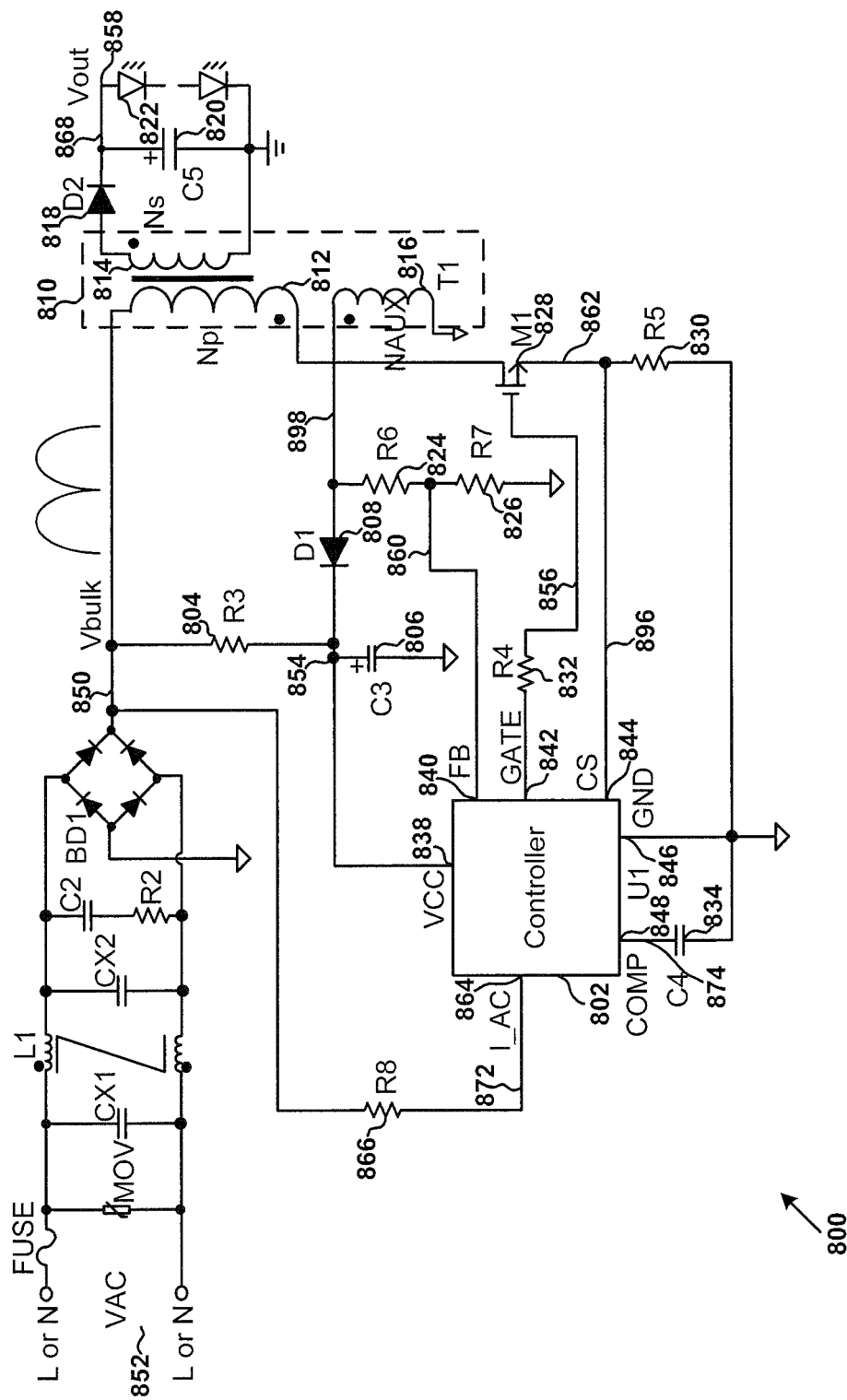
FIG. 5(a) is a simplified diagram showing a power conversion system according to another embodiment of the present invention.
Figure 5B:
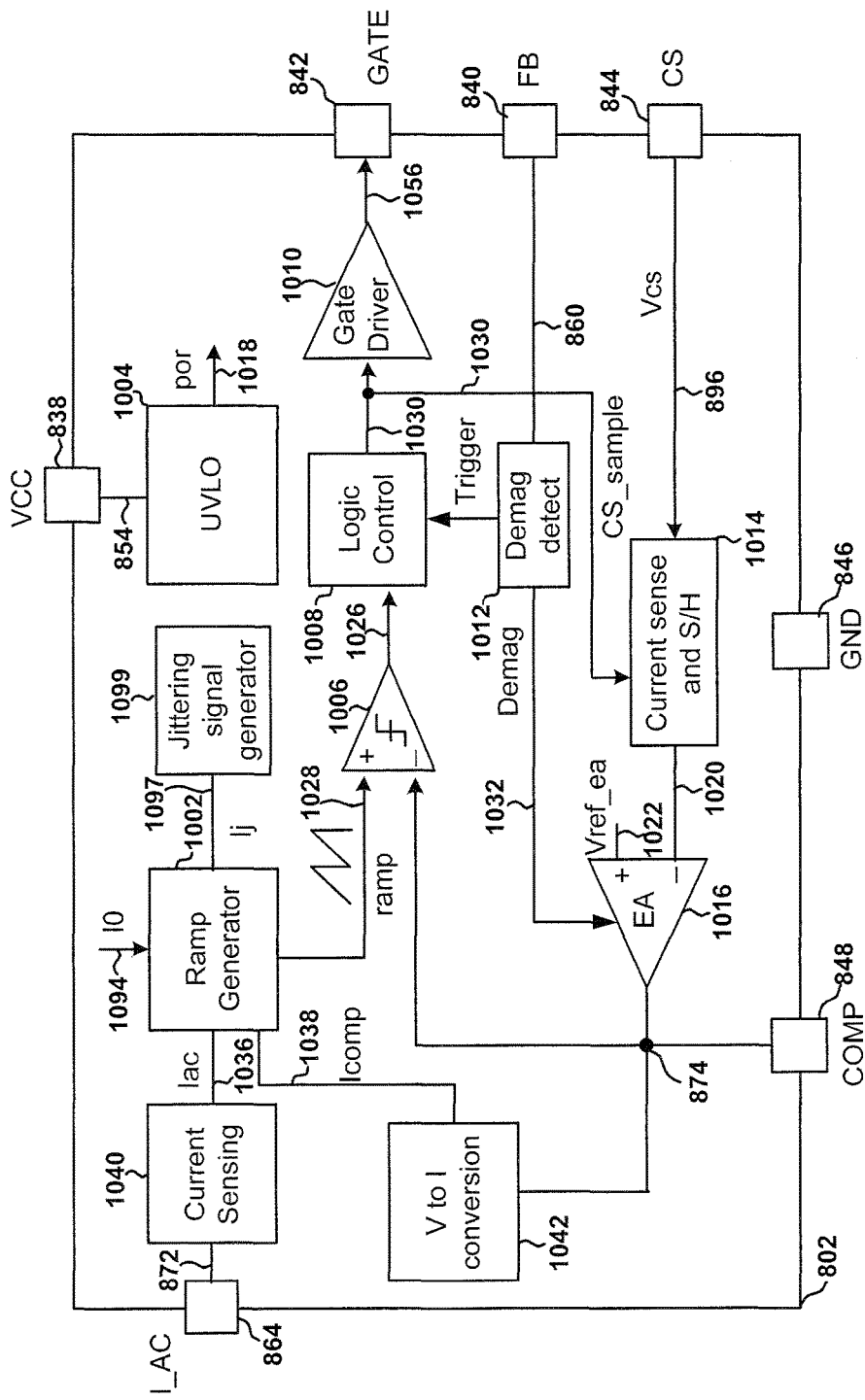
FIG. 5(b) is a simplified diagram showing a controller as part of a power conversion system as shown in FIG. 5(a) according to an embodiment of the present invention.
Figure 5C:
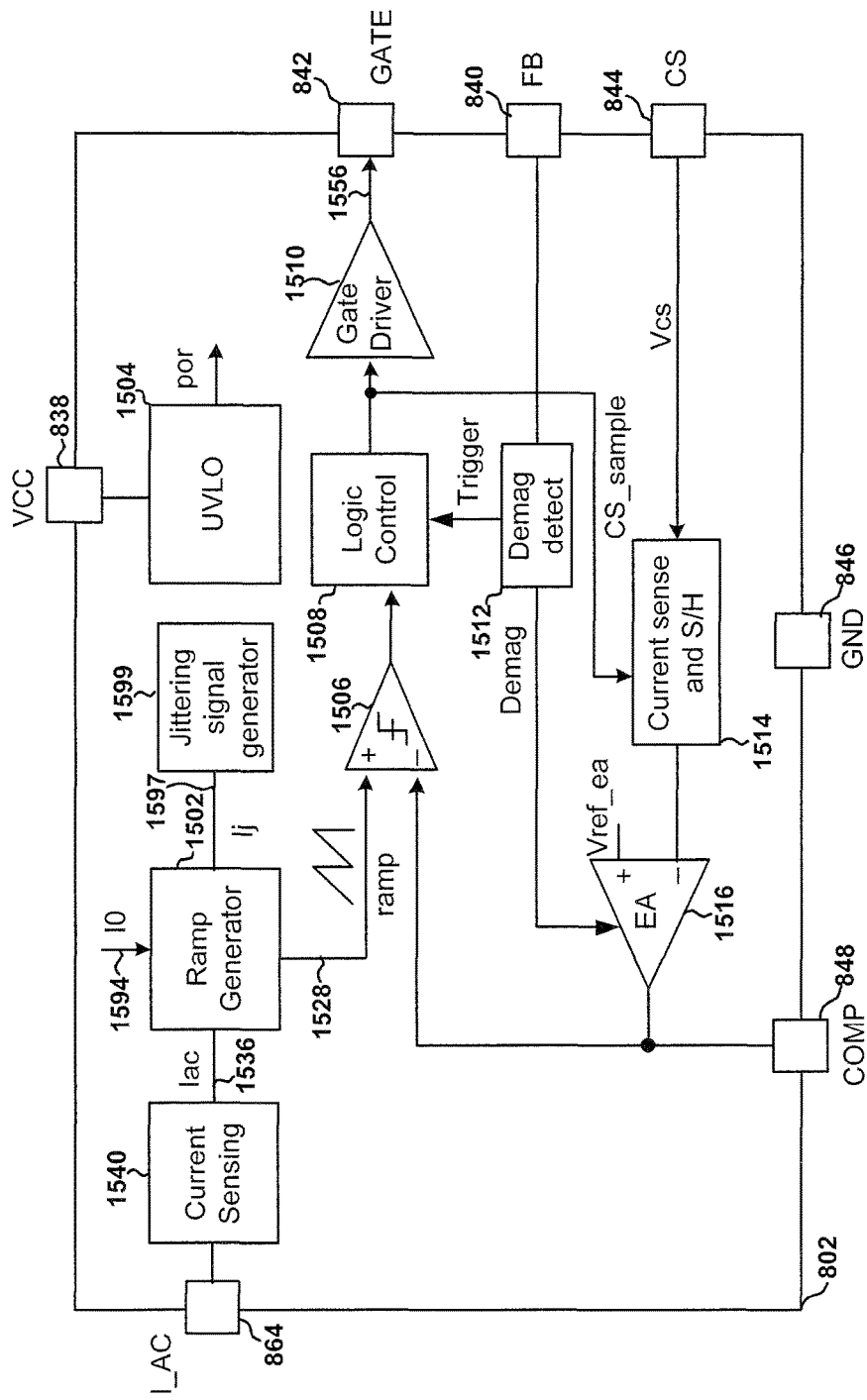
FIG. 5(c) is a simplified diagram showing a controller as part of a power conversion system as shown in FIG. 5(a) according to another embodiment of the present invention.

FIG. 5(a) is a simplified diagram showing a power conversion system according to another embodiment of the present invention. This diagram is merely an example, which should not unduly limit the scope of the claims. One of ordinary skill in the art would recognize many variations, alternatives, and modifications. The system 800 includes a controller 802, resistors 804, 824, 826, 832 and 866, capacitors 806, 820, and 834, a diode 808, a transformer 810 including a primary winding 812, a secondary winding 814 and an auxiliary winding 816, a power switch 828, a current sensing resistor 830, and a rectifying diode 818. The controller 802 includes terminals (e.g., pins) 838, 840, 842, 844, 846, 848 and 864. For example, the power switch 828 includes a bipolar junction transistor. In another example, the power switch 828 includes a MOS transistor. In yet another example, the power switch 828 includes an insulated-gate bipolar transistor. The system 800 provides power to an output load 822, e.g., one or more LEDs. In some embodiments, the resistor 832 is removed. For example, the system 800 operates in a quasi-resonant mode.

According to one embodiment, an alternate-current (AC) input voltage 852 is applied to the system 800. For example, a bulk voltage 850 (e.g., a rectified voltage no smaller than 0 V) associated with the AC input voltage 852 is received by the resistor 804. In another example, the capacitor 806 is charged in response to the bulk voltage 850, and a voltage 854 is provided to the controller 802 at the terminal 838 (e.g., terminal VCC). In yet another example, if the voltage 854 is larger than a predetermined threshold voltage in magnitude, the controller 802 begins to operate normally, and outputs a signal through the terminal 842 (e.g., terminal GATE). In yet another example, the switch 828 is closed (e.g., being turned on) or open (e.g., being turned off) in response to a drive signal 856 so that the output current 858 is regulated to be approximately constant.

According to another embodiment, the auxiliary winding 816 charges the capacitor 806 through the diode 808 when the switch 828 is opened (e.g., being turned off) in response to the drive signal 856 so that the controller 802 can operate normally. For example, a feedback signal 860 is provided to the controller 802 through the terminal 840 (e.g., terminal FB) in order to detect the end of a demagnetization process of the secondary winding 814 for charging or discharging the capacitor 834 using an internal error amplifier in the controller 802. In another example, the feedback signal 860 is provided to the controller 802 through the terminal 840 (e.g., terminal FB) in order to detect the beginning and the end of the demagnetization process of the secondary winding 814. As an example, the capacitor 834 is charged or discharged in response to a compensation signal 874 at the terminal 848 (e.g., terminal COMP). In another example, the resistor 830 is used for detecting a primary current 862 flowing through the primary winding 812, and a current-sensing signal 896 is provided to the controller 802 through the terminal 844 (e.g., terminal CS) to be processed during each switching cycle. In yet another example, peak magnitudes of the current-sensing signal 896 are sampled and provided to the internal error amplifier. In yet another example, the capacitor 834 is coupled to an output terminal of the internal error amplifier. In yet another example, the capacitor 820 is used to maintain an output voltage 868.

According to yet another embodiment, the bulk voltage 850 is sensed by the controller 802 through the terminal 864 (e.g., terminal IAC). For example, the controller 802 includes a ramp-signal generator which generates a ramping signal, and the controller 802 is configured to change the ramping slope of the ramping signal based on at least information associated with a signal 872 related to the bulk voltage 850. In another example, an on-time period associated with the drive signal 856 varies based on at least information associated with the signal 850. As an example, the duration of the on-time period increases when the bulk voltage 850 is at a peak magnitude. In another example, the duration of the on-time period decreases when the bulk voltage 850 is at a valley magnitude. The signal 872 is determined according to the following equation:

$$I_{ac} = \mu \times \frac{V_{bulk}}{R_8} \qquad \text{(Equation 6)}$$

where $I_{ac}$ represents the signal 872, $V_{bulk}$ represents the bulk voltage 850, $R_8$ represents a resistance of the resistor 866, and $\mu$ represents a constant.

In some embodiments, the controller is configured to adjust the ramping signal based on information associated with both the signal 872 and the compensation signal 874. In certain embodiments, the controller is configured to adjust the ramping signal based on information associated with the signal 872 or the compensation signal 874.

FIG. 5(*b*) is a simplified diagram showing the controller 802 as part of the power conversion system 800 according to an embodiment of the present invention. This diagram is merely an example, which should not unduly limit the scope of the claims. One of ordinary skill in the art would recognize many variations, alternatives, and modifications. The controller 802 includes a ramp-signal generator 1002, an under-voltage lock-out (UVLO) component 1004, a modulation component 1006, a logic controller 1008, a driving component 1010, a demagnetization detector 1012, an error amplifier 1016, a current-sensing-and-sample/hold component 1014, another current-sensing component 1040, a jittering-signal generator 1099, and a voltage-to-current-conversion components 1042.

According to one embodiment, the UVLO component 1004 detects the signal 854 and outputs a signal 1018. For example, if the signal 854 is larger than a first predetermined threshold in magnitude, the controller 802 begins to operate normally. If the signal 854 is smaller than a second predetermined threshold in magnitude, the controller 802 is turned off. In yet another example, the second predetermined threshold is smaller than the first predetermined threshold in magnitude. In yet another example, the error amplifier 1016 receives a signal 1020 from the current-sensing-and-sample/hold component 1014 and a reference signal 1022, and the signal 874 is provided to the modulation component 1006 and the voltage-to-current-conversion component 1042. As an example, the current-sensing component 1040 receives the signal 872 and outputs a signal 1036 to the ramp-signal generator 1002 which also receives a current signal 1094 and a jittering signal 1097 (e.g., a jittering current) generated by the jittering-signal generator 1099. In another example, the jittering current 1097 flows from the jittering-signal generator 1099 to the ramp-signal generator 1002. In yet another example, the jittering current 1097 flows from the ramp-signal generator 1002 to the jittering-signal generator 1099. In yet another example, the modulation component 1006 receives a ramping signal 1028 from the ramp-signal generator 1002 and outputs a modulation signal 1026. For example, the signal 1028 increases, linearly or non-linearly, to a peak magnitude during each switching period. The logic controller 1008 processes the modulation signal 1026 and outputs a control signal 1030 to the current-sensing-and-sample/hold component 1014 and the driving component 1010. For example, the driving component 1010 generates a signal 1056 related to the drive signal 856 to affect the switch 828. As an example, the demagnetization detector 1012 detects the feedback signal 860 and outputs a demagnetization signal 1032 for determining the end of the demagnetization process of the secondary winding 814. As another example, the demagnetization detector 1012 detects the feedback signal 860 and outputs the demagnetization signal 1032 for determining the beginning and the end of the demagnetization process of the secondary winding 814. In another example, the demagnetization detector 1012 outputs a trigger signal 1098 to the logic controller 1008 to start a next modulation cycle. In yet another example, when the signal 1056 is at a logic high level, the signal 856 is at a logic high level, and when the signal 1056 is at a logic low level, the signal 856 is at a logic low level. In yet another example, the ramping slope of the ramping signal 1028 is modulated in response to the jittering signal 1097.

In some embodiments, the jittering signal 1097 corresponds to a deterministic signal, such as a triangle waveform (e.g., with a frequency of several hundred Hz), or a sinusoidal waveform (e.g., with a frequency of several hundred Hz). For example, the jittering signal 1097 is associated with multiple jittering cycles corresponding to a predetermined jittering frequency (e.g., approximately constant) related to a predetermined jittering period (e.g., approximately constant). As an example, the signal 1056 is associated with multiple modulation cycles corresponding to a modulation frequency (e.g., not constant) related to a modulation period (e.g., not constant). In another example, the system controller 802 changes the ramping slope associated with the ramping signal 1028 based on at least information associated with the jittering signal 1028 so that, within a same jittering cycle of the multiple jittering cycles, the ramping slope is changed (e.g., increased, or decreased) by different magnitudes corresponding to different modulation cycles respectively. In yet another example, the ramping slope is changed during different modulation cycles adjacent to each other. In yet another example, the ramping slope is changed during different modulation cycles not adjacent to each other. In yet another example, the system controller 802 adjusts the modulation frequency based on at least information associated with the changed ramping slope.

In certain embodiments, the jittering signal 1097 corresponds to a random (e.g., pseudo-random) signal with a random (e.g., pseudo-random) waveform. For example, the system controller 802 changes the ramping slope associated with the ramping signal 1028 based on at least information associated with the random jittering signal 1028 so that the ramping slope is changed by random magnitudes corresponding to different modulation cycles respectively. In yet another example, the ramping slope is changed during different modulation cycles that are adjacent to each other. In yet another example, the ramping slope is changed during different modulation cycles that are not adjacent to each other. In yet another example, the system controller 802 adjusts the modulation frequency based on at least information associated with the ramping slope changed by the random magnitudes.

In some embodiments, the signal 1036 represents a current and is used for adjusting a ramping slope associated with the ramping signal 1028. In certain embodiments, the signal 1038 represents a current and is used for adjusting the ramping slope associated with the ramping signal 1028. For example, information associated with both the signal 1036 and the signal 1038 is used for adjusting the ramping slope associated with the ramping signal 1028, so as to adjust the duration of an on-time period associated with the drive signal 856. For example, the timing diagram for the controller 802 as part of the system 800 is similar to what is shown in FIG. 4(*c*). In another example, the current 1036 flows from the current-sensing component 1040 to the ramp-signal generator 1002. In yet another example, the current 1036 flows from the ramp-signal generator 1002 to the current-sensing component 1040. In yet another example, the current 1038 flows from the voltage-to-current-conversion component 1042 to the ramp-signal generator 1002. In yet another example, the current 1038 flows from the ramp-signal generator 1002 to the voltage-to-current-conversion component 1042.

FIG. 5(*c*) is a simplified diagram showing the controller 802 as part of the power conversion system 800 according to another embodiment of the present invention. This diagram is merely an example, which should not unduly limit the scope of the claims. One of ordinary skill in the art would recognize many variations, alternatives, and modifications. The controller 802 includes a ramp-signal generator 1502, an under-voltage lock-out (UVLO) component 1504, a modulation component 1506, a logic controller 1508, a driving component 1510, a demagnetization detector 1512, an error amplifier 1516, a current-sensing-and-sample/hold component 1514, a jittering-signal generator 1599, and another current-sensing component 1540.

In some embodiments, the ramp-signal generator 1502 receives a current signal 1594, a jittering signal 1597 (e.g., a jittering current) generated by the jittering-signal generator 1599, and a signal 1536 from the current-sensing component 1540 and outputs a ramping signal 1528. As an example, the jittering current 1597 flows from the jittering-signal generator 1599 to the ramp-signal generator 1502. As another example, the jittering current 1597 flows from the ramp-signal generator 1502 to the jittering-signal generator 1599. For example, a ramping slope associated with the ramping signal 1528 is adjusted based on at least information associated with the signal 1536 that is related to a current signal associated with the bulk voltage 850. The operations of other components in FIG. 5(*c*) are similar to what are described in FIG. 5(*b*). As an example, the signal 1536 represents a current. In another example, the current 1536 flows from the current-sensing component 1540 to the ramp-signal generator 1502. In yet another example, the current 1536 flows from the ramp-signal generator 1502 to the current-sensing component 1540. In yet another example, the ramping slope of the ramping signal 1528 is modulated in response to the jittering signal 1597.

In some embodiments, the jittering signal 1597 corresponds to a deterministic signal, such as a triangle waveform (e.g., with a frequency of several hundred Hz), or a sinusoidal waveform (e.g., with a frequency of several hundred Hz). For example, the jittering signal 1597 is associated with multiple jittering cycles corresponding to a predetermined jittering frequency (e.g., approximately constant) related to a predetermined jittering period (e.g., approximately constant). As an example, the signal 1556 is associated with multiple modulation cycles corresponding to a modulation frequency (e.g., not constant) related to a modulation period (e.g., not constant). In another example, the system controller 802 changes the ramping slope associated with the ramping signal 1528 based on at least information associated with the jittering signal 1528 so that, within a same jittering cycle of the multiple jittering cycles, the ramping slope is changed (e.g., increased, or decreased) by different magnitudes corresponding to different modulation cycles respectively. In yet another example, the ramping slope is changed during different modulation cycles adjacent to each other. In yet another example, the ramping slope is changed during different modulation cycles not adjacent to each other. In yet another example, the system controller 802 adjusts the modulation frequency based on at least information associated with the changed ramping slope.

In certain embodiments, the jittering signal 1597 corresponds to a random (e.g., pseudo-random) signal with a random (e.g., pseudo-random) waveform. For example, the system controller 802 changes the ramping slope associated with the ramping signal 1528 based on at least information associated with the random jittering signal 1528 so that the ramping slope is changed by random magnitudes corresponding to different modulation cycles respectively. In yet another example, the ramping slope is changed during different modulation cycles that are adjacent to each other. In yet another example, the ramping slope is changed during different modulation cycles that are not adjacent to each other. In yet another example, the system controller 802 adjusts the modulation frequency based on at least information associated with the ramping slope changed by the random magnitudes.

Figure 6A:
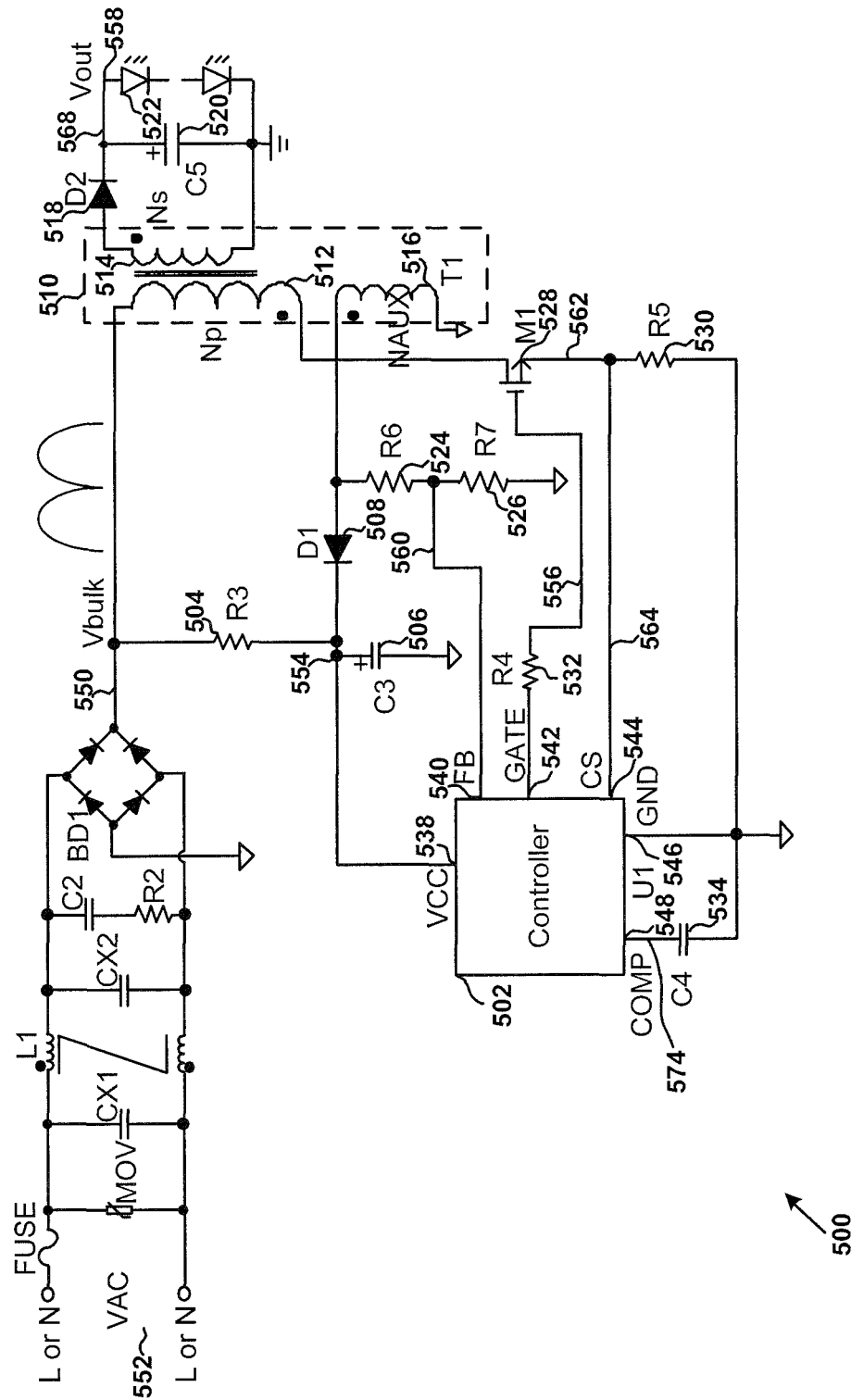
FIG. 6(a) is a simplified diagram showing a power conversion system according to yet another embodiment of the present invention.
Figure 6B:
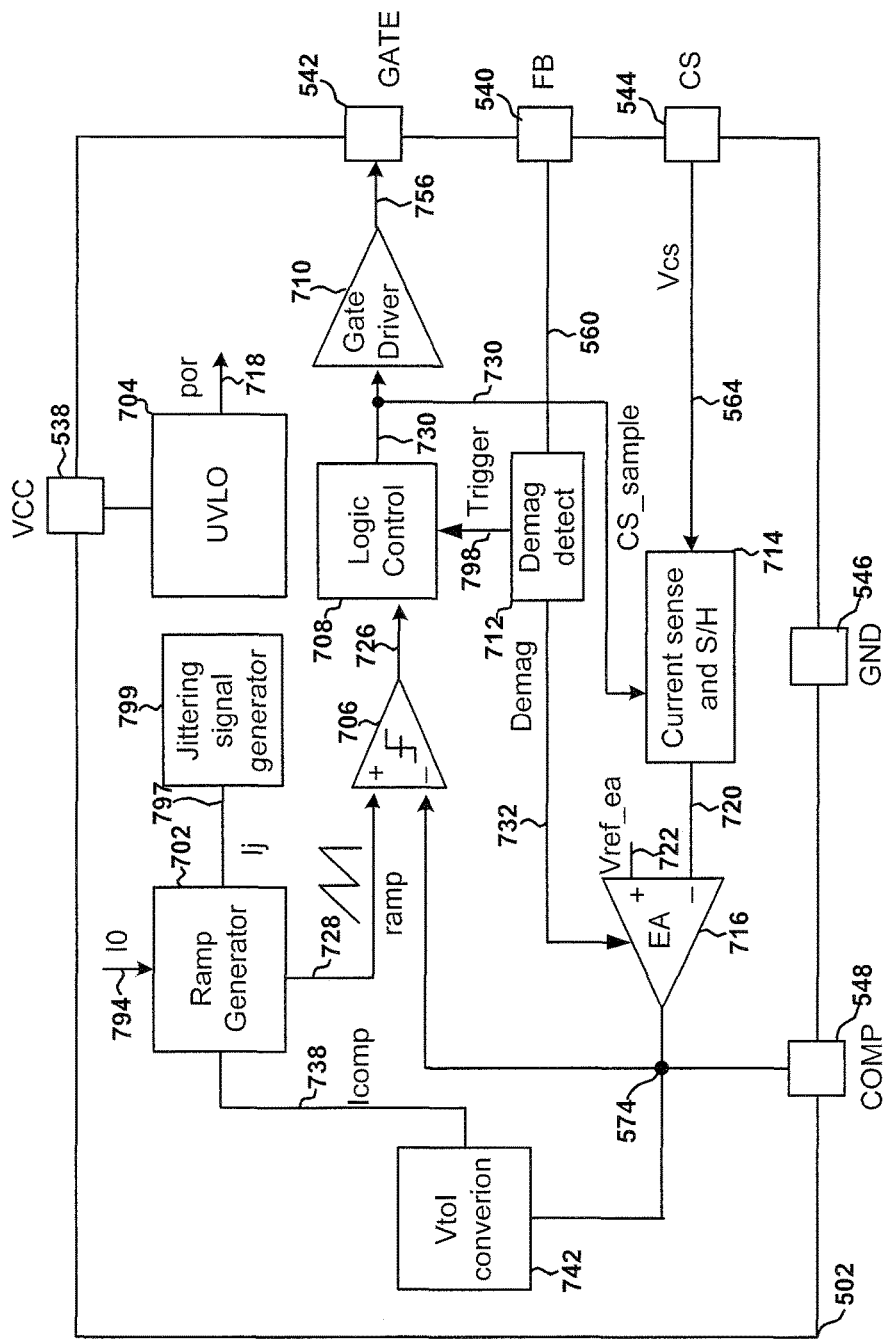
FIG. 6(b) is a simplified diagram showing a controller as part of a power conversion system as shown in FIG. 6(a) according to an embodiment of the present invention.

As discussed above and further emphasized here, FIG. 4(*a*), FIG. 4(*b*), FIG. 5(*a*), and/or FIG. 5(*b*) are merely examples, which should not unduly limit the scope of the claims. One of ordinary skill in the art would recognize many variations, alternatives, and modifications. For example, a terminal (e.g., the terminal 464, the terminal 864) configured to receive signals related to a bulk voltage (e.g., the bulk voltage 450, the bulk voltage 850) is removed from a controller (e.g., the controller 402, the controller 802) for a power conversion system, as shown in FIG. 6(*a*) and FIG. 6(*b*).

FIG. 6(*a*) is a simplified diagram showing a power conversion system according to yet another embodiment of the present invention. This diagram is merely an example, which should not unduly limit the scope of the claims. One of ordinary skill in the art would recognize many variations, alternatives, and modifications. The system 500 includes a controller 502, resistors 504, 524, 526 and 532, capacitors 506, 520 and 534, a diode 508, a transformer 510 including a primary winding 512, a secondary winding 514 and an auxiliary winding 516, a power switch 528, a current sensing resistor 530, and a rectifying diode 518. The controller 502 includes terminals (e.g., pins) 538, 540, 542, 544, 546 and 548. For example, the power switch 528 is a bipolar junction transistor. In another example, the power switch 528 is a MOS transistor. In yet another example, the power switch 528 includes an insulated-gate bipolar transistor. The system 500 provides power to an output load 522, e.g., one or more LEDs. In some embodiments, the resistor 532 is removed. For example, the system 500 operates in a quasi-resonant mode.

According to one embodiment, an alternate-current (AC) input voltage 552 is applied to the system 500. For example, a bulk voltage 550 (e.g., a rectified voltage no smaller than 0 V) associated with the AC input voltage 552 is received by the resistor 504. In another example, the capacitor 506 is charged in response to the bulk voltage 550, and a voltage 554 is provided to the controller 502 at the terminal 538 (e.g., terminal VCC). In yet another example, if the voltage 554 is larger than a predetermined threshold voltage in magnitude, the controller 502 begins to operate normally, and outputs a signal through the terminal 542 (e.g., terminal GATE). In yet another example, the switch 528 is closed (e.g., being turned on) or open (e.g., being turned off) in response to a drive signal 556 so that the output current 558 is regulated to be approximately constant.

According to another embodiment, the auxiliary winding 516 charges the capacitor 506 through the diode 508 when the switch 528 is opened (e.g., being turned off) in response to the drive signal 556 so that the controller 502 can operate normally. For example, a feedback signal 560 is provided to the controller 502 through the terminal 540 (e.g., terminal FB) in order to detect the end of a demagnetization process of the secondary winding 514 for charging or discharging the capacitor 534 using an internal error amplifier in the controller 502. In another example, the feedback signal 560 is provided to the controller 502 through the terminal 540 (e.g., terminal FB) in order to detect the beginning and the end of the demagnetization process of the secondary winding 514. As an example, the capacitor 534 is charged or discharged in response to a compensation signal 574 provided at the terminal 548 (e.g., terminal COMP). In another example, the resistor 530 is used for detecting a primary current 562 flowing through the primary winding 512, and a current-sensing signal 564 is provided to the controller 502 through the terminal 544 (e.g., terminal CS) to be processed during each switching cycle. In yet another example, peak magnitudes of the current-sensing signal 564 are sampled and provided to the internal error amplifier. In yet another example, the capacitor 520 is used to maintain an output voltage 568. In some embodiments, the controller 502 includes a ramp-signal generator which generates a ramping signal, and the controller 502 is configured to change the ramping slope of the ramping signal based on at least information associated with the compensation signal 574.

FIG. 6(*b*) is a simplified diagram showing the controller 502 as part of the power conversion system 500 according to an embodiment of the present invention. This diagram is merely an example, which should not unduly limit the scope of the claims. One of ordinary skill in the art would recognize many variations, alternatives, and modifications. The controller 502 includes a ramp-signal generator 702, an under-voltage lock-out (UVLO) component 704, a modulation component 706, a logic controller 708, a driving component 710, a demagnetization detector 712, an error amplifier 716, a current-sensing-and-sample/hold component 714, a jittering-signal generator 799, and a voltage-to-current-conversion component 742.

According to one embodiment, the UVLO component 704 detects the signal 554 and outputs a signal 718. For example, if the signal 554 is larger than a first predetermined threshold in magnitude, the controller 502 begins to operate normally. If the signal 554 is smaller than a second predetermined threshold in magnitude, the controller 502 is turned off. In another example, the second predetermined threshold is smaller than the first predetermined threshold in magnitude. In yet another example, the error amplifier 716 receives a signal 720 from the current-sensing-and-sample/hold component 714 and a reference signal 722 and the compensation signal 574 is provided to the modulation component 706 and the voltage-to-current-conversion component 742. In yet another example, the voltage-to-current-conversion component 742 receives the signal 574 and outputs a signal 738 to the ramp-signal generator 702 which also receives a current signal 794 and a jittering signal 797 (e.g., a jittering current) generated by the jittering-signal generator 799. In yet another example, the jittering current 797 flows from the jittering-signal generator 799 to the ramp-signal generator 702. In yet another example, the jittering current 797 flows from the ramp-signal generator 702 to the jittering-signal generator 799. In yet another example, the modulation component 706 receives a ramping signal 728 from the ramp-signal generator 702 and outputs a modulation signal 726. For example, the signal 728 increases, linearly or non-linearly, to a peak magnitude during each switching period. In another example, the logic controller 708 processes the modulation signal 726 and outputs a control signal 730 to the current-sensing-andsample/hold component 714 and the driving component 710. In yet another example, the driving component 710 generates a signal 756 associated with the drive signal 556 to affect the switch 528. As an example, the demagnetization detector 712 detects the feedback signal 560 and outputs a signal 732 for determining the end of the demagnetization process of the secondary winding 514. As another example, the demagnetization detector 712 detects the feedback signal 560 and outputs the signal 732 for determining the beginning and the end of the demagnetization process of the secondary winding 514. In another example, the demagnetization detector 712 outputs a trigger signal 798 to the logic controller 708 to start a next cycle (e.g., corresponding to a next switching period). In yet another example, when the signal 756 is at a logic high level, the signal 556 is at a logic high level, and when the signal 756 is at a logic low level, the signal 556 is at a logic low level. In yet another example, the ramping slope of the ramping signal 728 is modulated in response to the jittering signal 797.

In some embodiments, the jittering signal 797 corresponds to a deterministic signal, such as a triangle waveform (e.g., with a frequency of several hundred Hz), or a sinusoidal waveform (e.g., with a frequency of several hundred Hz). For example, the jittering signal 797 is associated with multiple jittering cycles corresponding to a predetermined jittering frequency (e.g., approximately constant) related to a predetermined jittering period (e.g., approximately constant). As an example, the signal 756 is associated with multiple modulation cycles corresponding to a modulation frequency (e.g., not constant) related to a modulation period (e.g., not constant). In another example, the system controller 502 changes the ramping slope associated with the ramping signal 728 based on at least information associated with the jittering signal 728 so that, within a same jittering cycle of the multiple jittering cycles, the ramping slope is changed (e.g., increased, or decreased) by different magnitudes corresponding to different modulation cycles respectively. In yet another example, the ramping slope is changed during different modulation cycles adjacent to each other. In yet another example, the ramping slope is changed during different modulation cycles not adjacent to each other. In yet another example, the system controller 502 adjusts the modulation frequency based on at least information associated with the changed ramping slope.

In certain embodiments, the jittering signal 797 corresponds to a random (e.g., pseudo-random) signal with a random (e.g., pseudo-random) waveform. For example, the system controller 502 changes the ramping slope associated with the ramping signal 728 based on at least information associated with the random jittering signal 728 so that the ramping slope is changed by random magnitudes corresponding to different modulation cycles respectively. In yet another example, the ramping slope is changed during different modulation cycles that are adjacent to each other. In yet another example, the ramping slope is changed during different modulation cycles that are not adjacent to each other. In yet another example, the system controller 502 adjusts the modulation frequency based on at least information associated with the ramping slope changed by the random magnitudes.

In some embodiments, the signal 738 represents a current and is used for adjusting the ramping slope associated with the ramping signal 728. For example, information associated with the signal 738 is used for adjusting the ramping slope associated with the ramping signal 728, so as to adjust the duration of an on-time period associated with the drive signal 556. For example, the timing diagram for the controller 502 as part of the system 500 is similar to what is shown in FIG. 4(c). In another example, the current 738 flows from the voltage-to-current-conversion component 742 to the ramp-signal generator 702. In yet another example, the current 738 flows from the ramp-signal generator 702 to the voltage-to-current-conversion component 742.

Figure 7A:
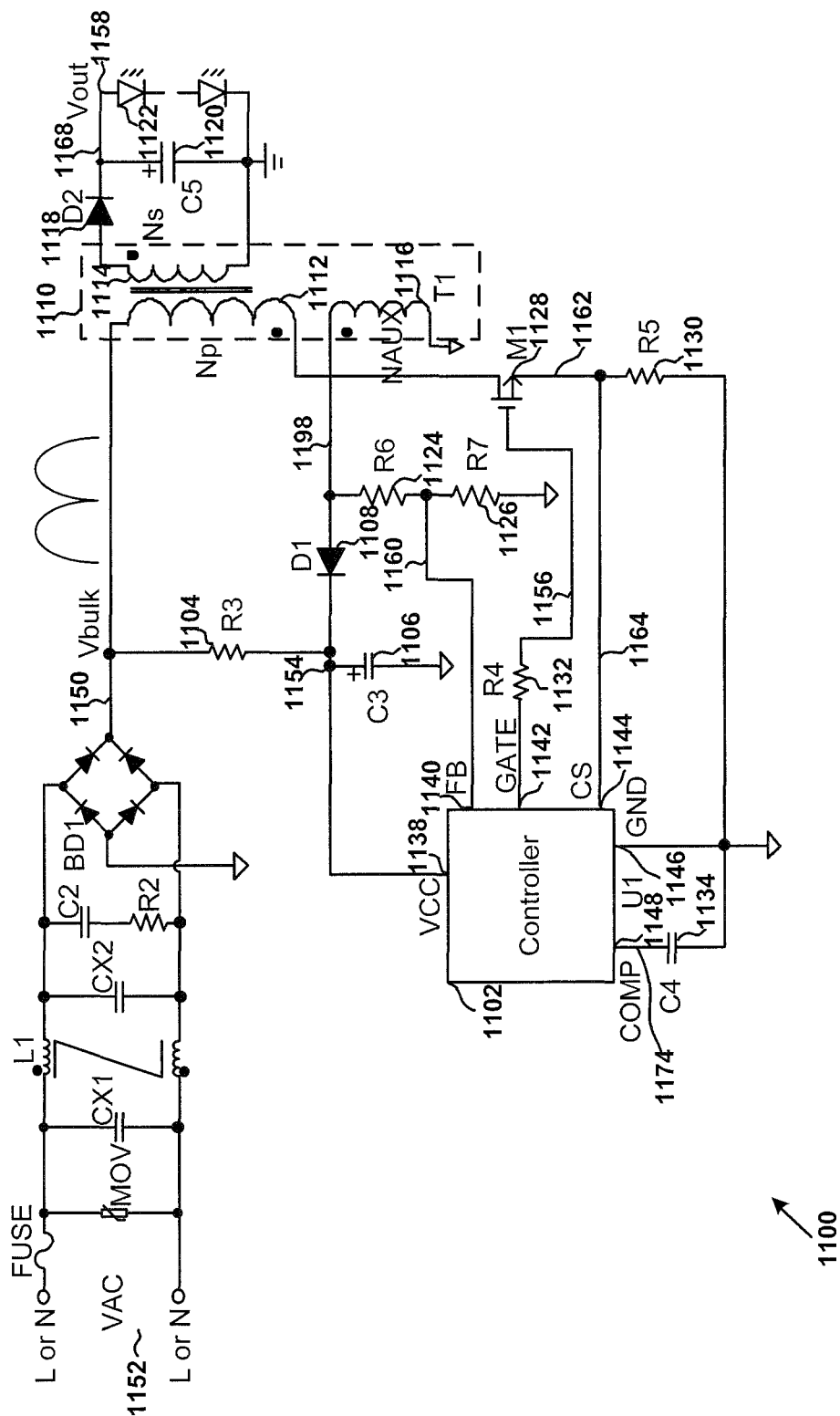
FIG. 7(a) is a simplified diagram showing a power conversion system according to yet another embodiment of the present invention.

FIG. 7(a) is a simplified diagram showing a power conversion system according to yet another embodiment of the present invention. This diagram is merely an example, which should not unduly limit the scope of the claims. One of ordinary skill in the art would recognize many variations, alternatives, and modifications. The system 1100 includes a controller 1102, resistors 1104, 1124, 1126 and 1132, capacitors 1106, 1120 and 1134, a diode 1108, a transformer 1110 including a primary winding 1112, a secondary winding 1114 and an auxiliary winding 1116, a power switch 1128, a current sensing resistor 1130, and a rectifying diode 1118. The controller 1102 includes terminals (e.g., pins) 1138, 1140, 1142, 1144, 1146 and 1148. For example, the power switch 1128 is a bipolar junction transistor. In another example, the power switch 1128 is a MOS transistor. In yet another example, the power switch 1128 includes an insulated-gate bipolar transistor. The system 1100 provides power to an output load 1122, e.g., one or more LEDs. In some embodiments, the resistor 1132 is removed. For example, the system 1100 operates in a quasi-resonant mode.

According to one embodiment, an alternate-current (AC) input voltage 1152 is applied to the system 1100. For example, a bulk voltage 1150 (e.g., a rectified voltage no smaller than 0 V) associated with the AC input voltage 1152 is received by the resistor 1104. In another example, the capacitor 1106 is charged in response to the bulk voltage 1150, and a voltage 1154 is provided to the controller 1102 at the terminal 1138 (e.g., terminal VCC). In yet another example, if the voltage 1154 is larger than a predetermined threshold voltage in magnitude, the controller 1102 begins to operate normally, and outputs a signal through the terminal 1142 (e.g., terminal GATE). In yet another example, the switch 1128 is closed (e.g., being turned on) or open (e.g., being turned off) in response to a drive signal 1156 so that the output current 1158 is regulated to be approximately constant.

According to another embodiment, the auxiliary winding 1116 charges the capacitor 1106 through the diode 1108 when the switch 1128 is opened (e.g., being turned off) in response to the drive signal 1156 so that the controller 1102 can operate normally. For example, a signal 1160 is provided at the terminal 1140 (e.g., terminal FB). In another example, during an on-time period associated with the drive signal 1156, the signal 1198 is related to the bulk voltage 1150 through the transformer's coupling. In yet another example, the bulk voltage 1150 is sensed through the terminal 1140 (e.g., terminal FB). In yet another example, during an off-time period associated with the drive signal 1156, the signal 1160 is related to an output voltage 1168 and is used to detect the end of a demagnetization process of the secondary winding 1114 for charging or discharging the capacitor 1134 using an internal error amplifier in the controller 1102. As an example, the capacitor 1134 is charged or discharged in response to a compensation signal 1174 provided at the terminal 1148 (e.g., terminal COMP). For example, the resistor 1130 is used for detecting a primary current 1162 flowing through the primary winding 1112, and a current-sensing signal 1164 is provided to the controller 1102 through the terminal 1144 (e.g., terminal CS)

to be processed during each switching cycle. In yet another example, peak magnitudes of the current-sensing signal 1164 are sampled and provided to the internal error amplifier. In yet another example, the capacitor 1120 is used to maintain the output voltage 1168. In some embodiments, the controller 1102 includes a ramp-signal generator which generates a ramping signal, and the controller 1102 is configured to change the ramping slope of the ramping signal based on at least information associated with the signal 1160 and the compensation signal 1174.

Figure 7B:
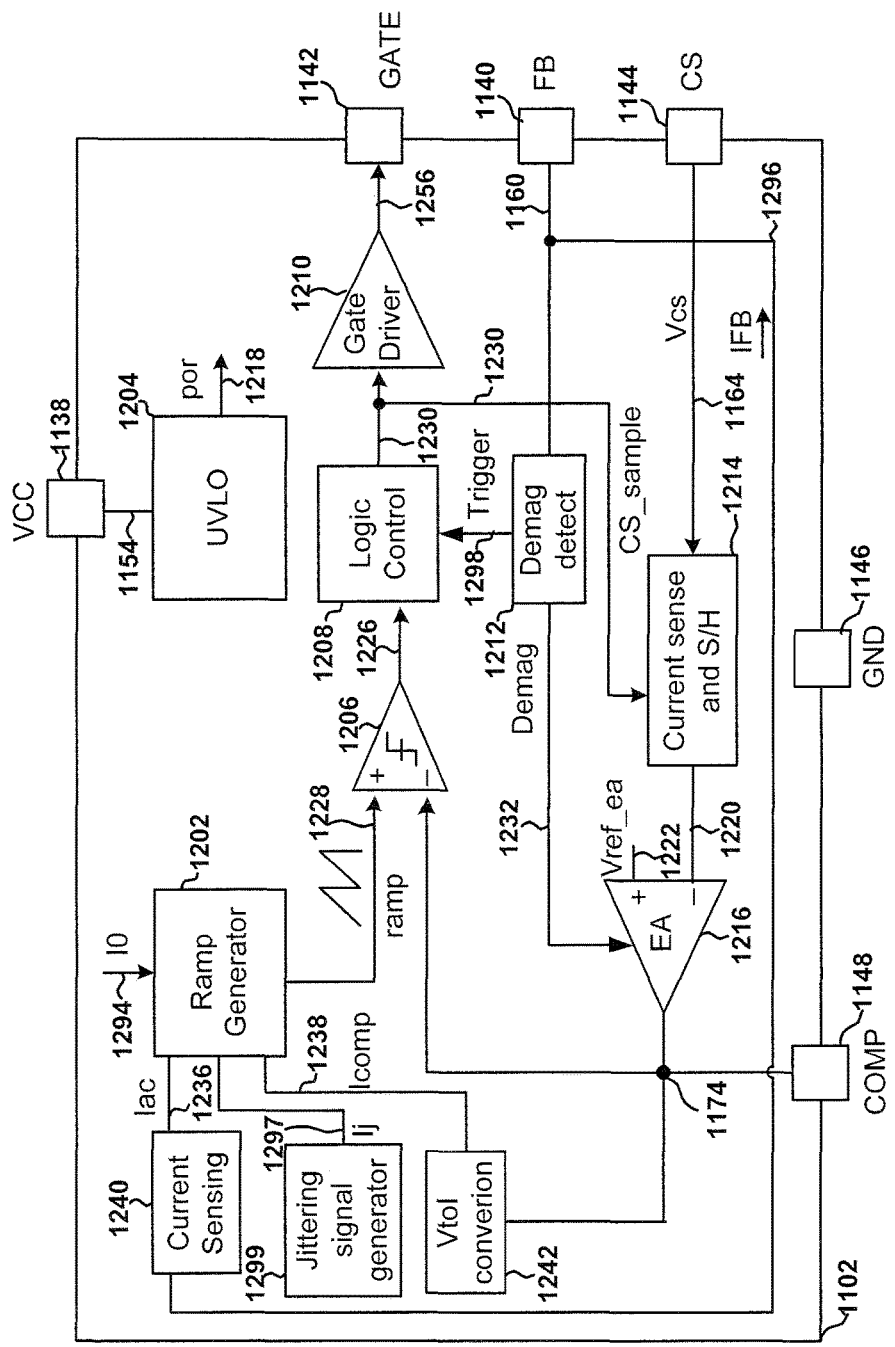
FIG. 7(b) is a simplified diagram showing a controller as part of a power conversion system as shown in FIG. 7(a) according to an embodiment of the present invention.

FIG. 7(b) is a simplified diagram showing the controller 1102 as part of the power conversion system 1100 according to an embodiment of the present invention. This diagram is merely an example, which should not unduly limit the scope of the claims. One of ordinary skill in the art would recognize many variations, alternatives, and modifications. The controller 1102 includes a ramp-signal generator 1202, an under-voltage lock-out (UVLO) component 1204, a modulation component 1206, a logic controller 1208, a driving component 1210, a demagnetization detector 1212, an error amplifier 1216, a current-sensing-and-sample/hold component 1214, another current-sensing component 1240, a jittering-signal generator 1299, and a voltage-to-current-conversion component 1242.

According to one embodiment, the UVLO component 1204 detects the signal 1154 and outputs a signal 1218. For example, if the signal 1154 is larger than a first predetermined threshold in magnitude, the controller 1102 begins to operate normally. If the signal 1154 is smaller than a second predetermined threshold in magnitude, the controller 1102 is turned off. In another example, the first predetermined threshold is larger than the second predetermined threshold in magnitude. In yet another example, the error amplifier 1216 receives a signal 1220 from the current-sensing-and-sample/hold component 1214 and a reference signal 1222 and the compensation signal 1174 is provided to the modulation component 1206 and the voltage-to-current-conversion component 1242. In yet another example, the voltage-to-current-conversion component 1242 receives the signal 1174 and outputs a signal 1238 to the ramp-signal generator 1202 which also receives a current signal 1294 and a jittering signal 1297 (e.g., a jittering current) generated by the jittering-signal generator 1299. In yet another example, the jittering current 1297 flows from the jittering-signal generator 1299 to the ramp-signal generator 1202. In yet another example, the jittering current 1297 flows from the ramp-signal generator 1202 to the jittering-signal generator 1299. In yet another example, the current-sensing component 1240 outputs a signal 1236 to the ramp-signal generator 1202 in response to a current signal 1296 associated with the terminal 1140 (e.g., terminal FB). As an example, the current signal 1296 is related to the bulk voltage 1150 during the on-time period associated with the driving signal 1156. In yet another example, the ramping slope of the ramping signal 1228 is modulated in response to the jittering signal 1297.

In some embodiments, the jittering signal 1297 corresponds to a deterministic signal, such as a triangle waveform (e.g., with a frequency of several hundred Hz), or a sinusoidal waveform (e.g., with a frequency of several hundred Hz). For example, the jittering signal 1297 is associated with multiple jittering cycles corresponding to a predetermined jittering frequency (e.g., approximately constant) related to a predetermined jittering period (e.g., approximately constant). As an example, the signal 1256 is associated with multiple modulation cycles corresponding to a modulation frequency (e.g., not constant) related to a modulation period (e.g., not constant). In another example, the system controller 1102 changes the ramping slope associated with the ramping signal 1228 based on at least information associated with the jittering signal 1228 so that, within a same jittering cycle of the multiple jittering cycles, the ramping slope is changed (e.g., increased, or decreased) by different magnitudes corresponding to different modulation cycles respectively. In yet another example, the ramping slope is changed during different modulation cycles adjacent to each other. In yet another example, the ramping slope is changed during different modulation cycles not adjacent to each other. In yet another example, the system controller 1102 adjusts the modulation frequency based on at least information associated with the changed ramping slope.

In certain embodiments, the jittering signal 1297 corresponds to a random (e.g., pseudo-random) signal with a random (e.g., pseudo-random) waveform. For example, the system controller 1102 changes the ramping slope associated with the ramping signal 1228 based on at least information associated with the random jittering signal 1228 so that the ramping slope is changed by random magnitudes corresponding to different modulation cycles respectively. In yet another example, the ramping slope is changed during different modulation cycles that are adjacent to each other. In yet another example, the ramping slope is changed during different modulation cycles that are not adjacent to each other. In yet another example, the system controller 1102 adjusts the modulation frequency based on at least information associated with the ramping slope changed by the random magnitudes.

According to another embodiment, the modulation component 1206 receives a ramping signal 1228 from the ramp-signal generator 1202 and outputs a modulation signal 1226. For example, the signal 1228 increases, linearly or non-linearly, to a peak magnitude during each switching period. In another example, the logic controller 1208 processes the modulation signal 1226 and outputs a control signal 1230 to the current-sensing-and-sample/hold component 1214 and the driving component 1210. In yet another example, the driving component 1210 generates a signal 1256 associated with the drive signal 1156 to affect the switch 1128. As an example, the demagnetization detector 1212 detects the signal 1160 and outputs a signal 1232 (e.g., during an off-time period associated with the drive signal 1156) for determining the end of the demagnetization process of the secondary winding 1114. As another example, the demagnetization detector 1212 detects the signal 1160 and outputs the signal 1232 (e.g., during the off-time period associated with the drive signal 1156) for determining the beginning and the end of the demagnetization process of the secondary winding 1114. In another example, the demagnetization detector 1212 outputs a trigger signal 1298 to the logic controller 1208 to start a next cycle (e.g., corresponding to a next switching period). In yet another example, when the signal 1256 is at a logic high level, the signal 1156 is at a logic high level, and when the signal 1256 is at a logic low level, the signal 1156 is at a logic low level.

In some embodiments, the signal 1236 represents a current and is used for adjusting a ramping slope associated with the ramping signal 1228. In certain embodiments, the signal 1238 represents a current and is used for adjusting the ramping slope associated with the ramping signal 1228. For example, information associated with both the signal 1236 and the signal 1238 is used for adjusting the ramping slope associated with the ramping signal 1228, so as to adjust the duration of an on-time period associated with the drive signal 1156. In another example, the current 1236 flows from the current-sensing component 1240 to the ramp-signal generator 1202. In yet another example, the current 1236 flows from the ramp-signal generator 1202 to the current-sensing component 1240. In yet another example, the current 1238 flows from the voltage-to-current-conversion component 1242 to the ramp-signal generator 1202. In yet another example, the current 1238 flows from the ramp-signal generator 1202 to the voltage-to-current-conversion component 1242.

Figure 7C:
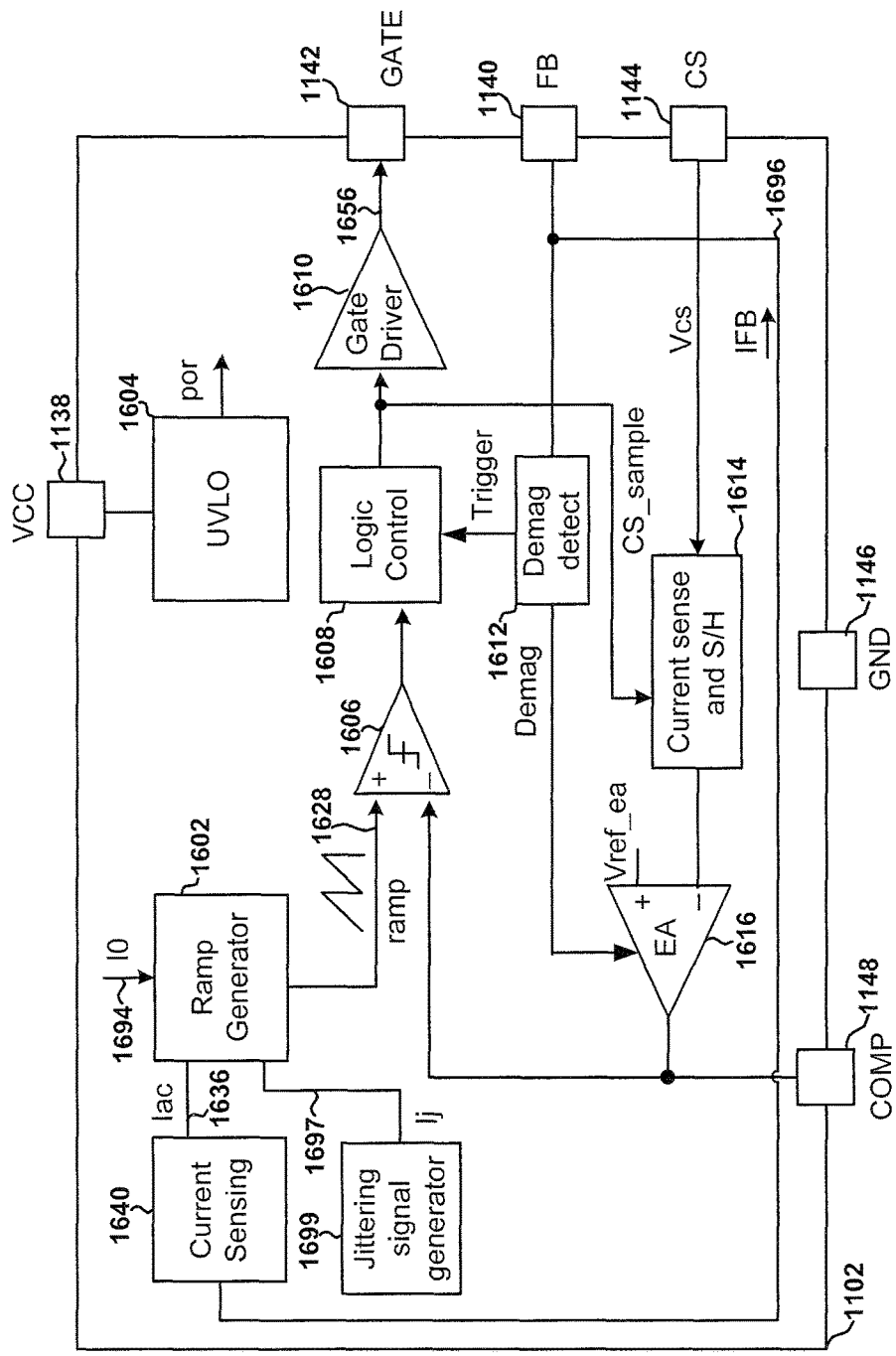
FIG. 7(c) is a simplified diagram showing a controller as part of a power conversion system as shown in FIG. 7(a) according to another embodiment of the present invention.

Referring to FIG. 7(*a*) and FIG. 7(*b*), during an on-time period, a voltage 1198 associated with the auxiliary winding 1116 is determined as follows, in some embodiments:

$$V_{aux} = -\frac{N_{aux}}{N_p} \times V_{bulk} \quad \text{(Equation 7)}$$

where $V_{aux}$ represents the voltage 1198, $N_{aux}/N_p$ represents a turns ratio between the auxiliary winding 1116 and the primary winding 1112, and $V_{bulk}$ represents the bulk voltage 1150. In certain embodiments, when a voltage at the terminal 1140 (e.g., terminal FB) is regulated to be approximately zero, the current signal 1296 is detected by the current-sensing component 1240:

$$I_{FB} = \frac{V_{aux}}{R_6} = \frac{N_{aux}}{N_p \times R_6} \times V_{bulk} \quad \text{(Equation 8)}$$

where $I_{FB}$ represents the current signal 1296 and $R_6$ represents the resistance of the resistor 1124. According to some embodiments, the current signal 1296 indicates a waveform of the bulk voltage 1150 during the on-time period associated with the drive signal 1156, and the signal 1236 is determined as follows:

$$I_{ac} = \delta \times I_{FB} = \delta \times \frac{N_{aux}}{N_p \times R_6} \times V_{bulk} \quad \text{(Equation 9)}$$

where $I_{ac}$ represents the signal 1236 and δ represents a constant.

Similar to what is described above in FIG. 4(*c*), the ramping signal 1228 increases in magnitude during the on-time period, in certain embodiments. For example, the ramping slope of the ramping signal 1228 is modulated based on at least information associated with the signal 1236 generated through detecting the current signal 1296 during the on-time period. For example, the timing diagram for the controller 1102 as part of the system 1100 is similar to what is shown in FIG. 4(*c*).

FIG. 7(*c*) is a simplified diagram showing the controller 1102 as part of the power conversion system 1100 according to another embodiment of the present invention. This diagram is merely an example, which should not unduly limit the scope of the claims. One of ordinary skill in the art would recognize many variations, alternatives, and modifications. The controller 1102 includes a ramp-signal generator 1602, an under-voltage lock-out (UVLO) component 1604, a modulation component 1606, a logic controller 1608, a driving component 1610, a demagnetization detector 1612, an error amplifier 1616, a current-sensing component 1614, a jittering-signal generator 1699, and another current-sensing component 1640.

In some embodiments, the ramp-signal generator 1602 receives a current signal 1694, a jittering signal 1697 (e.g., a jittering current) generated by the jittering-signal generator 1699, and a signal 1636 from the current-sensing component 1640 and outputs a ramping signal 1628. In yet another example, the jittering current 1697 flows from the jittering-signal generator 1699 to the ramp-signal generator 1602. In yet another example, the jittering current 1697 flows from the ramp-signal generator 1602 to the jittering-signal generator 1699. For example, a ramping slope associated with the ramping signal 1628 is adjusted based on at least information associated with the signal 1636 that is related to a current signal 1696 detected at the terminal 1140 (e.g., terminal FB) during an on-time period associated with the driving signal 1156. The operations of other components in FIG. 7(*c*) are similar to what are described in FIG. 7(*b*). As an example, the signal 1636 represents a current. In another example, the current 1636 flows from the current-sensing component 1640 to the ramp-signal generator 1602. In yet another example, the current 1636 flows from the ramp-signal generator 1602 to the current-sensing component 1640. In yet another example, the ramping slope of the ramping signal 1628 is modulated in response to the jittering signal 1697.

In some embodiments, the jittering signal 1697 corresponds to a deterministic signal, such as a triangle waveform (e.g., with a frequency of several hundred Hz), or a sinusoidal waveform (e.g., with a frequency of several hundred Hz). For example, the jittering signal 1697 is associated with multiple jittering cycles corresponding to a predetermined jittering frequency (e.g., approximately constant) related to a predetermined jittering period (e.g., approximately constant). As an example, the signal 1656 is associated with multiple modulation cycles corresponding to a modulation frequency (e.g., not constant) related to a modulation period (e.g., not constant). In another example, the system controller 1102 changes the ramping slope associated with the ramping signal 1628 based on at least information associated with the jittering signal 1628 so that, within a same jittering cycle of the multiple jittering cycles, the ramping slope is changed (e.g., increased, or decreased) by different magnitudes corresponding to different modulation cycles respectively. In yet another example, the ramping slope is changed during different modulation cycles adjacent to each other. In yet another example, the ramping slope is changed during different modulation cycles not adjacent to each other. In yet another example, the system controller 1102 adjusts the modulation frequency based on at least information associated with the changed ramping slope.

In certain embodiments, the jittering signal 1697 corresponds to a random (e.g., pseudo-random) signal with a random (e.g., pseudo-random) waveform. For example, the system controller 1102 changes the ramping slope associated with the ramping signal 1628 based on at least information associated with the random jittering signal 1628 so that the ramping slope is changed by random magnitudes corresponding to different modulation cycles respectively. In yet another example, the ramping slope is changed during different modulation cycles that are adjacent to each other. In yet another example, the ramping slope is changed during different modulation cycles that are not adjacent to each other. In yet another example, the system controller 1102 adjusts the modulation frequency based on at least information associated with the ramping slope changed by the random magnitudes.

Figure 8A:
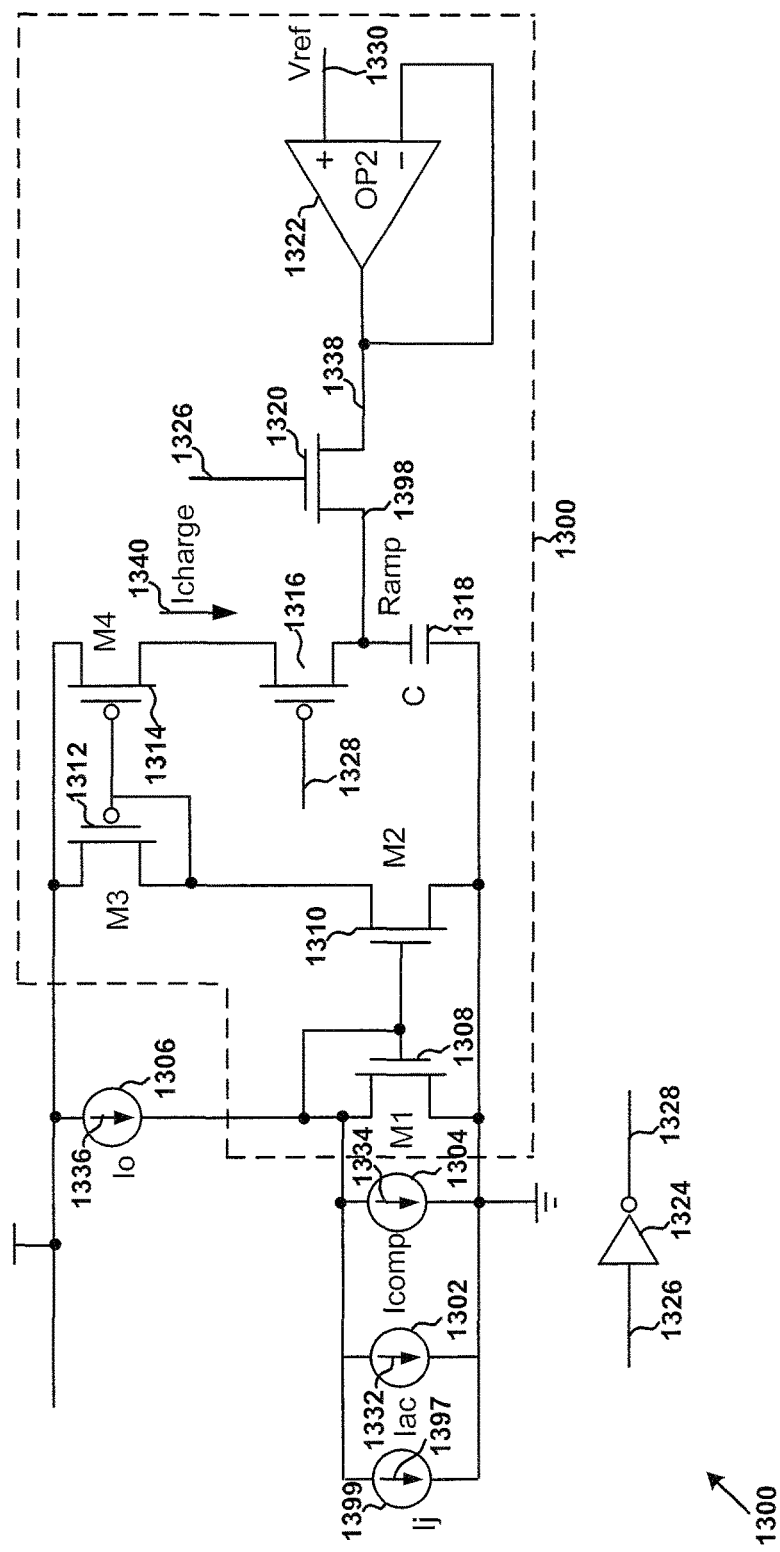
FIG. 8(a) is a simplified diagram showing certain components as part of a controller as shown in FIG. 4(b), a controller as shown in FIG. 5(b), and/or a controller as shown in FIG. 7(b) according to some embodiments of the present invention.
Figure 8B:
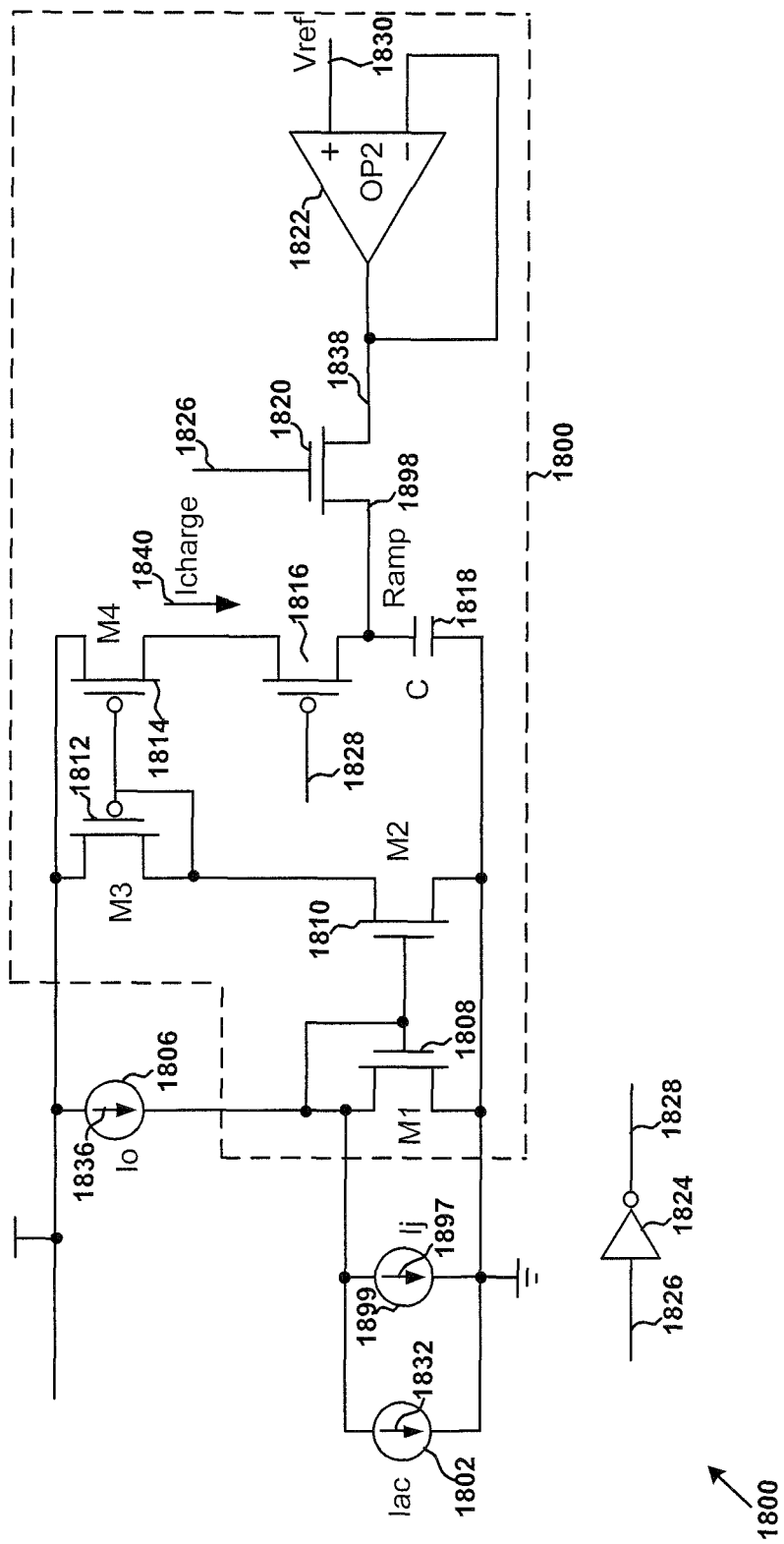
FIG. 8(b) is a simplified diagram showing certain components as part of a controller as shown in FIG. 4(d), a controller as shown in FIG. 5(c), and/or a controller as shown in FIG. 7(c) according to certain embodiments of the present invention.
Figure 8C:
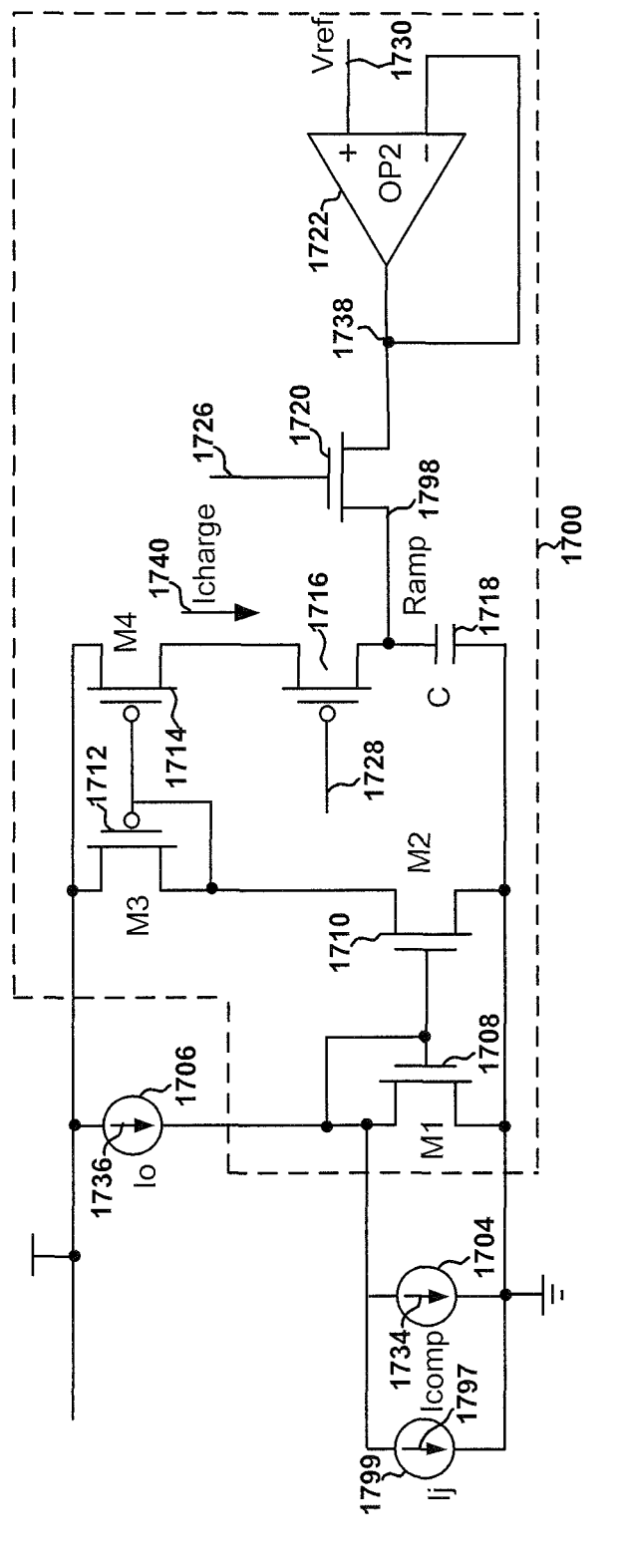
FIG. 8(c) is a simplified diagram showing certain components as part of a controller as shown in FIG. 6(b) according to another embodiment of the present invention.

FIG. 8(*a*) is a simplified diagram showing certain components as part of the controller 402 as shown in FIG. 4(*b*), the controller 802 as shown in FIG. 5(*b*), and/or the controller 1102 as shown in FIG. 7(*b*) according to some embodiments of the present invention. This diagram is merely an example, which should not unduly limit the scope of the claims. One of ordinary skill in the art would recognize many variations, alternatives, and modifications. A ramp-signal generator 1300 includes transistors 1308, 1310, 1312, 1314, 1316 and 1320, an amplifier 1322, and a NOT gate 1324. In addition, current-source components 1302, 1304, 1306 and 1399 are included in the controller 402 as shown in FIG. 4(*b*), the controller 802 as shown in FIG. 5(*b*), and/or the controller 1102 as shown in FIG. 7(*b*).

According to one embodiment, the current-source components 1302, 1304, 1306 and 1399 are related to currents 1332, 1334, 1336 and 1397 respectively. For example, a current-mirror circuit including the transistors 1308, 1310, 1312 and 1314 is configured to generate a charging current 1340 (e.g., $I_{charge}$) that flows through the transistor 1316 which is controlled by a signal 1328. In another example, the amplifier 1322 receives a reference signal 1330 and outputs an amplified signal 1338. In yet another example, the capacitor 1318 is charged or discharged to generate a ramping signal 1398 as the output signal of the ramp-signal generator 1300.

In some embodiments, the ramp-signal generator 1300 is the same as the ramp-signal generator 602, the ramp-signal generator 1002, or the ramp-signal generator 1202. For example, the current 1332 is the same as the current 636 that flows between the ramp-signal generator 602 and the voltage-to-current-conversion component 640, the current 1036 that flows between the ramp-signal generator 1002 and the current-sensing component 1040, or the current 1236 that flows between the ramp-signal generator 1202 and the current-sensing component 1240. In another example, the current 1334 is the same as the current 638 that flows between the ramp-signal generator 602 and the voltage-to-current-conversion component 642, the current 1038 that flows between the ramp-signal generator 1002 and the voltage-to-current-conversion component 1042, or the current 1238 that flows between the ramp-signal generator 1202 and the voltage-to-current-conversion component 1242. In yet another example, the current 1336 is the same as the current 694, the current 1094, or the current 1294. In yet another example, the current 1397 is the same as the jittering current 697, the jittering current 1097, or the jittering current 1297. In yet another example, the ramping signal 1398 is the same as the ramping signal 628, the ramping signal 1028, or the ramping signal 1228. In yet another example, the current-source component 1302 is included in the voltage-to-current-conversion component 640, the current-sensing component 1040, or the current-sensing component 1240. In yet another example, the current-source component 1304 is included in the voltage-to-current-conversion component 642, the voltage-to-current-conversion component 1042, or the voltage-to-current-conversion component 1242. In yet another example, the current-source component 1399 is included in the jittering-signal generator 699, the jittering-signal generator 1099, or the jittering-signal generator 1299.

In certain embodiments, the ramping slope of the ramping signal 1398 is determined as follows:

$$\text{slope} = f(I_0, I_{ac}, I_{comp}, I_j) \quad \text{(Equation 10)}$$

For example, specifically, the ramping slope of the ramping signal 1398 is determined as follows:

$$\text{slope} \propto (\alpha \times I_0 - \beta \times I_{ac} - \delta \times I_{comp} - \gamma \times I_j) \quad \text{(Equation 11A)}$$

where $I_0$ represents the signal 1336, $I_{ac}$ represents the signal 1332, and $I_{comp}$ represents the signal 1334. In addition, α, β, δ, and γ represent coefficients (e.g., larger than 0). In another example, the ramping slope of the ramping signal 1398 is determined as follows:

$$\text{slope} \propto (\alpha \times I_0 - \beta \times I_{ac} - \delta \times I_{comp} + \gamma \times I_j) \quad \text{(Equation 11B)}$$

In yet another example, the signal 1332 and the signal 1334 are determined as follows:

$$I_{ac} = f1(V_{bulk})$$

$$I_{comp} = f2(V_{bulk}) \quad \text{(Equation 12)}$$

where f1 and f2 represent non-linear or linear operators. As an example, $$I_{ac} = \gamma \times (V_{bulk} - V_{th2}), I_{ac} = 0 \text{ when } V_{bulk} \leq V_{th2}$$

$$I_{comp} = \eta \times (V_{comp} - V_{th1}), I_{comp} = 0 \text{ when } V_{bulk} \leq V_{th1} \quad \text{(Equation 13)}$$

where γ and η represent coefficients (e.g., larger than 0), $V_{th1}$ and $V_{th2}$ represent predetermined thresholds.

In one embodiment, if a ratio related to the transistors 1308 and 1310 is K and another ratio related to the transistors 1312 and 1314 is M, the charging current 1340 is determined as follows:

$$I_{charge} = K \times M \times (I_0 - I_{ac} - I_{comp} - I_j) \quad \text{(Equation 14)}$$

For example, a ramping slope associated with the ramping signal 1398 is determined as follows:

$$\text{slope} = \frac{I_{charge}}{C} \quad \text{(Equation 15)}$$

where $I_{charge}$ represents the charging current 1340, and C represents the capacitance of the capacitor 1318. In certain embodiments, for a given $I_0$ and $I_{comp}$, the ramping slope of the ramping signal 1398 decreases in magnitude and in turn the duration of an on-time period increases when a bulk voltage increases in magnitude. In yet another example, $I_{charge}$ is also determined as follows:

$$I_{charge} = K \times M \times (I_0 - I_{ac} - I_{comp} - I_j) \quad \text{(Equation 16)}$$

FIG. 8(*b*) is a simplified diagram showing certain components as part of the controller 402 as shown in FIG. 4(*d*), the controller 802 as shown in FIG. 5(*c*), and/or the controller 1102 as shown in FIG. 7(*c*) according to certain embodiments of the present invention. This diagram is merely an example, which should not unduly limit the scope of the claims. One of ordinary skill in the art would recognize many variations, alternatives, and modifications. A ramp-signal generator 1800 includes transistors 1808, 1810, 1812, 1814, 1816 and 1820, an amplifier 1822, and a NOT gate 1824. In addition, current-source components 1802, 1806 and 1899 are included in the controller 402 as shown in FIG. 4(*d*), the controller 802 as shown in FIG. 5(*c*), and/or the controller 1102 as shown in FIG. 7(*c*).

According to one embodiment, the current-source components 1802, 1806 and 1899 are related to currents 1832, 1836 and 1897 respectively. For example, a current-mirror circuit including the transistors 1808, 1810, 1812 and 1814 is configured to generate a charging current 1840 (e.g., $I_{charge}$) that flows through the transistor 1816 which is controlled by a signal 1828. In another example, the amplifier 1822 receives a reference signal 1830 and outputs an amplified signal 1838. In yet another example, the capacitor 1818 is charged or discharged to generate a ramping signal 1898 as the output signal of the ramp-signal generator 1800.

In some embodiments, the ramp-signal generator 1800 is the same as the ramp-signal generator 1402. For example, the current 1832 is the same as the current 1436 that flows between the ramp-signal generator 1402 and the voltage-to-current-conversion component 1440, the current 1536 that flows between the ramp-signal generator 1502 and the current-sensing component 1540, or the current 1636 that flows between the ramp-signal generator 1602 and the current-sensing component 1640. In another example, the current 1836 is the same as the current 1494, the current 1594, or the current 1694. In yet another example, the current 1897 is the same as the current 1497, the current 1597, or the current 1697. In yet another example, the ramping signal 1898 is the same as the ramping signal 1428, the ramping signal 1528, or the ramping signal 1628. In yet another example, the current-source component 1802 is included in the voltage-to-current-conversion component 1440, the current-sensing component 1540, or the current-sensing component 1640. In yet another example, the current-source component 1899 is included in the jittering-signal generator 1499, the jittering-signal generator 1599, or the jittering-signal generator 1699.

FIG. 8(*c*) is a simplified diagram showing certain embodiments as part of the controller 502 according to another embodiment of the present invention. This diagram is merely an example, which should not unduly limit the scope of the claims. One of ordinary skill in the art would recognize many variations, alternatives, and modifications. A ramp-signal generator 1700 includes transistors 1708, 1710, 1712, 1714, 1716 and 1720, an amplifier 1722, and a NOT gate 1724. In addition, current-source components 1704, 1706 and 1799 are included in the controller 502.

According to one embodiment, the current-source components 1704, 1706 and 1799 are related to currents 1734, 1736 and 1797 respectively. For example, a current-mirror circuit including the transistors 1708, 1710, 1712 and 1714 is configured to generate a charging current 1740 (e.g., $I_{charge}$) that flows through the transistor 1716 which is controlled by a signal 1728. In another example, the amplifier 1722 receives a reference signal 1730 and outputs an amplified signal 1738. In yet another example, the capacitor 1718 is charged or discharged to generate a ramping signal 1798 as the output signal of the ramp-signal generator 1700.

In some embodiments, the ramp-signal generator 1700 is the same as the ramp-signal generator 502. For example, the current 1734 is the current 738 that flows from the ramp-signal generator 702 to the voltage-to-current-conversion component 742. In yet another example, the current 1736 is the same as the current 794. In yet another example, the current 1797 is the same as the current 797. In yet another example, the ramping signal 1798 is the same as the ramping signal 728. In yet another example, the current-source component 1704 is included in the voltage-to-current-conversion component 742. In yet another example, the current-source component 1799 is included in the jittering-signal generator 799.

Figure 9:
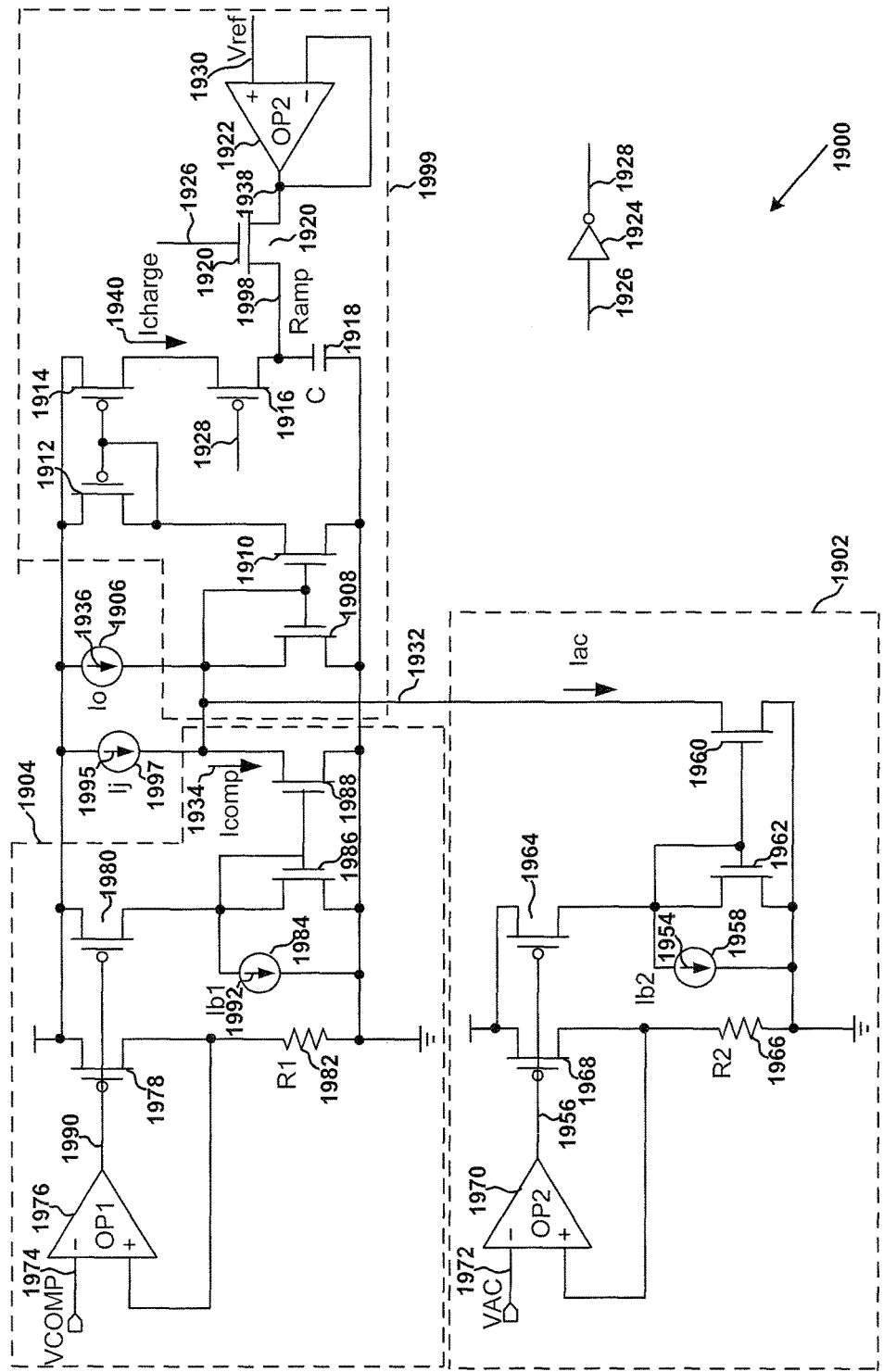
FIG. 9 is a simplified diagram showing certain components of a controller according to yet another embodiment of the present invention.

FIG. 9 is a simplified diagram showing certain components of a controller according to yet another embodiment of the present invention. This diagram is merely an example, which should not unduly limit the scope of the claims. One of ordinary skill in the art would recognize many variations, alternatives, and modifications. The controller 1900 includes voltage-to-current-conversion components 1902 and 1904, current-source components 1906 and 1997, and a ramp-signal generator 1999. The ramp-signal generator 1999 includes transistors 1908, 1910, 1912, 1914, 1916 and 1920, an amplifier 1922, and a NOT gate 1924. The voltage-to-current-conversion component 1902 includes an operational amplifier 1970, a current-source component 1958, transistors 1960, 1962, 1964 and 1968, and a resistor 1966. The voltage-to-current-conversion component 1904 includes an operational amplifier 1976, a current-source component 1984, transistors 1978, 1980, 1986 and 1988, and a resistor 1982.

According to one embodiment, the voltage-to-current-conversion components 1902 and 1904, the current-source component 1906, and the current-source component 1997 are related to currents 1932, 1934, 1936 and 1995 respectively. For example, a current-mirror circuit including the transistors 1908, 1910, 1912 and 1914 is configured to generate a charging current 1940 (e.g., $I_{charge}$) that flows through the transistor 1916 which is controlled by a signal 1928. In another example, the amplifier 1922 receives a reference signal 1930 and outputs an amplified signal 1938. In yet another example, the capacitor 1918 is charged or discharged to generate a ramping signal 1998 as the output signal of the ramp-signal generator 1999.

According to another embodiment, the operational amplifier 1976 receives a compensation signal 1974 and outputs a signal 1990 which is received by a current-mirror circuit including the transistors 1978, 1980, 1986 and 1988 to generate the current 1934. For example, the operational amplifier 1970 receives a signal 1972 and outputs a signal 1956 which is received by a current-mirror circuit including transistors 1968, 1964, 1962 and 1960 to generate the current 1932.

In some embodiments, the controller 1900 is the same as the controller 402. For example, the ramp-signal generator 1999 is the same as the ramp-signal generator 602. As an example, the current 1932 is the same as the current 636 that flows between the ramp-signal generator 602 and the voltage-to-current-conversion component 640. In another example, the current 1934 is the same as the current 638 that flows between the ramp-signal generator 602 and the voltage-to-current-conversion component 642. In yet another example, the current 1936 is the same as the current 694. In yet another example, the current 1995 is the same as the jittering current 697. In yet another example, the ramping signal 1998 is the same as the ramping signal 628. In yet another example, the compensation signal 1974 is related to the compensation signal 474, and the signal 1972 is related to the signal 472. In yet another example, the voltage-to-current-conversion component 1902 is the same as the voltage-to-current-conversion component 640. In yet another example, the voltage-to-current-conversion component 1904 is the same as the voltage-to-current-conversion component 642. In yet another example, the current-source component 1997 is included in the jittering-signal generator 699.

According to another embodiment, based on Equation 12 and Equation 13, a current 1992 (e.g., $I_{b1}$) related to the current-source component 1984 is associated with $\eta \times V_{th1}$, and a current 1954 (e.g., $I_{b2}$) related to the current-source component 1958 is associated with $\gamma \times V_{th2}$. For example, the ramping signal 1998 increases, linearly or non-linearly, to a peak magnitude during each switching period of the power conversion system. In another example, a ramping slope associated with the ramping signal 1998 is determined as follows:

$$\text{slope} = \frac{I_{charge}}{C} \qquad \text{(Equation 16)}$$

where $I_{charge}$ represents the charging current 1940, and C represents the capacitance of the capacitor 1918. In yet another example, an on-time period associated with a drive signal related to a power switch is determined as follows:

$$T_{on} = \frac{V_{comp} - V_{ref}}{I_{charge}} \times C \qquad \text{(Equation 17)}$$

where $V_{comp}$ represents the signal 1974, $V_{ref}$ represents the signal 1930, $I_{charge}$ represents the charging current 1940, and C represents the capacitance of the capacitor 1918.

As discussed above and further emphasized here, FIG. 9 is merely an example, which should not unduly limit the scope of the claims. One of ordinary skill in the art would recognize many variations, alternatives, and modifications. For example, the current-source component 1904 is removed from the controller 1900, and the ramp-signal generator 1999 is then the same as the ramp-signal generator 1800. In another example, the current-source component 1902 is removed from the controller 1900, and the ramp-signal generator 1999 is then the same as the ramp-signal generator 1700.

As discussed above and further emphasized here, FIG. 4(*a*), FIG. 4(*b*), FIG. 4(*c*), and/or FIG. 4(*d*) are merely examples, which should not unduly limit the scope of the claims. One of ordinary skill in the art would recognize many variations, alternatives, and modifications. For example, to achieve high efficiency (e.g., >90%), the system 400 operates in a quasi-resonant (QR) mode. As an example, the controller 402 is implemented to change the duration of an on-time period (e.g., $T_{on}$) with the bulk voltage 450 (e.g., associated with a rectified sine waveform) to improve the total harmonic distortion, e.g., as shown in FIG. 10(*a*), FIG. 10(*b*), and/or FIG. 10(*c*).

FIG. 10(*a*) is a simplified diagram showing the controller 402 as part of the power conversion system 400 according to yet another embodiment of the present invention. This diagram is merely an example, which should not unduly limit the scope of the claims. One of ordinary skill in the art would recognize many variations, alternatives, and modifications. The controller 402 includes a ramp-signal generator 2602, a UVLO component 2604, a modulation component 2606, a logic controller 2608, a driving component 2610, a demagnetization detector 2612, an error amplifier 2616, a current-sensing-and-sample/hold component 2614, a total-harmonic-distortion (THD) optimizer 2699, a conversion component 2640, and a voltage-to-current-conversion component 2642.

According to one embodiment, the UVLO component 2604 detects the signal 454 and outputs a signal 2618 (e.g., por). For example, if the signal 454 is larger than a first predetermined threshold in magnitude, the controller 402 begins to operate normally. If the signal 454 is smaller than a second predetermined threshold in magnitude, the controller 402 is turned off. In another example, the second predetermined threshold is smaller than the first predetermined threshold in magnitude. As another example, the conversion component 2640 receives the signal 472 at the terminal 464 (e.g., terminal VAC) and outputs a signal 2636 to the THD optimizer 2699. In yet another example, the THD optimizer 2699 also receives the compensation signal 474 at the terminal 448 (e.g., terminal COMP) and outputs a signal 2697 (e.g., $V_{comp\_int}$). In yet another example, the THD optimizer 2699 transforms the compensation signal 474 to the signal 2697 (e.g., $V_{comp\_int}$) based at least in part on the signal 2636 associated with the signal 472. In yet another example, the capacitor 434 is coupled to the terminal 448 (e.g., terminal COMP) and forms, together with the error amplifier 2616, an integrator or a low-pass filter. In yet another example, the error amplifier 2616 is a transconductance amplifier and outputs a current which is proportional to a difference between the reference signal 2622 and the signal 2620. In yet another example, the error amplifier 2616 together with the capacitor 434 generates the compensation signal 474 which is a voltage signal. As an example, the signal 2636 includes one or more current signals. As another example, the signal 2636 includes one or more voltage signals.

According to another embodiment, the error amplifier 2616 receives a signal 2620 from the current-sensing-and-sample/hold component 2614 and a reference signal 2622, and the compensation signal 474 is provided to the voltage-to-current-conversion component 2642 which outputs a current 2638 (e.g., $I_{comp}$) to the ramp-signal generator 2602. For example, the current-sensing-and-sample/hold component 2614 samples the current sensing signal 496 in response to the control signal 2630 and then holds the sampled signal until the current-sensing-and-sample/hold component 2614 samples again the current sensing signal 496. As an example, the ramp-signal generator 2602 also receives a current signal 2694 (e.g., $I_0$) and generates a ramping signal 2628 to the modulation component 2606 (e.g., a comparator) which also receives the signal 2697 (e.g., $V_{comp\_int}$) from the THD optimizer 2699. As an example, the ramping signal 2628 increases, linearly or non-linearly, to a peak magnitude during each switching period. As another example, the ramping slope of the ramping signal 2628 varies based at least in part on the compensation signal 474. In yet another example, the current 2638 (e.g., $I_{comp}$) flows from the voltage-to-current-conversion component 2642 to the ramp-signal generator 2602. In yet another example, the current 2638 (e.g., $I_{comp}$) flows from the ramp-signal generator 2602 to the voltage-to-current-conversion component 2642.

According to yet another embodiment, the modulation component 2606 outputs a modulation signal 2626. For example, the logic controller 2608 processes the modulation signal 2626 and outputs a control signal 2630 to the current-sensing-and-sample/hold component 2614 and the driving component 2610. In another example, the driving component 2610 generates a signal 2656 related to the drive signal 456 to affect the switch 428. In yet another example, if the signal 2656 is at the logic high level, the signal 456 is at the logic high level, and if the signal 2656 is at the logic low level, the signal 456 is at the logic low level.

In one embodiment, the demagnetization detector 2612 detects the feedback signal 460 and outputs a demagnetization signal 2632 for determining the end of the demagnetization process of the secondary winding 414. As another example, the demagnetization detector 2612 detects the feedback signal 460 and outputs the demagnetization signal 2632 for determining the beginning and the end of the demagnetization process of the secondary winding 414. In yet another example, the demagnetization detector 2612 outputs a trigger signal 2698 to the logic controller 2608 to start a next cycle (e.g., corresponding to a next switching period).

In another embodiment, the system controller 402 changes the duration of the on-time period during which the power switch 428 is kept closed (e.g., being turned on) by different magnitudes corresponding to different switching periods of the power switch 428 respectively, based on at least information associated with the signal 472. For example, the duration of the on-time period associated with the power switch 428 is changed during different switching periods of the power switch 428 adjacent to each other. In another example, the duration of the on-time period associated with the power switch 428 is changed during different switching periods of the power switch 428 not adjacent to each other.

FIG. 10(*b*) is a simplified timing diagram for the controller 402 as part of the power conversion system 400 according to another embodiment of the present invention. This diagram is merely an example, which should not unduly limit the scope of the claims. One of ordinary skill in the art would recognize many variations, alternatives, and modifications. The waveform 2902 represents the signal 2626 as a function of time, the waveform 2904 represents the signal 2656 as a function of time, the wave form 2906 represents the demagnetization signal 2632 as a function of time, the waveform 2908 represents the trigger signal 2698 as a function of time, and the waveform 2910 represents the ramping signal 2628 as a function of time.

An on-time period and an off-time period associated with the signal 2656 are shown in FIG. 10(*b*). The on-time period begins at a time $t_{13}$ and ends at a time $t_{15}$, and the off-time period begins at the time $t_{15}$ and ends at a time $t_{18}$. For example, $t_{10} \leq t_{11} \leq t_{12} \leq t_{13} \leq t_{14} \leq t_{15} \leq t_{16} \leq t_{17} \leq t_{18}$.

According to one embodiment, at $t_{10}$, the demagnetization signal 2632 changes from the logic low level to the logic high level. For example, the demagnetization detector 2612 generates a pulse (e.g., between $t_{10}$ and $t_{12}$) in the trigger signal 2698 to trigger a new cycle. As an example, the ramping signal 2628 begins to increases from a magnitude 2912 to a magnitude 2914 (e.g., at $t_{14}$). In another example, at $t_{11}$, the signal 2626 changes from the logic low level to the logic high level. After a short delay, the signal 2656 changes (e.g., at $t_{13}$) from the logic low level to the logic high level, and in response the switch 428 is turned on. In yet another example, at $t_{14}$, the signal 2626 changes from the logic high level to the logic low level, and the ramping signal 2628 decreases from the magnitude 2914 to the magnitude 2912. After a short delay, the signal 2656 changes (e.g., at $t_{15}$) from the logic high level to the logic low level, and in response, the switch 428 is turned off. As an example, at $t_{16}$, the demagnetization signal 2632 changes from the logic low level to the logic high level which indicates a beginning of a demagnetization process. In another example, at $t_{17}$, the demagnetization signal 2632 changes from the logic high level to the logic low level which indicates an end of the demagnetization process. In yet another example, the demagnetization detector 2612 generates another pulse in the trigger signal 2698 to start a next cycle. In yet another example, the magnitude 2914 of the ramping signal 2628 is associated with the magnitude of the signal 474.

According to another embodiment, the magnitude change of the ramping signal 2628 during the on-time period is determined as follows:

$$\Delta V_{ramp} = V_{comp\_int} - V_{ref} = \text{slope} \times T_{on} \quad \text{(Equation 18)}$$

where $\Delta V_{ramp}$ represents the magnitude changes of the ramping signal 2628, $V_{comp\_int}$ represents the signal 2697, $V_{ref}$ represents a predetermined voltage magnitude, slope represents a ramping slope associated with the ramping signal 2628, and $T_{on}$ represents the duration of the on-time period. For example, $V_{ref}$ corresponds to a minimum magnitude of the ramping signal 2628. As an example, based on Equation 18, the duration of the on-time period is determined as follows:

$$T_{on} = \frac{V_{comp\_int} - V_{ref}}{\text{slope}} \quad \text{(Equation 19)}$$

According to yet another embodiment, the signal 2697 (e.g., $V_{comp\_int}$) is determined as follows:

$$V_{comp\_int} = V_{comp} + \alpha \times V_{bulk} \quad \text{(Equation 20)}$$

where $V_{comp}$ represents the compensation signal 474, $V_{bulk}$ represents the bulk voltage 450, and $\alpha$ represents a coefficient parameter. Combining Equations 19 and 20, for example, the duration of the on-time period is determined as follows:

$$T_{on} = \frac{V_{comp} + \alpha \times V_{bulk} - V_{ref}}{\text{slope}} \quad \text{(Equation 21)}$$

Combining Equations 3 and 21, as an example, the duration of the on-time period is determined as follows:

$$T_{on} = \frac{V_{comp} + \alpha \times |A \sin(\omega t + \varphi)| - V_{ref}}{\text{slope}} \quad \text{(Equation 22)}$$

As shown in Equations 21 and 22, the duration of the on-time period is not constant, and varies with the bulk voltage 450 associated with the AC input signal 452, according to some embodiments. For example, changing the duration of the on-time period with the bulk voltage 450 is applicable to power conversion systems with a buck-boost topology operated in a quasi-resonant (QR) mode. In another example, a slope of the waveform 2910 between $t_{11}$ and $t_{14}$ corresponds to the ramping slope of the ramping signal 2628. In yet another example, changing the duration of the on-time period with the bulk voltage 450 is applicable to power conversion systems with a flyback topology operated in a quasi-resonant (QR) mode.

FIG. 10(*c*) is a simplified diagram showing certain components of the controller 402 as part of the system 400 according to another embodiment of the present invention. This diagram is merely an example, which should not unduly limit the scope of the claims. One of ordinary skill in the art would recognize many variations, alternatives, and modifications.

For example, the voltage-to-current-conversion component 2642 includes an operational amplifier 3976, a current-source component 3984, transistors 3978, 3980, 3986 and 3988, and a resistor 3982. The ramp-signal generator 2602 includes transistors 3908, 3910, 3912, 3914, 3916 and 3920, an amplifier 3922, and an NOT gate 3924. The conversion component 2640 includes an operational amplifier 3970, a current-source component 3958, transistors 3995, 3997, 3932, 3960, 3962, 3964 and 3968, and a resistor 3966. The THD optimizer 2699 includes an operational amplifier 3936, and resistors 3944 and 3946. The controller 402 further includes a current-source component 3906 which provides the current signal 2694 (e.g., $I_0$). As an example, the transistors 3908, 3910, 3920, 3986, 3988, 3962, 3960 and 3932 are N-channel transistors, and the transistors 3978, 3980, 3912, 3914, 3916, 3968, 3964, 3995 and 3997 are P-channel transistors.

According to one embodiment, the amplifier 3922 receives a reference signal 3930 (e.g., $V_{ref}$) at its non-inverting terminal (e.g., terminal "+") and outputs an amplified signal 3938, where the inverting terminal (e.g., terminal "−") and the output terminal of the amplifier 3922 are connected together. For example, the signal 3928 (e.g., PWM_N) is generated by the NOT gate 3924 and is complementary to the modulation signal 2626 (e.g., PWM). As an example, if the modulation signal 2626 (e.g., PWM) is at the logic high level, the signal 3928 (e.g., PWM_N) is at the logic low level, and if the modulation signal 2626 (e.g., PWM) is at the logic low level, the signal 3928 (e.g., PWM_N) is at the logic high level. In another example, the transistors 3920 and the transistor 3916 are controlled by the signal 3928 (e.g., PWM_N). In one embodiment, if the signal 3928 (e.g., PWM_N) is at the logic high level, the transistor 3920 is turned on and the transistor 3916 is turned off. The amplified signal 3938 is provided through the transistor 3920 to generate the ramping signal 2628 as the output signal of the ramp-signal generator 2602. In another embodiment, if the signal 3928 (e.g., PWM_N) is at the logic low level, the transistor 3920 is turned off and the transistor 3916 is turned on. A current-mirror circuit including the transistors 3908, 3910, 3912 and 3914 is configured to generate a charging current 3940 (e.g., $I_{charge}$) that flows through the transistor 3916. The capacitor 3918 is charged in response to the current 3940 through the transistor 3916 to generate the ramping signal 2628 as the output signal of the ramp-signal generator 2602.

According to another embodiment, the operational amplifier 3976 receives the compensation signal 474 (e.g., $V_{comp}$) at its non-inverting terminal (e.g., terminal "+") and outputs a signal 3990 which is received by a current-mirror circuit including the transistors 3978, 3980, 3986 and 3988 to generate the current 2638 (e.g., $I_{comp}$). For example, a current 3981 that flows through the transistor 3978 is proportional in magnitude to (e.g., equal to) a sum of a current 3992 provided by the current-source component 3984 and a current 3991 that flows through the transistor 3986. In another example, the current 3991 is proportional in magnitude to (e.g., equal to) the current 2638 (e.g., $I_{comp}$). In yet another example, the current 2694 (e.g., $I_0$) is proportional in magnitude to (e.g., equal to) a sum of the current 2638 (e.g., $I_{comp}$) and a current 3911 that flows through the transistor 3908. In yet another example, the current 3911 is proportional in magnitude to (e.g., equal to) the current 3940 (e.g., $I_{charge}$).

According to yet another embodiment, the operational amplifier 3970 receives the signal 472 associated with the bulk voltage 450 and outputs a signal 3956 to the transistor 3968 to generate a current 3967 flowing through the resistor 3966 (e.g., R2). For example, a current-mirror circuit including the transistors 3968 and 3964 generates a current 3969 that flows through the transistor 3964. As an example, the current 3969 is proportional in magnitude to (e.g., equal to) the current 3967. As another example, the current-source component 3958 provides a current 3954 (e.g., Ib2), and a current 3963 that flows through the transistor 3962 is equal in magnitude to a difference between the current 3969 and the current 3954. As yet another example, a current-mirror circuit including the transistors 3962 and 3960 generates a current 3961. For example, the current 3961 flows through the transistor 3960 and is mirrored to generate a current 3942 (e.g., $I_{ac\_n}$). In another example, the current 3961 flows through the transistor 3995 and is mirrored to generate a current 3940 (e.g., $I_{ac\_p}$). In yet another example, the current 3961 is proportional in magnitude to (e.g., equal to) the current 3940 (e.g., $I_{ac\_p}$). In yet another example, the current 3961 is proportional in magnitude to (e.g., equal to) the current 3942 (e.g., $I_{ac\_n}$).

Figure 10A:
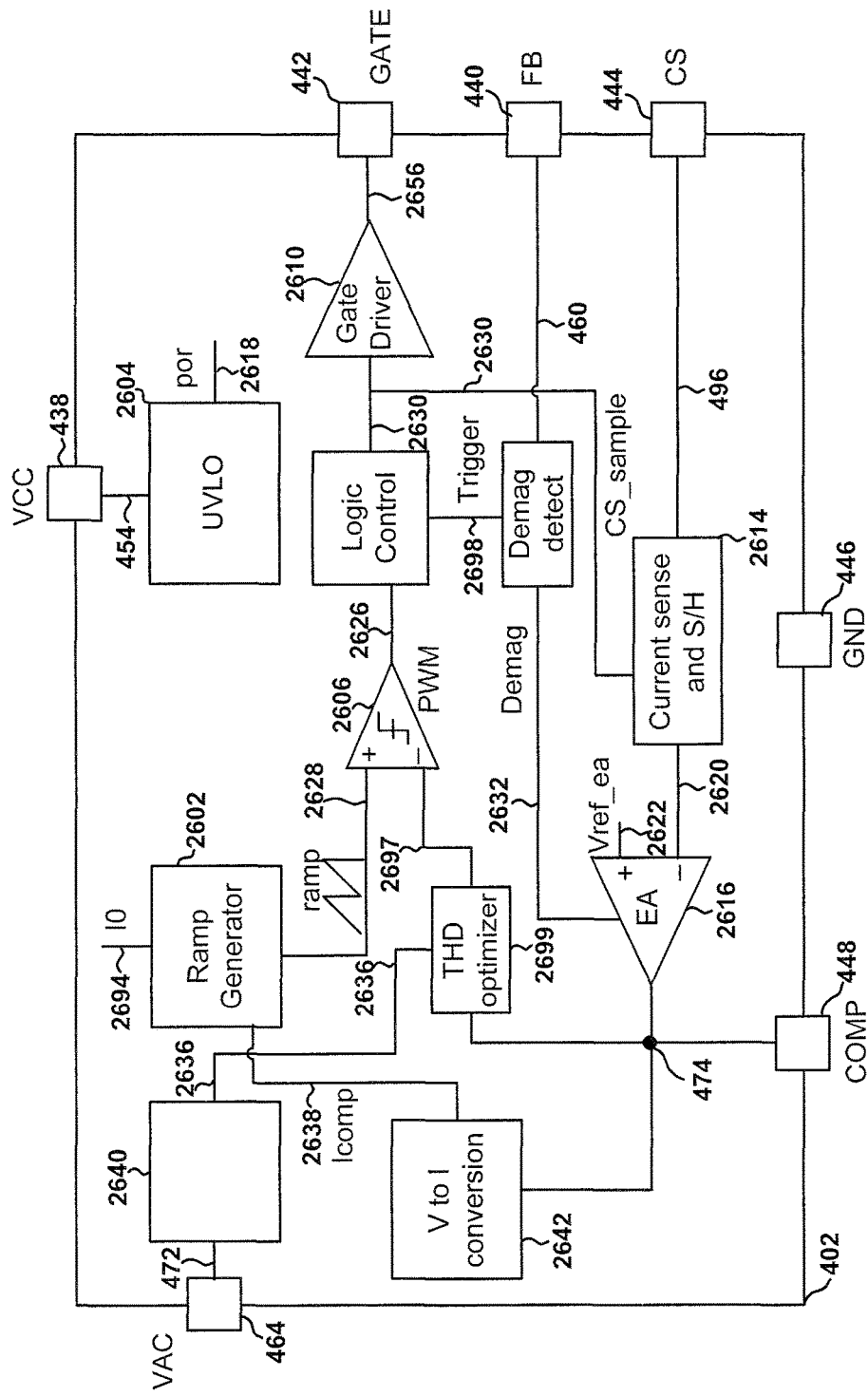
FIG. 10(a) is a simplified diagram showing a controller as part of a power conversion system as shown in FIG. 4(a) according to yet an embodiment of the present invention.
Figure 10B:
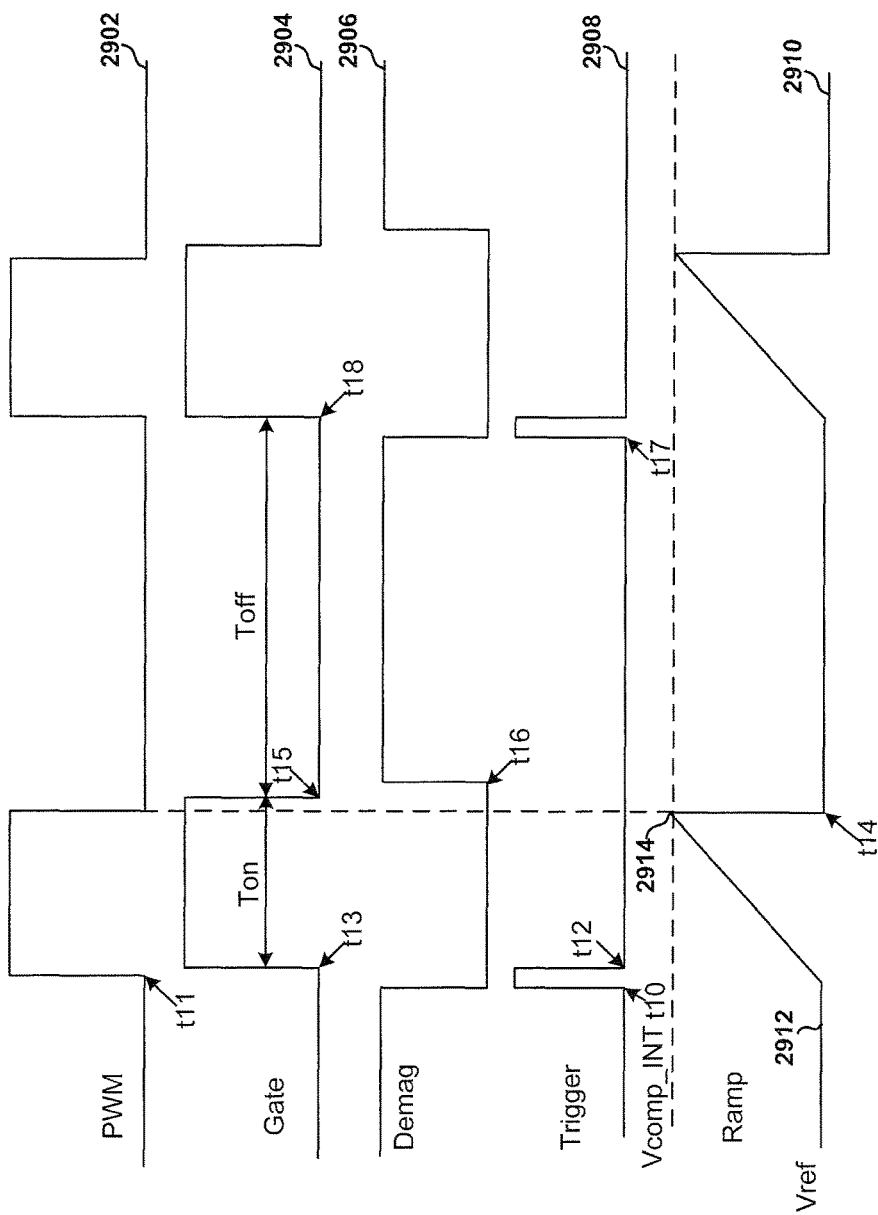
FIG. 10(b) is a simplified timing diagram for a controller as part of a power conversion system as shown in FIG. 4(a) according to another embodiment of the present invention.
Figure 10C:
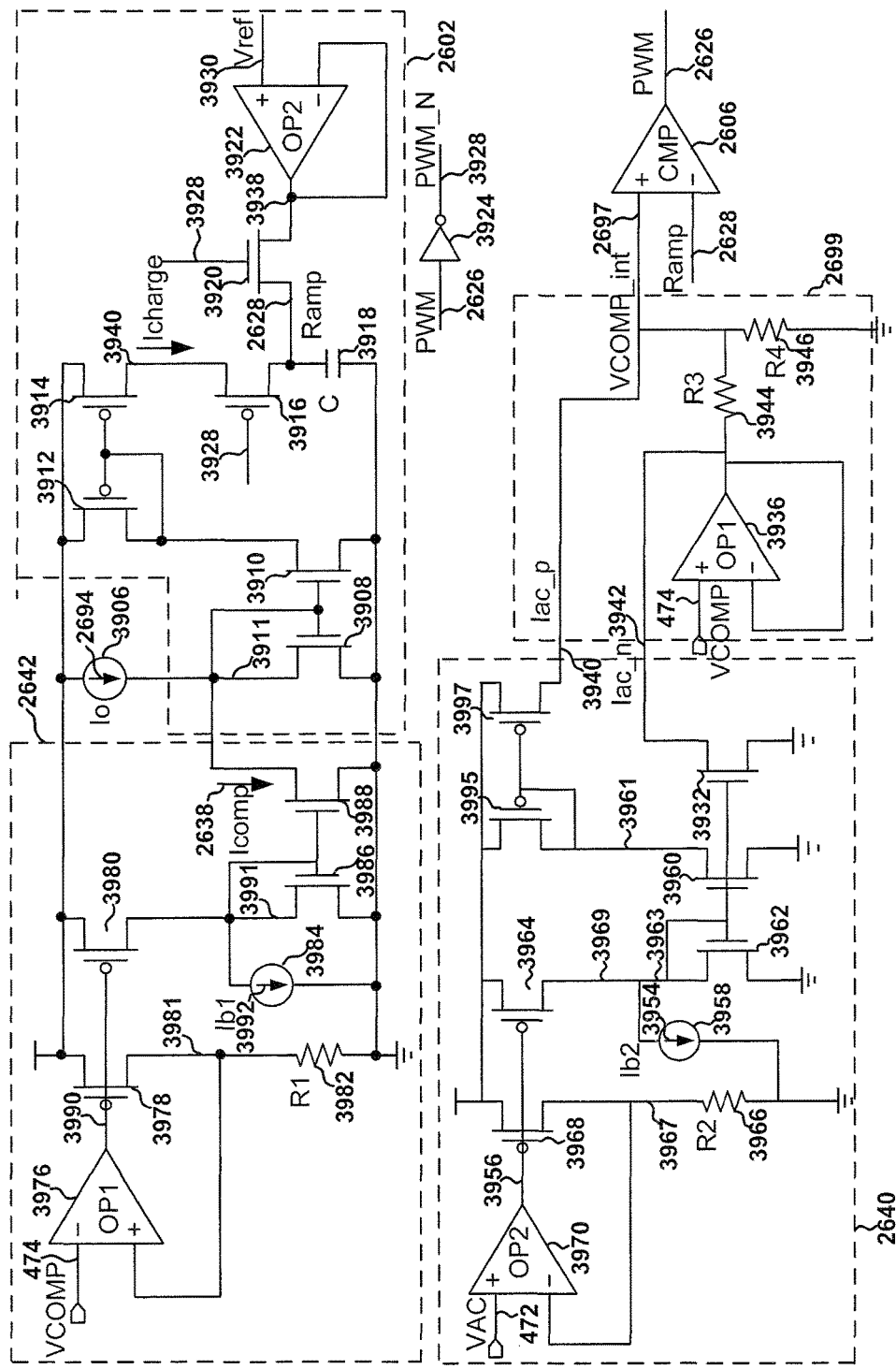
FIG. 10(c) is a simplified diagram showing certain components of a controller as part of a power conversion system as shown in FIG. 4(a) according to another embodiment of the present invention.

In one embodiment, the THD optimizer 2699 receives both the current 3940 (e.g., $I_{ac\_p}$) and the current 3942 (e.g., $I_{ac\_n}$) as well as the compensation signal 474 (e.g., $V_{comp}$) and outputs the signal 2697 (e.g., $I_{comp\_int}$) to the modulation component 2606 (e.g., a comparator). As an example, the operational amplifier 3936 receives the compensation signal 474 (e.g., $V_{comp}$) at its non-inverting terminal (e.g., terminal "+"), where the inverting terminal (e.g., terminal "−") and the output terminal of the amplifier 3936 are connected together. As another example, the current 3942 (e.g., $I_{ac\_n}$) flows through the resistor 3944 (e.g., R3) and the current 3940 (e.g., $I_{ac\_p}$) flows through the resistor 3946 (e.g., R4) to generate the signal 2697 (e.g., $V_{comp\_int}$). For example, the current 3940 (e.g., $I_{ac\_p}$) and the current 3942 (e.g., $I_{ac\_n}$) are included in the signal 2636 generated by the conversion component 2640 (e.g., as shown in FIG. 10(a)).

In another embodiment, the current 3940 (e.g., $I_{ac\_p}$) is determined as follows:

$$I_{ac\_p} = \frac{VAC}{R2} - Ib2 \quad \text{(Equation 23)}$$

where VAC represents the signal 472, R2 represents the resistance of the resistor 3966, and Ib2 represents the current 3954. As an example, VAC=γ×$V_{bulk}$, where γ represents a coefficient parameter. For example, if $$\gamma \times \frac{V_{bulk}}{R2} \geq Ib2,$$

the current 3940 (e.g., $I_{ac\_p}$) is determined as follows:

$$I_{ac\_p} = \frac{\gamma \times V_{bulk}}{R2} - Ib2 \quad \text{(Equation 24)}$$

In another example, if $$\gamma \times \frac{V_{bulk}}{R2} < Ib2,$$

the current 3940 (e.g., $I_{ac\_p}$) is determined to be zero. In some embodiments, the current 3942 (e.g., $I_{ac\_n}$) is equal in magnitude to the current 3940 (e.g., $I_{ac\_p}$).

In yet another embodiment, if $$\gamma \times \frac{V_{bulk}}{R2} - Ib2 \geq 0,$$

the signal 2697 (e.g., $V_{comp\_int}$) is determined as follows:

$$\begin{aligned} V_{comp\_int} &= \frac{R4}{R3+R4} \times V_{comp} + I_{ac\_p} \times R3 \quad \text{(Equation 25)} \\ &= \frac{R4}{R3+R4} \times V_{comp} + \left(\frac{\gamma \times V_{bulk}}{R2} - Ib2\right) \times R3 \end{aligned}$$

where $V_{comp}$ represents the compensation signal 474, R3 represents the resistance of the resistor 3944, and R4 represents the resistance of the resistor 3946. For example, if Ib2 is equal to zero, the signal 2697 (e.g., $V_{comp\_int}$) is determined, based on Equation 25, as follows:

$$V_{comp\_int} = \frac{R4}{R3 + R4} \times V_{comp} + I_{ac\_p} \times R3 \quad \text{(Equation 26)}$$
$$= \frac{R4}{R3 + R4} \times V_{comp} + \frac{\gamma \times V_{bulk}}{R2} \times R3$$

Combining Equation 3 and Equation 26, the signal 2697 (e.g., $V_{comp\_int}$) is determined as follows:

$$V_{comp\_int} = \frac{R4}{R3 + R4} \times V_{comp} + I_{ac\_p} \times R3 \quad \text{(Equation 27)}$$
$$= \frac{R4}{R3 + R4} \times V_{comp} + \frac{\gamma \times |A\sin(\omega t + \varphi)|}{R2} \times R3$$

In yet another embodiment, combining Equation 19 and Equation 27, the duration of the on-time period associated with the switch 428 is determined as follows:

$$T_{on} = \frac{\frac{R4}{R3 + R4} \times V_{comp} + \frac{\gamma \times |A\sin(\omega t + \varphi)|}{R2} \times R3 - V_{ref}}{slope} \quad \text{(Equation 28)}$$

As discussed above and further emphasized here, FIG. 5(a), FIG. 5(b), and/or FIG. 5(c) are merely examples, which should not unduly limit the scope of the claims. One of ordinary skill in the art would recognize many variations, alternatives, and modifications. For example, to achieve high efficiency (e.g., >90%), the system 800 operates in a quasi-resonant (QR) mode. As an example, the controller 802 is implemented to change the duration of an on-time period (e.g., $T_{on}$) with the bulk voltage 850 (e.g., associated with a rectified sine waveform) to improve the total harmonic distortion, e.g., as shown in FIG. 11(a) and/or FIG. 11(b).

Figure 11A:
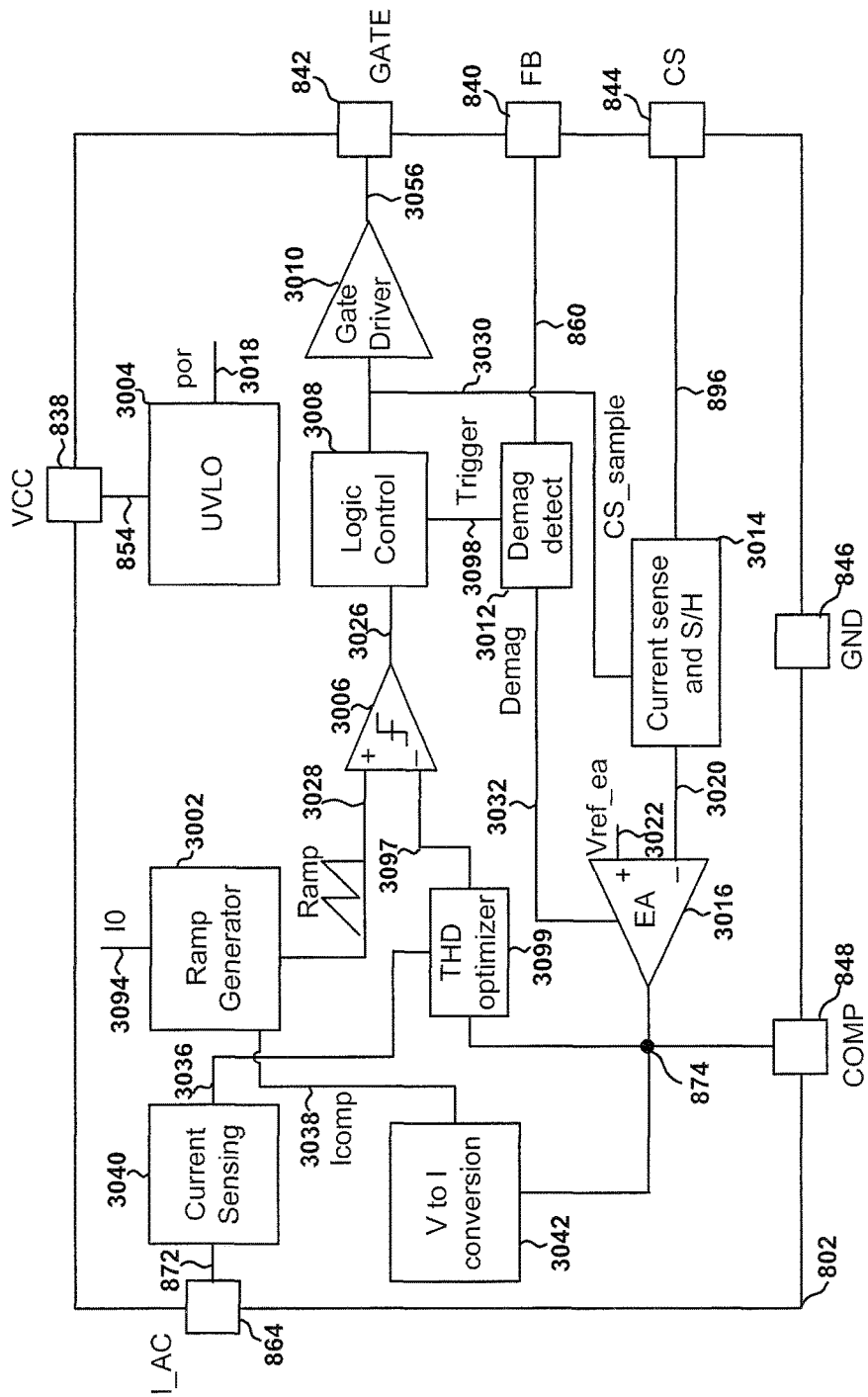
FIG. 11(a) is a simplified diagram showing a controller as part of a power conversion system as shown in FIG. 5(a) according to yet an embodiment of the present invention.
Figure 11B:
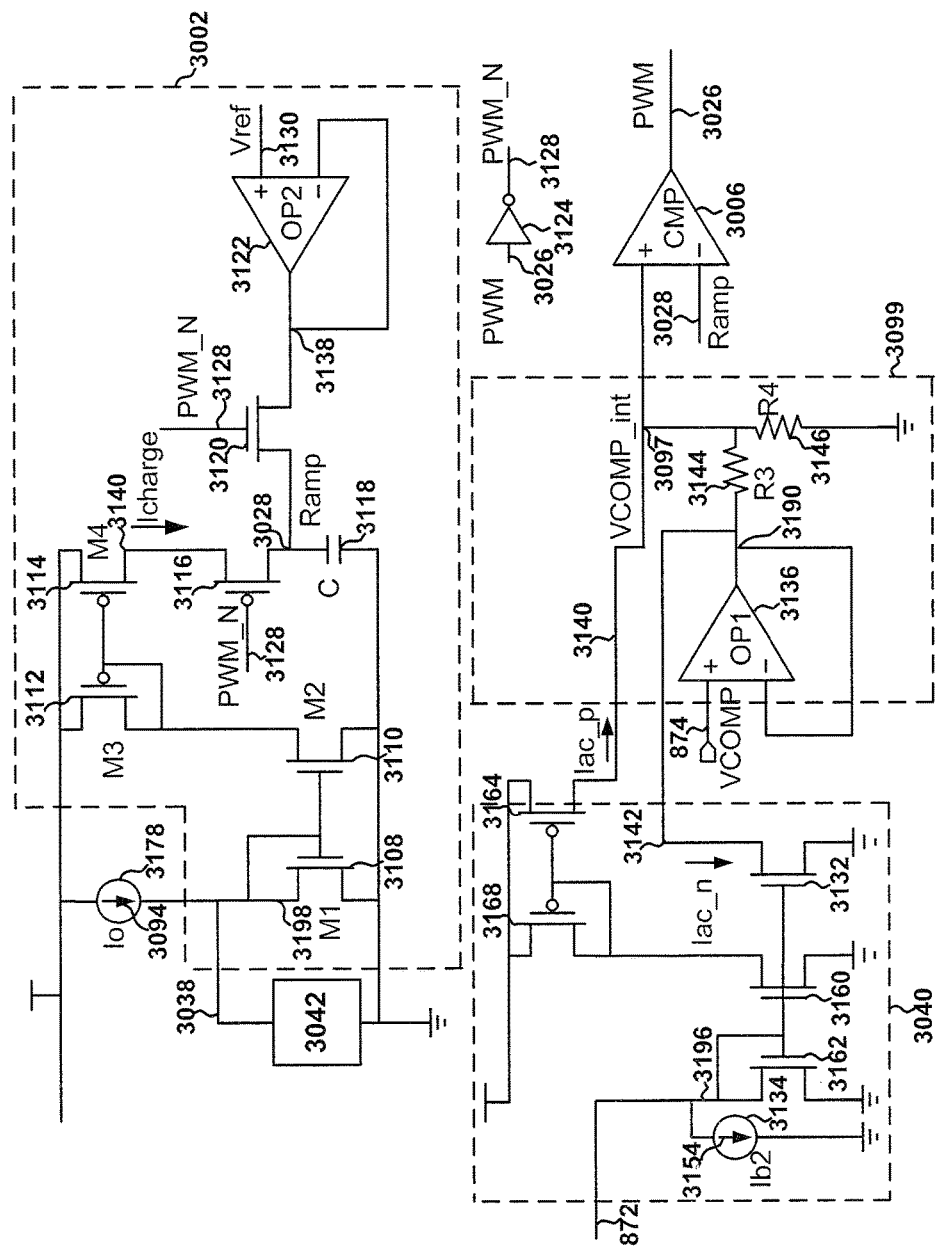
FIG. 11(b) is a simplified diagram showing certain components of a controller as part of a power conversion system as shown in FIG. 5(a) according to another embodiment of the present invention.

FIG. 11(a) is a simplified diagram showing the controller 802 as part of the power conversion system 800 according to yet another embodiment of the present invention. This diagram is merely an example, which should not unduly limit the scope of the claims. One of ordinary skill in the art would recognize many variations, alternatives, and modifications. The controller 802 includes a ramp-signal generator 3002, a UVLO component 3004, a modulation component 3006, a logic controller 3008, a driving component 3010, a demagnetization detector 3012, an error amplifier 3016, a current-sensing-and-sample/hold component 3014, a total-harmonic-distortion (THD) optimizer 3099, a current-sensing component 3040, and a voltage-to-current-conversion component 3042.

According to one embodiment, the UVLO component 3004 detects the signal 854 and outputs a signal 3018 (e.g., por). For example, if the signal 854 is larger than a first predetermined threshold in magnitude, the controller 802 begins to operate normally. If the signal 854 is smaller than a second predetermined threshold in magnitude, the controller 802 is turned off. In another example, the second predetermined threshold is smaller than the first predetermined threshold in magnitude. As another example, the current-sensing component 3040 receives the signal 872 at the terminal 864 (e.g., terminal I_AC) and outputs a signal 3036 to the THD optimizer 3099. In yet another example, the THD optimizer 3099 also receives the compensation signal 874 at the terminal 848 (e.g., terminal COMP) and outputs a signal 3097 (e.g., $V_{comp\_int}$). In yet another example, the THD optimizer 3099 transforms the compensation signal 874 to the signal 3097 (e.g., $V_{comp\_int}$) based at least in part on the signal 3036 associated with the signal 872. In yet another example, the capacitor 834 is coupled to the terminal 848 (e.g., terminal COMP) and forms, together with the error amplifier 3016, an integrator or a low-pass filter. In yet another example, the error amplifier 3016 is a transconductance amplifier and outputs a current which is proportional to a difference between the reference signal 3022 and the signal 3020. In yet another example, the error amplifier 3016 together with the capacitor 834 generates the compensation signal 874 which is a voltage signal. As an example, the signal 3036 includes one or more current signals. As another example, the signal 3036 includes one or more voltage signals.

According to another embodiment, the error amplifier 3016 receives a signal 3020 from the current-sensing-and-sample/hold component 3014 and a reference signal 3022, and the compensation signal 874 is also provided to the voltage-to-current-conversion component 3042 which outputs a current 3038 (e.g., $I_{comp}$) to the ramp-signal generator 3002. For example, the current-sensing-and-sample/hold component 3014 samples the current sensing signal 896 in response to the control signal 3030 and then holds the sampled signal until the current-sensing-and-sample/hold component 3014 samples again the current sensing signal 896. As an example, the ramp-signal generator 3002 also receives a current signal 3094 (e.g., $I_0$) and generates a ramping signal 3028 to the modulation component 3006 (e.g., a comparator) which also receives the signal 3097 (e.g., $V_{comp\_int}$) from the THD optimizer 3099. As an example, the ramping signal 3028 increases, linearly or non-linearly, to a peak magnitude during each switching period. As another example, the ramping slope of the ramping signal 3028 varies based at least in part on the compensation signal 874. In yet another example, the current 3038 (e.g., $I_{comp}$) flows from the voltage-to-current-conversion component 3042 to the ramp-signal generator 3002. In yet another example, the current 3038 (e.g., $I_{comp}$) flows from the ramp-signal generator 3002 to the voltage-to-current-conversion component 3042.

According to yet another embodiment, the modulation component 3006 outputs a modulation signal 3026. For example, the logic controller 3008 processes the modulation signal 3026 and outputs a control signal 3030 to the current-sensing-and-sample/hold component 3014 and the driving component 3010. In another example, the driving component 3010 generates a signal 3056 related to the drive signal 856 to affect the switch 828. In another example, if the signal 3056 is at a logic high level, the signal 856 is at a logic high level, and if the signal 3056 is at a logic low level, the signal 856 is at a logic low level.

In one embodiment, the demagnetization detector 3012 detects the feedback signal 860 and outputs a demagnetization signal 3032 for determining the end of the demagnetization process of the secondary winding 814. As another example, the demagnetization detector 3012 detects the feedback signal 860 and outputs the demagnetization signal 3032 for determining the beginning and the end of the demagnetization process of the secondary winding 814. In yet another example, the demagnetization detector 3012 outputs a trigger signal 3098 to the logic controller 3008 to start a next cycle (e.g., corresponding to a next switching period).

In another embodiment, the system controller 802 changes the duration of the on-time period during which the power switch 828 is kept closed (e.g., being turned on) by different magnitudes corresponding to different switching periods of the power switch 828 respectively, based on at least information associated with the signal 872. For example, the duration of the on-time period associated with the power switch 828 is changed during different switching periods of the power switch 828 adjacent to each other. In another example, the duration of the on-time period associated with the power switch 828 is changed during different switching periods of the power switch 828 not adjacent to each other.

FIG. 11(*b*) is a simplified diagram showing certain components of the controller 802 as part of the system 800 according to one embodiment of the present invention. This diagram is merely an example, which should not unduly limit the scope of the claims. One of ordinary skill in the art would recognize many variations, alternatives, and modifications.

For example, the ramp-signal generator 3002 includes transistors 3108, 3110, 3112, 3114, 3116 and 3120, an amplifier 3122, and an NOT gate 3124. The THD optimizer 3099 includes an operational amplifier 3136, and resistors 3144 and 3146. The current-sensing component 3040 includes transistors 3132, 3160, 3162, 3164 and 3168, and a current-source component 3134. As an example, the transistors 3108, 3110, 3120, 3162, 3160 and 3132 are N-channel transistors, and the transistors 3112, 3114, 3116, 3168 and 3164 are P-channel transistors.

According to one embodiment, the amplifier 3122 receives a reference signal 3130 (e.g., $V_{ref}$) at its non-inverting terminal (e.g., terminal "+") and outputs an amplified signal 3138, where the inverting terminal (e.g., terminal "−") and the output terminal of the amplifier 3122 are connected together. In another example, the signal 3128 (e.g., PWM_N) is generated by the NOT gate 3124 and is complementary to the modulation signal 3026 (e.g., PWM). As an example, if the modulation signal 3026 (e.g., PWM) is at the logic high level, the signal 3128 (e.g., PWM_N) is at the logic low level, and if the modulation signal 3026 (e.g., PWM) is at the logic low level, the signal 3128 (e.g., PWM_N) is at the logic high level. In another example, the transistors 3120 and the transistor 3116 are controlled by the signal 3128 (e.g., PWM_N). In one embodiment, if the signal 3128 (e.g., PWM_N) is at the logic high level, the transistor 3120 is turned on and the transistor 3116 is turned off. The amplified signal 3138 is provided through the transistor 3120 to generate the ramping signal 3028 as the output signal of the ramp-signal generator 3002. In another embodiment, if the signal 3128 (e.g., PWM_N) is at the logic low level, the transistor 3120 is turned off and the transistor 3116 is turned on. A current-mirror circuit including the transistors 3108, 3110, 3112 and 3114 is configured to generate a charging current 3140 (e.g., $I_{charge}$) that flows through the transistor 3116. The capacitor 3118 is charged in response to the current 3140 through the transistor 3116 to generate the ramping signal 3028 as the output signal of the ramp-signal generator 3002. For example, a current 3198 flows through the transistor 3108 and is proportional in magnitude to the current 3140 (e.g., $I_{charge}$). In another example, the current 3094 (e.g., $I_0$) is equal in magnitude to a sum of the current 3198 and the current 3038 (e.g., $I_{comp}$).

According to another embodiment, a current 3196 flows through the transistor 3162 and the current 872 (e.g., $I_{ac}$) is equal in magnitude to a sum of the current 3196 and a current 3154 (e.g., Ib2) provided by the current-source component 3134. For example, a current-mirror circuit including the transistors 3162, 3160 and 3132 generates a current 3142 (e.g., $I_{ac\_n}$) which is proportional in magnitude to (e.g., equal to) the current 3196. In another example, a current-mirror circuit including the transistors 3162, 3160, 3168 and 3164 generates a current 3140 (e.g., $I_{ac\_p}$) which is proportional in magnitude to (e.g., equal to) the current 3196.

According to yet another embodiment, the operational amplifier 3136 receives the compensation signal 874 (e.g., $V_{comp}$) at its non-inverting terminal (e.g., terminal "+") and outputs a signal 3190 to the resistor 3144 (e.g., R3) and the resistor 3146 (e.g., R4). For example, the signal 3190 is associated with at least the current 3142 ($I_{ac\_n}$). As an example, the signal 3097 (e.g., $V_{comp\_int}$) is generated based at least in part on the current 3140 (e.g., $I_{ac\_p}$) and the current 3142 ($I_{ac\_n}$) and output to the modulation component 3006 (e.g., a comparator). For example, the current 3140 (e.g., $I_{ac\_p}$) and the current 3142 (e.g., $I_{ac\_n}$) are included in the signal 3036 generated by the current-sensing component 3040 (e.g., as shown in FIG. 11(*a*)).

In one embodiment, if $I_{ac} \geq Ib2$, the current 3140 (e.g., $I_{ac\_p}$) is determined as follows:

$$I_{ac\_p} = I_{ac} - Ib2 \qquad \text{(Equation 29)}$$

where $I_{ac}$ represents the current signal 872, and Ib2 represents the current 3154. For example, if $I_{ac} < Ib2$, the current 3140 (e.g., $I_{ac\_p}$) is determined to be zero. In some embodiments, the current 3142 (e.g., $I_{ac\_n}$) is equal in magnitude to the current 3140 (e.g., $I_{ac\_p}$).

As discussed above and further emphasized here, FIG. 7(*a*), FIG. 7(*b*), and/or FIG. 7(*c*) are merely examples, which should not unduly limit the scope of the claims. One of ordinary skill in the art would recognize many variations, alternatives, and modifications. For example, to achieve high efficiency (e.g., >90%), the system 1100 operates in a quasi-resonant (QR) mode. As an example, the controller 1102 is implemented to change the duration of an on-time period (e.g., $T_{on}$) with the bulk voltage 1150 (e.g., associated with a rectified sine waveform) to improve the total harmonic distortion, e.g., as shown in FIG. 12(*a*) and/or FIG. 12(*b*).

FIG. 12(*a*) is a simplified diagram showing the controller 1102 as part of the power conversion system 1100 according to another embodiment of the present invention. This diagram is merely an example, which should not unduly limit the scope of the claims. One of ordinary skill in the art would recognize many variations, alternatives, and modifications. The controller 1102 includes a ramp-signal generator 3202, a UVLO component 3204, a modulation component 3206, a logic controller 3208, a driving component 3210, a demagnetization detector 3212, an error amplifier 3216, a current-sensing-and-sample/hold component 3214, a current-sensing component 3240, a total-harmonic-distortion (THD) optimizer 3299, and a voltage-to-current-conversion component 3242.

According to one embodiment, the UVLO component 3204 detects the signal 1154 and outputs a signal 3218 (e.g., por). For example, if the signal 1154 is larger than a first predetermined threshold in magnitude, the controller 1102 begins to operate normally. If the signal 1154 is smaller than a second predetermined threshold in magnitude, the controller 1102 is turned off. In another example, the first predetermined threshold is larger than the second predetermined threshold in magnitude.

According to another embodiment, the ramp-signal generator 3202 receives a current signal 3294 (e.g., $I_0$) and a current 3238 (e.g., $I_{comp}$) from the voltage-to-current-conversion component 3242 and generates a ramping signal 3228 to the modulation component 3206. As an example, the ramping signal 3228 increases, linearly or non-linearly, to a peak magnitude during each switching period. As another example, the ramping slope of the ramping signal 3228 varies based at least in part on the compensation signal 1174. In another example, the modulation component 3206 also receives a signal 3297 (e.g., $V_{comp\_in}$) from the THD optimizer 3299 and outputs a modulation signal 3226 to the logic controller 3208. For example, the logic controller 3208 processes the modulation signal 3226 and outputs a control signal 3230 to the current-sensing-and-sample/hold component 3214 and the driving component 3210. In another example, the driving component 3210 generates a signal 3256 related to the drive signal 1156 to affect the switch 1128. In yet another example, if the signal 3256 is at the logic high level, the signal 1156 is at the logic high level, and if the signal 3256 is at the logic low level, the signal 1156 is at the logic low level.

According to yet another embodiment, the error amplifier 3216 receives a signal 3220 from the current-sensing-and-sample/hold component 3214 and a reference signal 3222 (e.g., $V_{ref\_ea}$) and the compensation signal 1174 is provided to the THD optimizer 3299 and the voltage-to-current-conversion component 3242. As an example, the capacitor 1134 is coupled to the terminal 1148 (e.g., terminal COMP) and forms, together with the error amplifier 3216, an integrator or a low-pass filter. In another example, the error amplifier 3216 is a transconductance amplifier and outputs a current which is proportional to a difference between the reference signal 3222 and the signal 3220. In yet another example, the error amplifier 3216 together with the capacitor 1134 generates the compensation signal 1174 which is a voltage signal. In yet another example, the current 3238 (e.g., $I_{comp}$) flows from the THD optimizer 3299 to the ramp-signal generator 3202. In yet another example, the current 3238 (e.g., $I_{comp}$) flows from the ramp-signal generator 3202 to the THD optimizer 3299.

According to yet another embodiment, the current-sensing component 3240 outputs a signal 3236 to the ramp-signal generator 3202 in response to a current signal 3296 associated with the terminal 1140 (e.g., terminal FB). For example, the current signal 3296 is related to the bulk voltage 1150 during the on-time period associated with the driving signal 1156. As an example, the signal 3236 includes one or more current signals. As another example, the signal 3236 includes one or more voltage signals.

In one embodiment, the demagnetization detector 3212 detects the feedback signal 1160 and outputs a demagnetization signal 3232 for determining the end of the demagnetization process of the secondary winding 1114. As another example, the demagnetization detector 3212 detects the feedback signal 1160 and outputs the demagnetization signal 3232 for determining the beginning and the end of the demagnetization process of the secondary winding 1114. In yet another example, the demagnetization detector 3212 outputs a trigger signal 3298 to the logic controller 3208 to start a next cycle (e.g., corresponding to a next switching period).

In another embodiment, the system controller 1102 changes the duration of the on-time period during which the power switch 1128 is kept closed (e.g., being turned on) by different magnitudes corresponding to different switching periods of the power switch 1128 respectively. For example, the duration of the on-time period associated with the power switch 1128 is changed during different switching periods of the power switch 1128 adjacent to each other. In another example, the duration of the on-time period associated with the power switch 1128 is changed during different switching periods of the power switch 1128 not adjacent to each other.

Figure 12A:
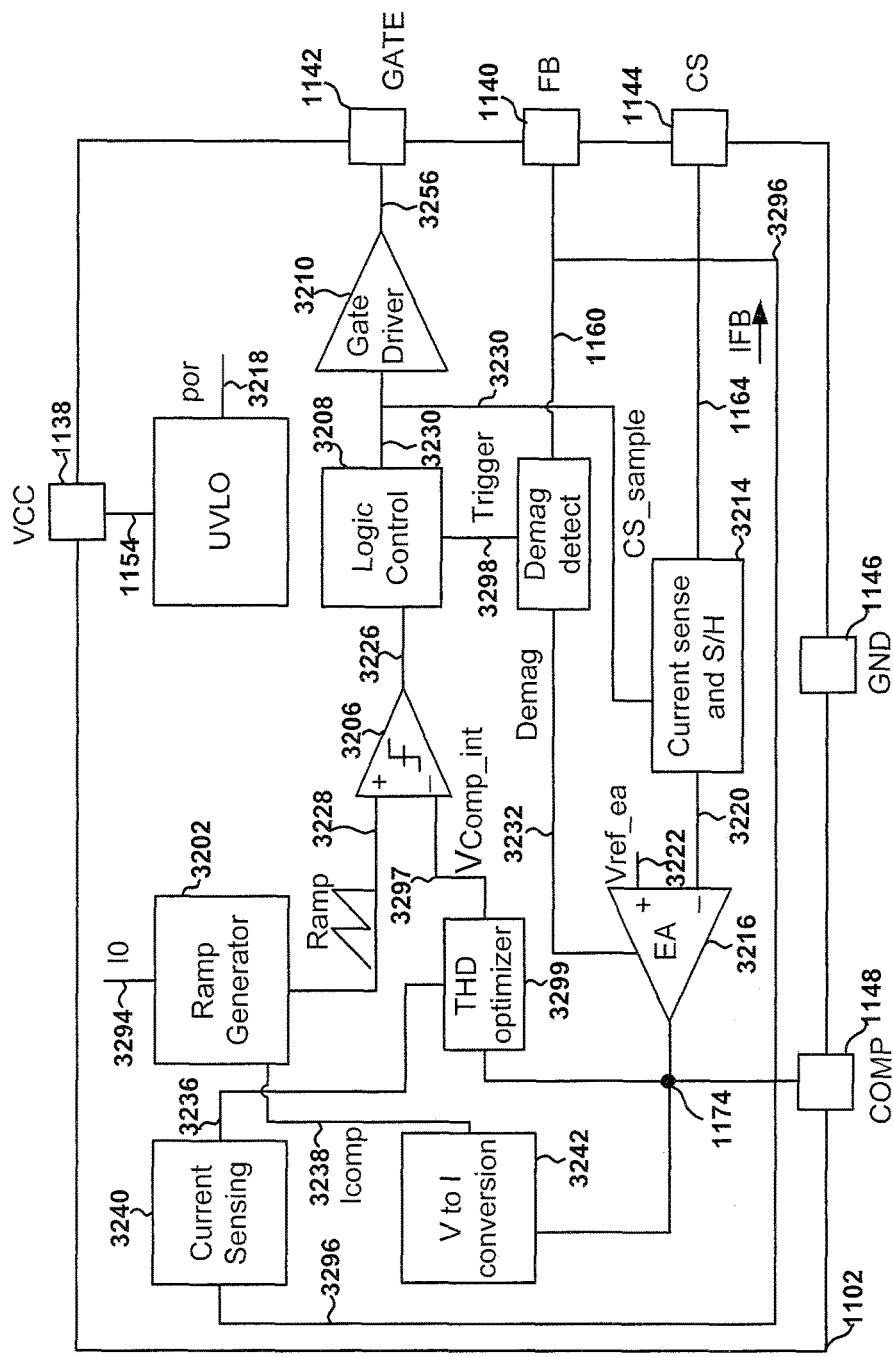
FIG. 12(a) is a simplified diagram showing a controller as part of a power conversion system as shown in FIG. 7(a) according to yet an embodiment of the present invention.
Figure 12B:
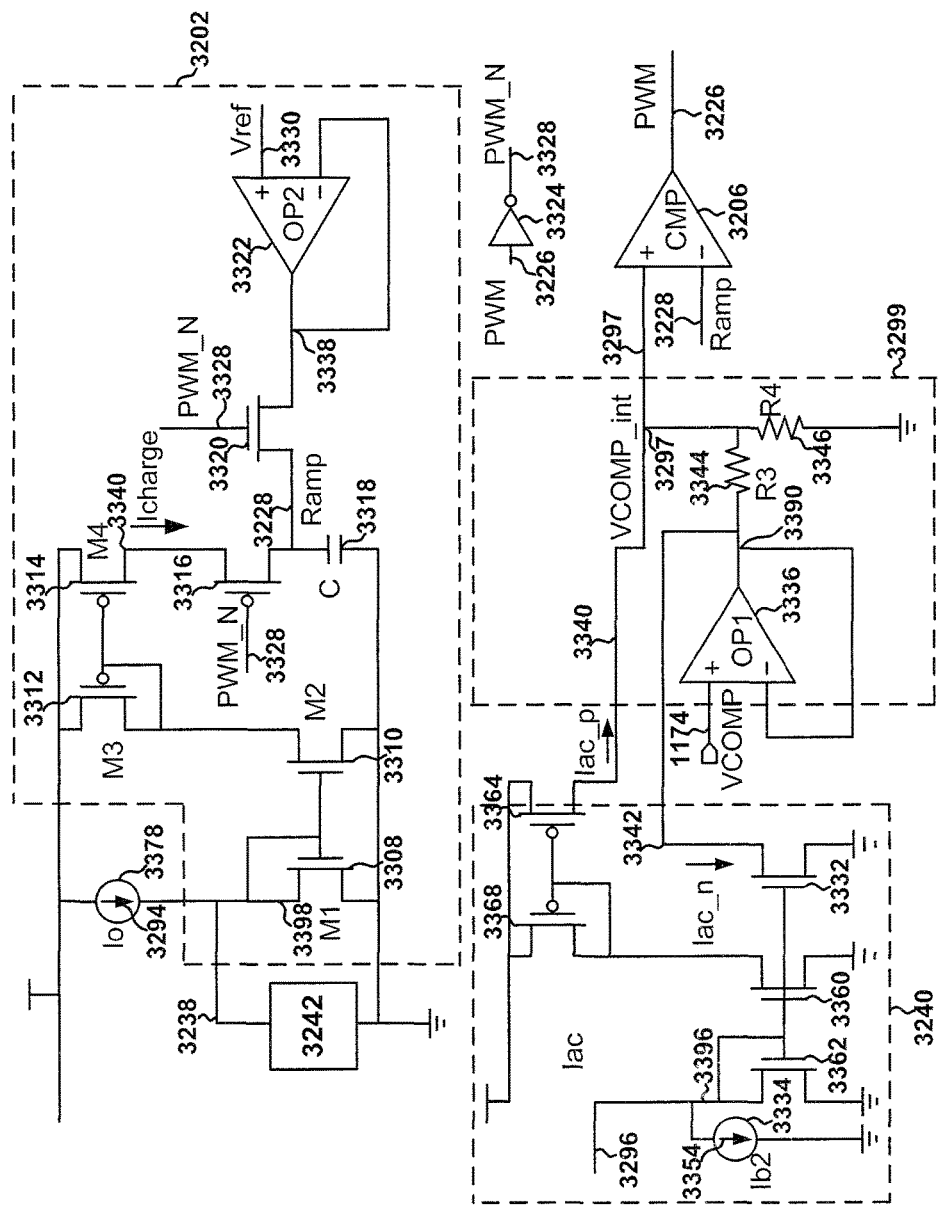
FIG. 12(b) is a simplified diagram showing certain components of a controller as part of a power conversion system as shown in FIG. 7(a) according to another embodiment of the present invention.

FIG. 12(b) is a simplified diagram showing certain components of the controller 1102 as part of the system 1100 according to one embodiment of the present invention. This diagram is merely an example, which should not unduly limit the scope of the claims. One of ordinary skill in the art would recognize many variations, alternatives, and modifications.

For example, the ramp-signal generator 3202 includes transistors 3308, 3310, 3312, 3314, 3316 and 3320, an amplifier 3322, and an NOT gate 3324. The THD optimizer 3299 includes an operational amplifier 3336, and resistors 3344 and 3346. The current-sensing component 3240 includes transistors 3332, 3360, 3362, 3364 and 3368, and a current-source component 3334. As an example, the transistors 3308, 3310, 3320, 3362, 3360 and 3332 are N-channel transistors, and the transistors 3312, 3314, 3316, 3368 and 3364 are P-channel transistors.

According to one embodiment, the amplifier 3322 receives a reference signal 3330 (e.g., $V_{ref}$) at its non-inverting terminal (e.g., terminal "+") and outputs an amplified signal 3338, where the inverting terminal (e.g., terminal "−") and the output terminal of the amplifier 3322 are connected together. For example, the signal 3328 (e.g., PWM_N) is generated by the NOT gate 3324 and is complementary to the modulation signal 3226 (e.g., PWM). As an example, if the modulation signal 3226 (e.g., PWM) is at the logic high level, the signal 3328 (e.g., PWM_N) is at the logic low level, and if the modulation signal 3226 (e.g., PWM) is at the logic low level, the signal 3328 (e.g., PWM_N) is at the logic high level. In another example, the transistors 3320 and the transistor 3316 are controlled by the signal 3328 (e.g., PWM_N). In one embodiment, if the signal 3328 (e.g., PWM_N) is at the logic high level, the transistor 3320 is turned on and the transistor 3316 is turned off. The amplified signal 3338 is provided through the transistor 3320 to generate the ramping signal 3228 as the output signal of the ramp-signal generator 3202. In another embodiment, if the signal 3328 (e.g., PWM_N) is at the logic low level, the transistor 3320 is turned off and the transistor 3316 is turned on. A current-mirror circuit including the transistors 3308, 3310, 3312 and 3314 is configured to generate a charging current 3340 (e.g., $I_{charge}$) that flows through the transistor 3316. The capacitor 3318 is charged in response to the current 3340 through the transistor 3316 to generate the ramping signal 3228 as the output signal of the ramp-signal generator 3202. For example, a current 3398 flows through the transistor 3308 and is proportional in magnitude to the current 3340 (e.g., $I_{charge}$). In another example, the current 3294 (e.g., $I_0$) is equal in magnitude to a sum of the current 3398 and the current 3238 (e.g., $I_{comp}$).

According to another embodiment, a current 3396 flows through the transistor 3362, and a current 3496 (e.g., $I_{ac}$) associated with the current 3296 (e.g., $I_{FB}$) is equal in magnitude to a sum of the current 3396 and a current 3354 (e.g., Ib2) provided by the current-source component 3334. For example, a current-mirror circuit including the transistors 3362, 3360 and 3332 generates a current 3342 (e.g., $I_{ac\_n}$) which is proportional in magnitude to (e.g., equal to) the current 3396. In another example, a current-mirror circuit including the transistors 3362, 3360, 3368 and 3364 generates a current 3340 (e.g., $I_{ac\_p}$) which is proportional in magnitude to (e.g., equal to) the current 3396.

According to yet another embodiment, the operational amplifier 3336 receives the compensation signal 1174 (e.g., $V_{comp}$) at its non-inverting terminal (e.g., terminal "+") and outputs a signal 3390 to the resistor 3344 (e.g., R3) and the resistor 3346 (e.g., R4). For example, the signal 3390 is associated with at least the current 3342 ($I_{ac\_n}$). As an example, the signal 3297 (e.g., $V_{comp\_int}$) is generated based at least in part on the current 3340 (e.g., $I_{ac\_p}$) and the current 3342 ($I_{ac\_n}$) and output to the modulation component 3206 (e.g., a comparator). For example, the current 3340 (e.g., $I_{ac\_p}$) and the current 3342 (e.g., $I_{ac\_n}$) are included in the signal 3236 generated by the current-sensing component 3240 (e.g., as shown in FIG. 12(a)).

Referring to FIG. 7(a), FIG. 12(a) and FIG. 12(b), during an on-time period, the voltage 1198 associated with the auxiliary winding 1116 is determined as follows, in some embodiments:

$$V_{aux} = \frac{N_{aux}}{N_p} \times V_{bulk} \quad \text{(Equation 30)}$$

where $V_{aux}$ represents the voltage 1198, $N_{aux}/N_p$ represents a turns ratio between the auxiliary winding 1116 and the primary winding 1112, and $V_{bulk}$ represents the bulk voltage 1150. In certain embodiments, if a voltage at the terminal 1140 (e.g., terminal FB) is regulated to be approximately zero, the current signal 3296 (e.g., $I_{FB}$) is detected by the current-sensing component 3240:

$$I_{FB} = \frac{V_{aux}}{R_6} = \frac{N_{aux}}{N_p \times R_6} \times V_{bulk} \quad \text{(Equation 31)}$$

where $I_{FB}$ represents the current signal 3296 and $R_6$ represents the resistance of the resistor 1124.

According to some embodiments, the current signal 3296 indicates a waveform of the bulk voltage 1150 during the on-time period associated with the drive signal 1156, and the current signal 3496 is determined as follows:

$$I_{ac} = \delta \times I_{FB} = \delta \times \frac{N_{aux}}{N_p \times R_6} \times V_{bulk} \quad \text{(Equation 32)}$$

where $I_{ac}$ represents the current signal 3496 and $\delta$ represents a constant. For example, if $I_{ac} \geq Ib2$, the current 3340 (e.g., $I_{ac\_p}$) is determined as follows:

$$I_{ac\_p} = I_{ac} - Ib2 \quad \text{(Equation 33)}$$

where $I_{ac}$ represents the current signal 3496, and $Ib2$ represents the current 3354. For example, if $I_{ac} < Ib2$, the current 3340 (e.g., $I_{ac\_p}$) is determined to be zero. In some embodiments, the current 3342 (e.g., $I_{ac\_n}$) is equal in magnitude to the current 3340 (e.g., $I_{ac\_p}$).

In one embodiment, if $$\delta \times \frac{N_{aux}}{N_p \times R_6} \times V_{bulk} - Ib2 \geq 0,$$

the signal 3297 (e.g., $V_{comp\_int}$) is determined as follows:

$$\begin{aligned} V_{comp\_int} &= \frac{R4}{R3+R4} \times V_{comp} + I_{ac\_p} \times R3 \\ &= \frac{R4}{R3+R4} \times V_{comp} + \\ &\quad \left(\delta \times \frac{N_{aux}}{N_p \times R_6} \times V_{bulk} - Ib2\right) \times R3 \end{aligned} \quad \text{(Equation 34)}$$

where $V_{comp}$ represents the compensation signal 1174, R3 represents the resistance of the resistor 3344, and R4 represents the resistance of the resistor 3346. For example, if $Ib2$ is equal to zero, the signal 3297 (e.g., $V_{comp\_int}$) is determined, based on Equation 34, as follows:

$$\begin{aligned} V_{comp\_int} &= \frac{R4}{R3+R4} \times V_{comp} + I_{ac\_p} \times R3 \\ &= \frac{R4}{R3+R4} \times V_{comp} + \delta \times \frac{N_{aux}}{N_p \times R_6} \times V_{bulk} \times R3 \end{aligned} \quad \text{(Equation 35)}$$

Combining Equation 3 and Equation 35, the signal 3297 (e.g., $V_{comp\_int}$) is determined as follows:

$$\begin{aligned} V_{comp\_int} &= \frac{R4}{R3+R4} \times V_{comp} + I_{ac\_p} \times R3 \\ &= \frac{R4}{R3+R4} \times V_{comp} + \delta \times \frac{N_{aux}}{N_p \times R_6} \times \\ &\quad |A\sin(\omega t + \varphi)| \times R3 \end{aligned} \quad \text{(Equation 36)}$$

In another embodiment, the magnitude change of the ramping signal 3228 during the on-time period is determined as follows:

$$\Delta V_{ramp} = V_{comp\_int} - V_{ref} = \text{slope} \times T_{on} \quad \text{(Equation 37)}$$

where $\Delta V_{ramp}$ represents the magnitude changes of the ramping signal 3228, $V_{comp\_int}$ represents the signal 3297, $V_{ref}$ represents a predetermined voltage magnitude (e.g., the signal 3330), slope represents a ramping slope associated with the ramping signal 3228, and $T_{on}$ represents the duration of the on-time period. For example, $V_{ref}$ corresponds to a minimum magnitude of the ramping signal 3228. As an example, based on Equation 37, the duration of the on-time period is determined as follows:

$$T_{on} = \frac{V_{comp\_int} - V_{ref}}{\text{slope}} \quad \text{(Equation 38)}$$

Based on Equation 36 and Equation 38, the duration of the on-time period is determined as follows:

$$T_{on} = \frac{\frac{R4}{R3+R4} \times V_{comp} + \delta \times \frac{N_{aux}}{N_p \times R_6} \times |A\sin(\omega t + \varphi)| \times R3 - V_{ref}}{\text{slope}} \quad \text{(Equation 39)}$$

According to one embodiment, a system controller for regulating a power conversion system includes a first controller terminal and a second controller terminal. The first controller terminal is configured to receive a first signal associated with an input signal for a primary winding of a power conversation system. The second controller terminal is configured to output a drive signal to a switch to affect a first current flowing through the primary winding of the power conversion system, the drive signal being associated with an on-time period, the switch being closed during the on-time period. The system controller is configured to adjust a duration of the on-time period based on at least information associated with the first signal. For example, the system controller is implemented according to at least FIG. 4(a), FIG. 4(b), FIG. 4(d), FIG. 5(a), FIG. 5(b), FIG. 5(c), FIG. 7(a), FIG. 7(b), FIG. 7(c), FIG. 8(a), FIG. 8(b), and/or FIG. 9.

According to another embodiment, a system controller for regulating a power conversion system includes a first controller terminal, a ramp-signal generator, and a second controller terminal. The first controller terminal is configured to provide a compensation signal based on at least information associated with a first current flowing through a primary winding of a power conversion system. The ramp-signal generator is configured to receive a first signal associated with the compensation signal and generate a ramping signal based on at least information associated with the first signal, the ramping signal being associated with a ramping slope. The second controller terminal is configured to output a drive signal to a switch based on at least information associated with the ramping signal to affect the first current. The system controller is configured to adjust the ramping slope of the ramping signal based on at least information associated with the compensation signal. For example, the system controller is implemented according to at least FIG. 4(a), FIG. 4(b), FIG. 5(a), FIG. 5(b), FIG. 6(a), FIG. 6(b), FIG. 7(a), FIG. 7(b), FIG. 8(a), FIG. 8(c), and/or FIG. 9.

According to yet another embodiment, a method for regulating a power conversion system includes: receiving a first signal from a first controller terminal, the first signal being associated with an input signal for a primary winding of a power conversation system; adjusting a duration of an on-time period related to a drive signal based on at least information associated with the first signal; and outputting the drive signal from a second controller terminal to a switch to affect a first current flowing through the primary winding of the power conversion system, the switch being closed during the on-time period. For example, the method is implemented according to at least FIG. 4(a), FIG. 4(b), FIG. 4(d), FIG. 5(a), FIG. 5(b), FIG. 5(c), FIG. 7(a), FIG. 7(b), FIG. 7(c), FIG. 8(a), FIG. 8(b), and/or FIG. 9.

According to yet another embodiment, a method for regulating a power conversion system includes: providing a compensation signal by a first controller terminal based on at least information associated with a first current flowing through a primary winding of a power conversion system; generating a first signal based on at least information associated with the compensation signal; and processing information associated with the first signal. The method further includes: adjusting a ramping slope associated with a ramping signal based on at least information associated with the first signal; receiving the ramping signal; generating a drive signal based on at least information associated with the ramping signal; and outputting the drive signal from a second controller terminal to a switch to affect the first current. For example, the method is implemented according to at least FIG. 4(a), FIG. 4(b), FIG. 5(a), FIG. 5(b), FIG. 6(a), FIG. 6(b), FIG. 7(a), FIG. 7(b), FIG. 8(a), FIG. 8(c), and/or FIG. 9.

In one embodiment, a system controller for regulating a power conversion system includes: a signal generator configured to receive a converted signal and a first compensation signal and generate a second compensation signal based at least in part on the converted signal and the first compensation signal, the converted signal being associated with an input signal for a power conversion system, the first compensation signal being associated with a sensing signal related to a first current flowing through a primary winding of the power conversion system; a modulation component configured to receive the second compensation signal and a ramping signal and generate a modulation signal based at least in part on the second compensation signal and the ramping signal; and a drive component configured to receive the modulation signal and output a drive signal based at least in part on the modulation signal to a switch to affect the first current, the drive signal being associated with an on-time period, the switch being closed during the on-time period. The system controller is configured to adjust a duration of the on-time period based at least in part on the converted signal and the second compensation signal. For example, the system controller is implemented according to at least FIG. 4(a), FIG. 5(a), FIG. 7(a), FIG. 10(a), FIG. 10(b), FIG. 10(c), FIG. 11(a), FIG. 11(b), FIG. 12(a), and/or FIG. 12(b).

In another embodiment, a method for regulating a power conversion system includes: receiving a converted signal and a first compensation signal, the converted signal being associated with an input signal for a power conversion system, the first compensation signal being associated with a sensing signal related to a first current flowing through a primary winding of the power conversion system; generating a second compensation signal based at least in part on the converted signal and the first compensation signal; receiving the second compensation signal and a ramping signal; generating a modulation signal based at least in part on the second compensation signal and the ramping signal; receiving the modulation signal; and outputting a drive signal based at least in part on the modulation signal to affect the first current, the drive signal being associated with an on-time period. The outputting a drive signal based at least in part on the modulation signal to affect the first current includes adjusting a duration of the on-time period based at least in part on the converted signal and the second compensation signal. For example, the method is implemented according to at least FIG. 4(a), FIG. 5(a), FIG. 7(a), FIG. 10(a), FIG. 10(b), FIG. 10(c), FIG. 11(a), FIG. 11(b), FIG. 12(a), and/or FIG. 12(b).

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits. In yet another example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system controller for a power converter, the system controller comprising:
   a modulation signal generator configured to receive a first compensation signal and a ramping signal and generate a modulation signal based at least in part on the first compensation signal and the ramping signal, the first compensation signal being associated with a converted signal and a second compensation signal, the converted signal being associated with an input signal for a power converter, the second compensation signal being associated with a sensing signal related to a first current flowing through a primary winding of the power converter; and
   a drive signal generator configured to receive the modulation signal and output a drive signal to affect the first current, the drive signal being associated with an on-time period, a switch being closed during the on-time period;
   wherein the system controller is configured to adjust a duration of the on-time period based at least in part on the converted signal and the first compensation signal.

2. The system controller of claim 1, further comprising a converter configured to receive a first voltage signal related to the input signal and generate the converted signal based at least in part on the first voltage signal.

3. The system controller of claim 2, further comprising:
   a first controller terminal coupled to a voltage signal generator, the voltage signal generator being configured to receive the input signal and generate the first voltage signal based at least in part on the input signal;
   wherein the input signal is received by the primary winding.

4. The system controller of claim 3 wherein the voltage signal generator includes a capacitor and two resistors.

5. The system controller of claim 2 wherein the converter includes:
   an amplifier configured to receive the first voltage signal and a second voltage signal and generate an amplified signal based at least in part on the first voltage signal and the second voltage signal; and
   a current-mirror circuit configured to generate the converted signal based at least in part on the amplified signal.

6. The system controller of claim 5 wherein:
   the current-mirror circuit is further configured to generate a second current based at least in part on the amplified signal; and
   the converter further includes a resistor configured to generate the second voltage signal based at least in part on the second current.

7. The system controller of claim 6 wherein:
   the amplifier includes a first input terminal, a second input terminal and an output terminal;
   the first input terminal is configured to receive the first voltage signal; and
   the second input terminal is coupled to the resistor.

8. The system controller of claim 1, further comprising a distortion optimizer, wherein the distortion optimizer includes:
   an amplifier configured to receive the second compensation signal and generate an amplified signal based at least in part on the second compensation signal; and
   a plurality of resistors configured to generate the first compensation signal based at least in part on the amplified signal and the converted signal.

9. The system controller of claim 8 wherein:
   the plurality of resistors includes:
      a first resistor including a first resistor terminal and a second resistor terminal; and
      a second resistor including a third resistor terminal and a fourth resistor terminal;
   the first resistor terminal is coupled to an output terminal of the amplifier; and
   the second resistor terminal is coupled to the third resistor terminal and configured to generate the first compensation signal.

10. The system controller of claim 9 wherein:
    the converted signal includes a second current and a third current;
    the first resistor terminal is configured to receive at least a part of the second current; and
    the second resistor terminal is configured to receive at least a part of the third current.

11. The system controller of claim 1, further comprising:
    a voltage signal generator configured to receive the sensing signal and generate a first voltage signal based at least in part on the sensing signal; and
    an error amplifier configured to receive the first voltage signal and a reference signal and generate an amplified signal based at least in part on the first voltage signal and the reference signal, the amplified signal being related to the second compensation signal.

12. The system controller of claim 11, further comprising a first controller terminal coupled to a capacitor configured to generate the second compensation signal based at least in part on the amplified signal.

13. The system controller of claim 11, further comprising a demagnetization signal generator configured to receive a feedback signal associated with an auxiliary winding of the power converter and generate a demagnetization signal associated with a demagnetization process of the power converter based at least in part on the feedback signal.

14. The system controller of claim 13 wherein:
    the demagnetization signal generator is further configured to generate a trigger signal based at least in part on the feedback signal; and
    the drive signal generator is further configured to change the drive signal in response to the trigger signal to start a next switching cycle of the power converter.

15. The system controller of claim 13 wherein the error amplifier is further configured to:
    in response to the demagnetization signal being at a first logic level, receive the first voltage signal and generate the amplified signal based at least in part on the first voltage signal; and
    in response to the demagnetization signal being at a second logic level, receive a ground voltage and generate the amplified signal based at least in part on the ground voltage.

16. The system controller of claim 11 wherein:
    the drive signal generator includes:
       a logic controller configured to receive the modulation signal and generate a first signal based at least in part on the modulation signal; and
       a gate driver configured to receive the first signal and generate the drive signal based at least in part on the first signal; and
    the voltage signal generator is further configured to sample one or more peak magnitudes of the sensing signal in response to the first signal.

17. The system controller of claim 1, further comprising a ramping-signal generator configured to receive a third compensation signal and generate the ramping signal based at least in part on the third compensation signal.

18. The system controller of claim 17, further comprising a converter configured to receive the second compensation signal and generate the third compensation signal based at least in part on the second compensation signal.

19. The system controller of claim 18 wherein:
the second compensation signal includes a voltage signal; and
the third compensation signal includes a current signal.

20. The system controller of claim 18 wherein the converter includes:
an amplifier configured to receive the second compensation signal and generate an amplified signal based at least in part on the second compensation signal; and
a current-mirror circuit configured to generate the third compensation signal based at least in part on the amplified signal.

21. The system controller of claim 20 wherein:
the current-mirror circuit is further configured to generate a second current based at least in part on the amplified signal; and
the converter further includes a resistor configured to generate a first voltage signal based at least in part on the second current.

22. The system controller of claim 17 wherein the ramping-signal generator includes:
a current-mirror circuit configured to generate a second current based at least in part on a reference current;
a first switch configured to be closed in response to the modulation signal being at a first logic level to charge a capacitor with the second current to generate the ramping signal;
an amplifier configured to receive a reference signal and output an amplified signal based at least in part on the reference signal; and
a second switch configured to be closed in response to the modulation signal being at a second logic level to generate the ramping signal based at least in part on the amplified signal.

23. The system controller of claim 1, further comprising a converted signal generator configured to receive a second current signal related to the input signal and generate the converted signal based at least in part on the second current signal.

24. The system controller of claim 23, further comprising:
a first controller terminal coupled to a resistor, the resistor being configured to generate the second current signal based at least in part on the input signal;
wherein the input signal is received by the primary winding.

25. The system controller of claim 23 wherein:
the converted signal generator includes:
a current source configured to provide a third current signal; and
a current-mirror circuit configured to receive a fourth current signal and generate the converted signal based at least in part on the fourth current signal; and
the second current signal is equal in magnitude to a sum of the third current signal and the fourth current signal.

26. The system controller of claim 1, further comprising:
a first controller terminal configured to receive a second current signal related to a feedback signal associated with an auxiliary winding of the power converter; and
a converted signal generator coupled to the first controller terminal and configured to generate the converted signal based at least in part on the second current signal.

27. The system controller of claim 26 wherein:
the converted signal generator includes:
a current source configured to provide a third current signal; and
a current-mirror circuit configured to receive a fourth current signal and generate the converted signal based at least in part on the fourth current signal; and
the second current signal is equal in magnitude to a sum of the third current signal and the fourth current signal.

28. The system controller of claim 1 wherein the converted signal includes one or more current signals.

29. The system controller of claim 1 wherein the converted signal includes one or more voltage signals.

30. A method for regulating a power converter, the method comprising:
receiving a first compensation signal and a ramping signal, the first compensation signal being associated with a converted signal and a second compensation signal, the converted signal being associated with an input signal for a power converter, the second compensation signal being associated with a sensing signal related to a first current flowing through a primary winding of the power converter;
generating a modulation signal based at least in part on the first compensation signal and the ramping signal;
receiving the modulation signal; and
outputting a drive signal based at least in part on the modulation signal to affect the first current, the drive signal being associated with an on-time period;
wherein the outputting a drive signal based at least in part on the modulation signal to affect the first current includes adjusting a duration of the on-time period based at least in part on the converted signal and the first compensation signal.

* * * * *